United States Patent
Whetsel

(10) Patent No.: US 10,162,001 B2
(45) Date of Patent: Dec. 25, 2018

(54) TAP AND GATING ENABLE, CAPTUREDR, CAPTURE, AND GATED CAPTUREDR SIGNALS

(71) Applicant: TEXAS INSTRUMENTS INCORPORATED, Dallas, TX (US)

(72) Inventor: Lee D. Whetsel, Parker, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 15/725,914

(22) Filed: Oct. 5, 2017

(65) Prior Publication Data

US 2018/0031633 A1 Feb. 1, 2018

Related U.S. Application Data

(62) Division of application No. 15/359,073, filed on Nov. 22, 2016, now Pat. No. 9,810,737, which is a division of application No. 15/089,988, filed on Apr. 4, 2016, now Pat. No. 9,535,124, which is a division of application No. 14/800,276, filed on Jul. 15, 2015, now Pat. No. 9,329,233, which is a division of application No. 14/546,722, filed on Nov. 18, 2014, now Pat. No. 9,116,209, which is a division of application No. 14/085,072, filed on Nov. 20, 2013, now Pat. No. 8,918,688, which is a division of application No. 13/782,540, filed on Mar. 1, 2013, (Continued)

(51) Int. Cl.
*G01R 31/28* (2006.01)
*G01R 31/317* (2006.01)
*G01R 31/3185* (2006.01)
*G06F 17/50* (2006.01)
*G01R 31/3177* (2006.01)

(52) U.S. Cl.
CPC ... *G01R 31/31723* (2013.01); *G01R 31/3177* (2013.01); *G01R 31/31724* (2013.01); *G01R 31/31725* (2013.01); *G01R 31/31727* (2013.01); *G01R 31/318508* (2013.01); *G01R 31/318536* (2013.01); *G06F 17/5081* (2013.01)

(58) Field of Classification Search
CPC ........ G01R 31/3177; G01R 31/318533; G01R 31/318508; G01R 17/5081; G01R 31/318536; G01R 31/318594; G01R 31/28; G01R 31/3167; G01R 31/31723; G01R 31/31724; G01R 31/31725; G01R 31/31727
See application file for complete search history.

(56) References Cited

U.S. PATENT DOCUMENTS 7,117,413 B2 10/2006 Park et al.
7,127,647 B1 10/2006 Zorian et al.
(Continued)

*Primary Examiner* — Guerrier Merant
(74) *Attorney, Agent, or Firm* — Lawrence J. Bassuk; Charles A. Brill; Frank D. Cimino

(57) ABSTRACT

In a first embodiment a TAP 318 of IEEE standard 1149.1 is allowed to commandeer control from a WSP 202 of IEEE standard P1500 such that the P1500 architecture, normally controlled by the WSP, is rendered controllable by the TAP. In a second embodiment (1) the TAP and WSP based architectures are merged together such that the sharing of the previously described architectural elements are possible, and (2) the TAP and WSP test interfaces are merged into a single optimized test interface that is operable to perform all operations of each separate test interface.

4 Claims, 55 Drawing Sheets

Related U.S. Application Data now Pat. No. 8,621,299, which is a division of application No. 13/551,080, filed on Jul. 17, 2012, now Pat. No. 8,412,992, which is a division of application No. 13/289,577, filed on Nov. 4, 2011, now Pat. No. 8,250,419, which is a division of application No. 12/791,133, filed on Jun. 1, 2010, now Pat. No. 8,078,927, which is a division of application No. 12/165,928, filed on Jul. 1, 2008, now abandoned, which is a division of application No. 10/874,054, filed on Jun. 21, 2004, now Pat. No. 7,409,611.

(60) Provisional application No. 60/483,437, filed on Jun. 27, 2003.

(56) References Cited

U.S. PATENT DOCUMENTS

| | | |
|---|---|---|
| 7,149,924 B1 | 12/2006 | Zorian et al. |
| 7,404,129 B2 | 7/2008 | Whetsel |
| 7,877,658 B2 | 1/2011 | Whetsel |
| 8,078,927 B2 | 12/2011 | Whetsel |
| 8,412,992 B2 | 4/2013 | Whetsel |
| 8,918,688 B2 | 12/2014 | Whetsel |
| 2003/0131296 A1 | 7/2003 | Park et al. |
| 2011/0225456 A1 | 9/2011 | Whetsel |
| 2015/0067427 A1 | 3/2015 | Whetsel |

A START ShiftDR
B END ShiftDR

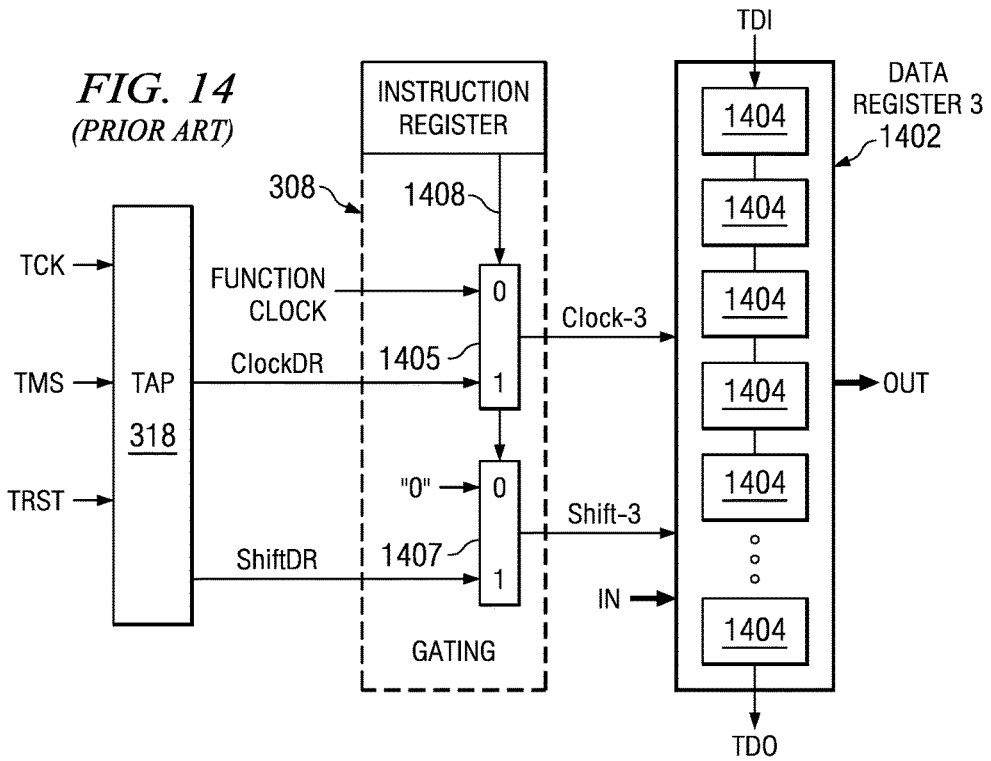
*FIG. 14*
*(PRIOR ART)*
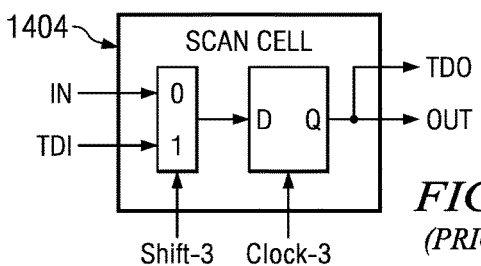
*FIG. 14A*
*(PRIOR ART)*
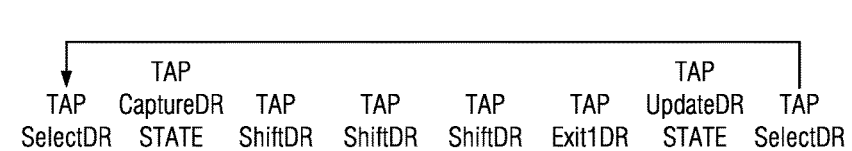
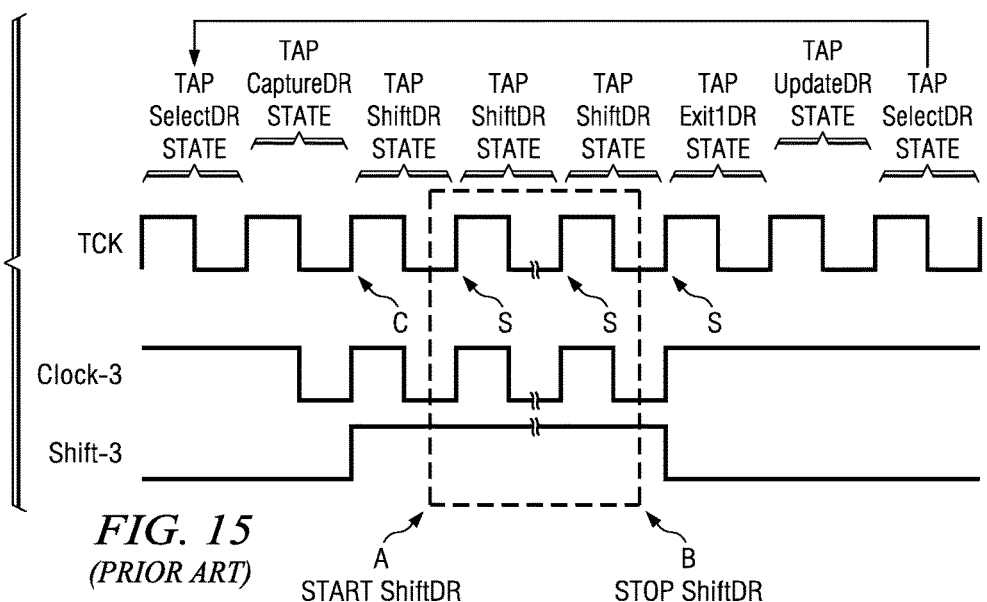
*FIG. 15*
*(PRIOR ART)*

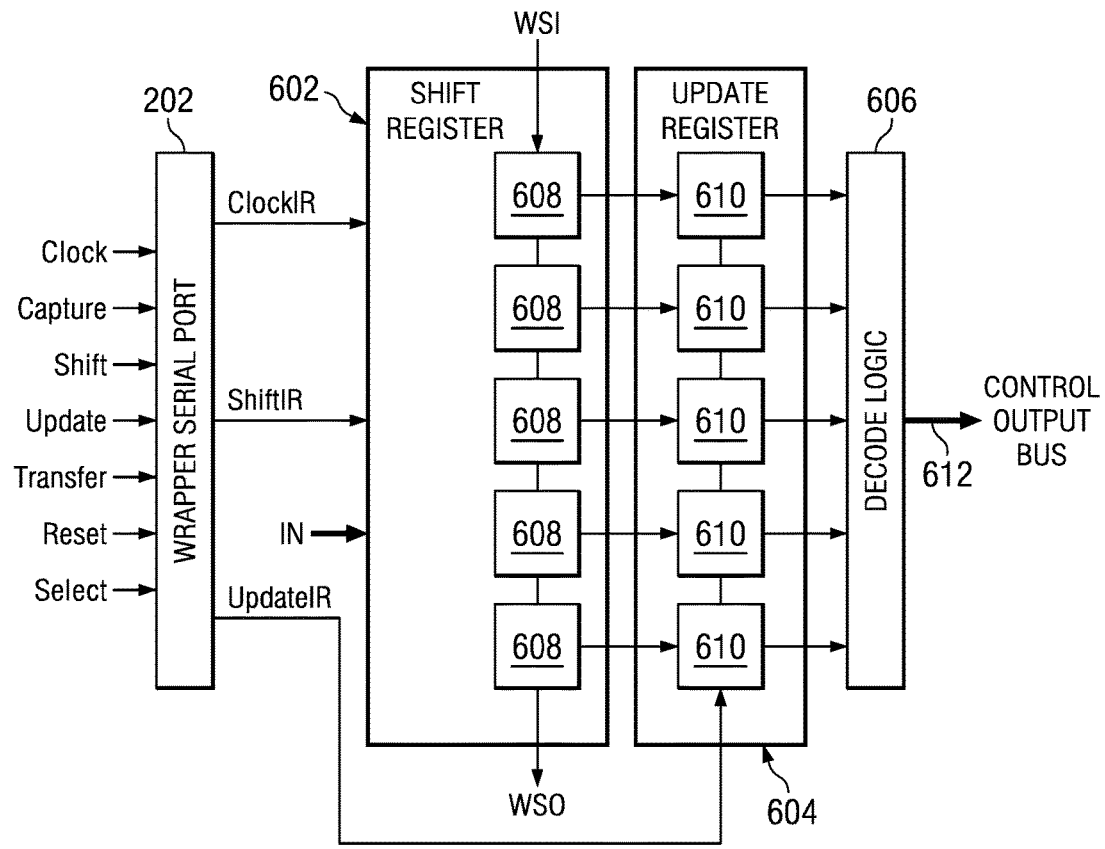
*FIG. 22*
*(PRIOR ART)*
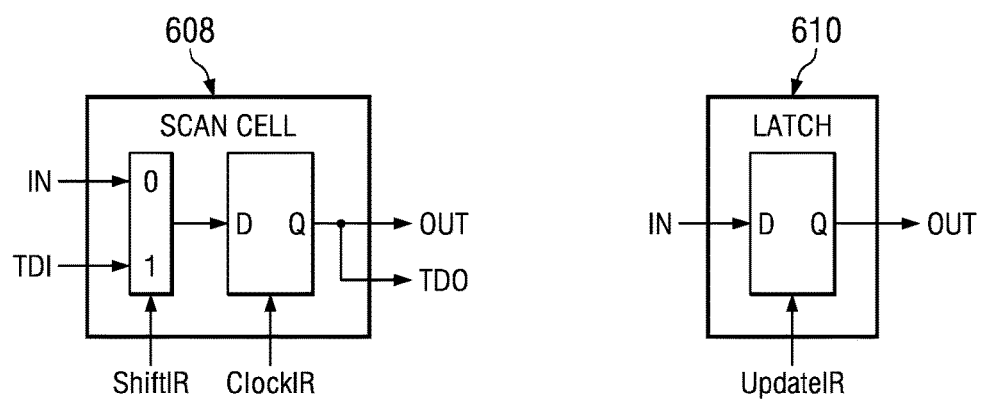
*FIG. 22A*
*(PRIOR ART)*
*FIG. 22B*
*(PRIOR ART)*

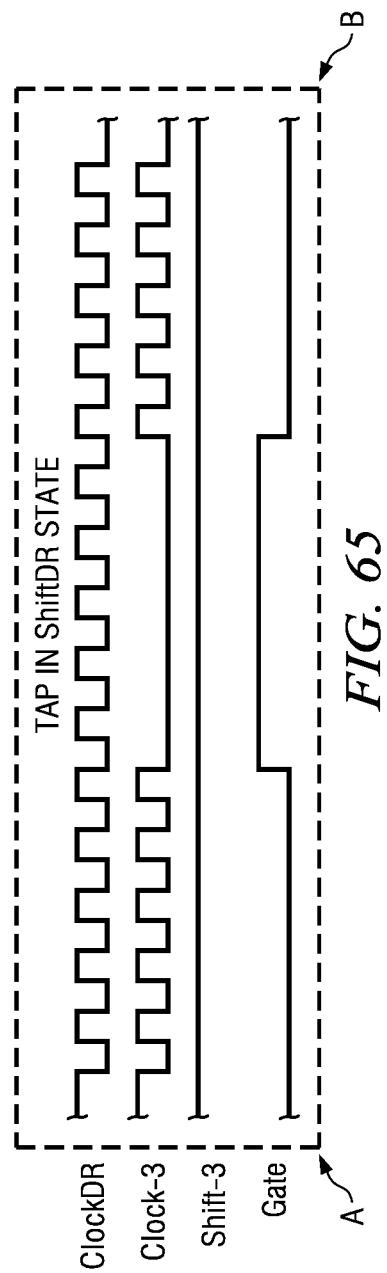

TAP AND GATING ENABLE, CAPTUREDR, CAPTURE, AND GATED CAPTUREDR SIGNALS

This application is a divisional of prior application Ser. No. 15/359,073, filed Nov. 22, 2016, now U.S. Pat. No. 9,810,737, issued Nov. 7, 2017;

Which was a divisional of prior application Ser. No. 15/089,988, filed Apr. 4, 2016, now U.S. Pat. No. 9,535,124, granted Jan. 3, 2017;

Which was a divisional of prior application Ser. No. 14/800,276, filed Jul. 15, 2015, now U.S. Pat. No. 9,329,233, granted May 3, 2016;

Which was a divisional of prior application Ser. No. 14/546,722, filed Nov. 18, 2014, now U.S. Pat. No. 9,116,209, granted Aug. 25, 2015;

Which was a divisional of prior application Ser. No. 14/085,072, filed Nov. 20, 2013, now U.S. Pat. No. 8,918,688, granted Dec. 23, 2014;

Which was a divisional of prior application Ser. No. 13/782,540, filed Mar. 1, 2013, now U.S. Pat. No. 8,621,299, granted Dec. 31, 2013;

Which was a divisional of prior application Ser. No. 13/551,080, filed Jul. 17, 2012, now U.S. Pat. No. 8,412,992, granted Apr. 2, 2013;

Which was a divisional of prior application Ser. No. 13/289,577, filed Nov. 4, 2011, now U.S. Pat. No. 8,250,419, granted Aug. 21, 2012;

Which was a divisional of prior application Ser. No. 12/791,133, filed Jun. 1, 2010, now U.S. Pat. No. 8,078,927, granted Dec. 13, 2011;

Which is a divisional of prior application Ser. No. 12/165,928, filed Jul. 1, 2008, now abandoned;

Which was a divisional of prior application Ser. No. 10/874,054, filed Jun. 21, 2004, now U.S. Pat. No. 7,409,611, granted Aug. 5, 2008;

Which claims priority under USC 119(e) (1) of Provisional Application No. 60/483,437, filed Jun. 27, 2003.

RELATED PATENTS/APPLICATIONS

This application is related to pending patent publication US 2001/0037479 A1, which is incorporated herein by reference.

TECHNICAL FIELD OF THE INVENTION

This invention relates in general to integrated circuit design and testing, and in particular to an improved test interface and architecture that may be included in intellectual property core circuits and integrated circuits.

BACKGROUND OF THE INVENTION

Today large system-on-chips (SOC) are being designed that include a myriad of different types of complex functional circuits. Standardized IC test interfaces and architectures are needed for testing these functional circuits within the IC, and also for testing the board/substrate on which the IC will eventually reside.

This disclosure describes two separate IC test standards, IEEE 1149.1 and IEEE P1500, that can be used to test circuitry embedded within ICs. Each IC test standard has its own test interface and architecture, and unique testing features. Thus an IC may require both test standards to be implemented to achieve an overall testing goal. Having to include both test standards in ICs can be costly in circuit area overhead and test complexity.

To facilitate the understanding of the present invention, an overview of two test standards to be combined is provided. FIGS. 1-17 give an overview of IEEE standard 1149.1 and FIGS. 18-45 give an overview of IEEE standard P1500.

IEEE 1149.1 Overview

FIG. 1 illustrates an example of a test interface 104 and architecture 102 that is commonly used in both ICs and core circuits within ICs. The test interface and architecture are well known and were standardized in 1990 as IEEE Standard 1149.1. While initially developed as an IC test standard for primarily supporting board level IC to IC interconnect testing, this standard has evolved into additional uses and formed the basis for a family of additional IEEE standards.

The test interface 104 includes a test access port (TAP) state machine controller and signals TDI, TCK, TMS, TRST, and TDO. The test architecture 102 includes an instruction register and a set of selectable data registers. As seen in FIG. 1, the data registers consists of various types including but not limited too, a boundary scan register, digital test registers, debug/emulation registers, programming registers, mixed signal test registers, and a bypass register. The TAP receives a test clock (TCK), test mode select (TMS), and test reset (TRST) input signals. The TAP responds to the TCK and TMS input signals to shift data through either the instruction register or a selected data register from the test data input (TDO) signal to the test data output (TDO) signal. The TAP has proven to be an efficient and popular test control interface for ICs and cores.

For example, other TAP based standards have evolved from the original IEEE 1149.1 standard. These other TAP based standards include; (1) IEEE standard 1149.4 (a mixed signal test standard), (2) IEEE standard 1149.6 (an advanced interconnect test standard), (3) IEEE standard 1532 (an in-system programming standard), and (4) IEEE standard 5001 (a debug/emulation standard). The naming of the data registers in FIG. 1 indicates the presence of these additional TAP based IEEE standards. In addition to the multiplicity of TAP based IEEE standards, numerous core and/or IC provider companies have developed proprietary emulation and debug architectures based upon the IEEE 1149.1 TAP and architecture of FIG. 1.

FIG. 2 is a different view of the FIG. 1 test interface and architecture emphasizing the instruction registers ability to select one of the data registers for access between TDI and TDO.

FIG. 3 is a block diagram of the key circuit elements of FIGS. 1 and 2. The TAP 318 regulates TDI to TDO access of the instruction register 314 via instruction register control bus 302 and the TDI to TDO access of a selected one of a set of data registers 316 via data register control bus 304. As seen, a gating circuit 308 receives input 306 from the instruction register to allow the data register control bus 304 from the TAP to pass through the gating circuit and be output on bus 310 to operate a selected data register. The gating circuit is typically viewed as being part of the instruction register and is shown in FIG. 2 as the dotted box on the instruction register. The data registers 316 also receive mode control input 312 from the instruction register to place them in various modes of operation.

FIG. 4 indicates the TAP's state controller diagram. The TAP is clocked, via TCK, through these states in response to input on TMS. Since all TAPs operate from this diagram, standardized plug and play compatibility between TAPs is guaranteed. The operation of the TAP controller is well known.

FIG. 5 illustrates typical TAP 318 input (TCK, TMS, TRST) and output signals. The ClockIR, ShiftIR, and UpdateIR form the signals on bus 302 to the instruction register. The ClockDR, ShiftDR, and UpdateDR form the signals on bus 304 to gating circuit 308. The Select signal is used to select either the instruction register or selected data register to be coupled to TDO. The Reset signal is used to reset the instruction register and optionally the data registers whenever the TAP is in the TRST state of FIG. 4. As seen in FIG. 5, a TAP state bus 502 can be output from the TAP to indicate what state of FIG. 4 the TAP is in. The TAP state bus is useful in controlling synchronous instruction and data register designs and is therefore shown as being part of the instruction and data control buses 302 and 304, respectively.

FIG. 6 illustrates a gated instruction register design style. The instruction register comprises a shift register 602, an update register 604, and an instruction decode logic 606. The shift register comprises serially connected scan cells 608 that operate to capture and shift data from TDI to TDO. The update register comprises a flip-flop or latch 610 for each shift register scan cell 608. In operation, the TAP outputs control (ClockIR and ShiftIR) to cause the shift register to capture data (IN) then shift data from TDI to TDO. After capturing and shifting, the TAP outputs control (UpdateIR) to cause the latches 610 of update register 604 to load data from the scan cells 608. The latched data is output from the update register to the decode logic, where it is decoded into control output bus 612 which, among other things, drives buses 306 and 312. While not shown, both the scan cell 608 and update latch 610 can be reset by the reset output from the TAP.

FIG. 7 illustrates a timing example of the TAP performing the above described gated instruction register scan operation. As seen, the TAP gates the ClockIR on in the CaptureIR state to perform the capture operation (C) and in the ShiftIR state to perform the shift operations (S). The TAP manipulates the ShiftIR output to control the scan cells 608 to perform the capture and shift operations. Also, the TAP gates a clock pulse on UpdateIR during the UpdateIR state to perform the update operation (U).

FIG. 8 illustrates a synchronous instruction register design style. The synchronous instruction register design style differs from the gated instruction design style in that the shift register 802 is comprised of scan cells 804 which operate from the free running TCK input, not the ClockIR input of FIG. 6. The shift register 802 receives TAP state (502) input from bus 302 to indicate when the TAP is in the CaptureIR state and ShiftIR state. When the TAP is in the CaptureIR state the scan cells 804 capture data (IN) and when the TAP is in the ShiftIR state the scan cells shift data from TDI to TDO. When the TAP is not in the CaptureIR or ShiftIR state, the scan cells hold their present value. The operation of the update register 604 and decode logic 606 is the same as describe in FIG. 6.

FIG. 9 illustrates a timing example of the TAP performing the above described synchronous instruction register scan operation. As seen, when the TAP enters the CaptureIR state the scan cells 804 perform a capture operation (C) and when the TAP enters the ShiftIR state the scan cells perform shift operations (S). As with the FIG. 8 timing diagram, the TAP gates a clock pulse on UpdateIR during the UpdateIR state to perform the update operation (U).

FIG. 10 illustrates a first gated data register design style. The data register 1002, referred to as data register 1, is an example of a gated boundary scan data register that could be used at the I/O boundary of a core or IC. Data register 1 comprises serially connected boundary scan cells 1004 each having an scan cell 1006 operable to capture data from the IN input and to shift data from TDI to TDO, and an update latch 1008 operable to load data from the scan cell. If selected by the instruction in the instruction register, gates 1010-1012 within gating circuit 308 are enabled by a signal 1014 on bus 306 to couple the TAP's ClockDR, ShiftDR, and UpdateDR outputs to data register 1's Clock-1, Shift-1, and Update-1 inputs, respectively. This enables scan access of data register 1. In this and all following Figures, a capital "A" in a gate symbol indicates the gate is an AND function and a capital "O" in a gate symbol indicates the gate is an OR function. During a data scan operation, the TAP outputs control (ClockDR and ShiftDR) to cause the scan cells 1006 of boundary scan cells 1004 to capture data (IN) then shift data from TDI to TDO. After capturing and shifting, the TAP outputs control (UpdateDR) to cause the update latches 1008 of the boundary scan cells to load data from the scan cells 1006. If data register 1 is in test mode, the Mode-1 input from instruction register bus 312 will be set to cause the data in update latch 1008 to be output from data register 1002.

FIG. 11 illustrates a timing example of the TAP performing the above described gated data register scan operation. As seen, the TAP gates Clock-1 (ClockDR) on in the CaptureDR state to perform the capture operation (C) and in the ShiftDR state to perform the shift operations (S). The TAP manipulates Shift-1 (ShiftDR) to control the scan cells 1006 to perform capture and shift operations. Also, the TAP gates a clock pulse on UpdateDR-1 during the UpdateDR state to perform the update operation (U). It is important to note for later reference in this and following timing Figures that the dotted box area beginning with A and ending with B indicates when the TAP is in the ShiftDR state.

FIG. 12 illustrates a first synchronous data register design style. The data register 1202, referred to as data register 2, is an example of a synchronous boundary scan data register that could be used at the I/O boundary of a core or IC. Data register 2 comprises serially connected boundary scan cells 1204 each having an scan cell 1206 operable to capture data from the IN input and to shift data from TDI to TDO, and an update latch 1208 operable to load data from the scan cell. If selected by the instruction in the instruction register, gates 1210-1214 within gating circuit 308 will be enabled by a signal 1216 on bus 306 to couple the TAP's CaptureDR state, ShiftDR state, and UpdateDR outputs to data register 2's Capture-2, Shift-2, and Update-2 inputs, respectively. This enables scan access of data register 2. The Clock-2 input of data register 2 is coupled to the free running TCK. During a data scan operation, the TAP outputs state indications (bus 502 & 304) to cause the scan cells 1206 to capture data (IN) during the CaptureDR state (Capture-2 set high) then shift data from TDI to TDO during the ShiftDR state (Shift-2 set high). As seen, the scan cell holds its state when the TAP is not in the CaptureDR or ShiftDR states. After capturing and shifting, the TAP outputs control (UpdateDR) to cause the update latches 1208 of the boundary scan cells to load data from the scan cells 1206. If data register 2 is in test mode, the Mode-2 input from instruction register bus 312 will be set to cause the data in update latch 1208 to be output from data register 1202.

FIG. 13 illustrates a timing example of the TAP performing the above described synchronous data register scan operation. As seen, when the TAP is in the CaptureDR state, the Capture-2 input is high causing data register 2 to capture data (C). When the TAP is in the ShiftDR state the Shift-2 input is high causing data register 2 to shift data (S). Also, the TAP gates a clock pulse on UpdateDR-2 during the UpdateDR state to perform the update operation (U).

FIG. 14 illustrates a second gated data register design style. The data register 1402, referred to as data register 3, is an example of a gated scan data register that could be used as an internal scan path of a core or IC. Data register 3 comprises serially connected conventional scan cells 1404 each operable to capture data from the IN input and to shift data from TDI to TDO. If selected by the instruction in the instruction register, multiplexers 1404-1406 within gating circuit 308 are enabled by a signal 1408 on bus 306 to couple the TAP's ClockDR and ShiftDR outputs to data register 3's Clock-3 and Shift-3 inputs, respectively. Multiplexers 1404-1406 are used instead of gates since switching between a functional and test clocks and between functional and test modes is required when using scan cells that are shared for functional and test operations. This enables scan access of data register 3. During a data scan operation, the TAP outputs control (ClockDR and ShiftDR) to cause the scan cells 1404 to capture data (IN) then shift data from TDI to TDO.

FIG. 15 illustrates a timing example of the TAP performing the above described gated data register scan operation. As seen, the TAP gates Clock-3 (ClockDR) on in the CaptureDR state to perform the capture operation (C) and in the ShiftDR state to perform the shift operations (S). The TAP manipulates Shift-3 (ShiftDR) to control the scan cells 1404 to perform capture and shift operations.

FIG. 16 illustrates a second synchronous data register design style. The data register 1602, referred to as data register 4, is an example of a synchronous scan data register that could be used as an internal scan path of a core or IC. Data register 4 comprises serially connected scan cells 1604 each operable to capture data from the IN input and to shift data from TDI to TDO. If selected by the instruction in the instruction register, multiplexers 1606-1610 within gating circuit 308 will be enabled by a signal 1612 on bus 306 to couple the TAP's CaptureDR state output, the TAP's ShiftDR state output, and the TCK to data register 4's Capture-4, Shift-4, and Clock-4 inputs, respectively. Again, multiplexers 1606-1610 are used instead of gates since switching between a functional and test clocks and between functional and test modes is required when using scan cells that are shared for functional and test operations. This enables scan access of data register 4. During a data scan operation, the TAP outputs state indications to cause the scan cells 1604 to capture data (IN) during the CaptureDR state (Capture-4 set high) then shift data from TDI to TDO during the ShiftDR state (Shift-4 set high). As seen, the scan cell holds its state when the TAP is not in the CaptureDR or ShiftDR states.

FIG. 17 illustrates a timing example of the TAP performing the above described synchronous data register scan operation. As seen, when the TAP is in the CaptureDR state, the Capture-4 input is high causing data register 4 to capture data (C). When the TAP is in the ShiftDR state the Shift-4 input is high causing data register 4 to shift data (S).

IEEE P1500 Overview

FIG. 18 illustrates an example of a test interface 1804 and architecture 1802 that is being developed as IEEE standard P1500. This standard test interface and architecture is being developed for the purpose of testing cores within ICs. While not yet standardized, the state of the P1500 standard is stable and near complete. The architectural similarities between the IEEE P1500 standard of FIG. 18 and the previously described IEEE 1149.1 standard of FIG. 1 are clearly seen.

The test interface 1804 includes a wrapper serial port (WSP) and signals WSI, Clock, Capture, Shift, Update, Transfer, Select, Reset, and WSO. The architecture 1802 includes a wrapper instruction register and a set of selectable wrapper data registers. As seen in FIG. 18, the wrapper data registers consists of a wrapper boundary scan register, digital test registers, and a wrapper bypass register. The WSP receives clock, capture, shift, update, transfer, select, and reset input signals. The WSP responds to these signals to shift data through either the wrapper instruction register or a selected wrapper data register from the wrapper serial input (WSI) signal to the wrapper serial output (WSO) signal. Unlike the TAP of FIG. 1, which is a state machine, the WSP is simply a combinational decode circuit. With the exception that IEEE standard P1500 uses a WSP in the test interface 1804 and IEEE standard 1149.1 uses a TAP in the test interface 104, the two standards are very similar architecturally. For the purpose of simplifying the following description, it will be assumed that the IEEE P1500 architecture 1802 can be viewed as being the same as the previously described IEEE 1149.1 architecture 102 of FIG. 1. While there may be subtle differences between the two architectures, these differences are transparent to the overall objective of the present invention.

FIG. 19 is a different view of the FIG. 18 test interface and architecture emphasizing the instruction registers ability to select one of the data registers for access between WSI and WSO.

FIG. 20 is a block diagram of the key circuit elements of FIGS. 18 and 19. The WSP 202 regulates WSI to WSO shifting of the instruction register 314 via instruction register control bus 302 and the WSI to WSO shifting of a selected data within a set of data registers 316 via data register control bus 304. As seen, a gating circuit 308 receives input 306 from the instruction register to allow the data register control bus 304 from the WSP to pass through the gating circuit and be output on bus 310 to operate the selected data register. The gating circuit is typically viewed as being part of the instruction register and is shown in FIG. 18 as the dotted box on the instruction register. The data registers 316 also receive mode control input 312 from the instruction register to place them in various modes of operation.

FIG. 21 illustrates an example WSP 202 circuit. As mentioned, the WSP is a combinational circuit and does not include any sequential memory elements. Like the TAP, the WSP has a control bus 302 of outputs, ClockIR, ShiftIR, CaptureIR, and UpdateIR, that are used to control scanning of the instruction register, and a control bus 304 of outputs, ClockDR, ShiftDR, CaptureDR, UpdateDR, and TransferDR, that are used to control scanning of a selected data register.

The operation of the WSP is simple. If the select input to the WSP is low the select output from the WSP is low and the WSP couples the clock, shift, capture, update, and transfer inputs to the ClockDR, ShiftDR, CaptureDR, UpdateDR, and TransferDR outputs to enable scanning of a data register. The low on the select output selects the data register between WSI and WSO. If the select input to the WSP is high the select output from the WSP is high and the WSP couples the clock, shift, capture, and update inputs to the ClockIR, ShiftIR, CaptureIR, and UpdateIR outputs to enable scanning of the instruction register. The high on the select output selects the instruction register between WSI and WSO. The reset output from the WSP is coupled to the reset input to the WSP and is used, as was the reset output of the TAP in FIG. 5, to reset the instruction register and optionally the data registers when asserted low. The WSP Transfer input and TransferDR output signals are new data register control signals introduced by IEEE P1500. An example of their use will be described later in regard to FIGS. 40-45.

FIGS. 22 and 23 are provided to illustrate that the WSP is capable of providing timing and control to the gated instruction register design of FIG. 6. FIG. 23 illustrates that the WSP can mimic the gated TAP timing diagram of FIG. 7. The dotted line clock pulses shown on portions of the inactive clock input signal indicates TCKs that would be input to the TAP during the instruction register scan timing diagram of FIG. 7.

FIGS. 24 and 25 are provided to illustrate that the WSP is capable of providing timing and control to the synchronous instruction register design of FIG. 8. FIG. 25 illustrates that the WSP can mimic the synchronous TAP timing diagram of FIG. 9. Being able to mimic TAP instruction and, as will be shown below, data register scan timing is important since it allows for serially connecting the IEEE 1149.1 and IEEE P1500 standard test architectures together in a daisy-chain arrangement.

FIGS. 26 and 27 are provided to illustrate that the WSP is capable of providing timing and control to the gated data register 1 design of FIG. 10. FIG. 27 illustrates that the WSP can mimic the gated TAP timing diagram of FIG. 11. Again, the dotted line clock pulses shown on portions of the inactive clock input signal indicates TCKs that would be input to the TAP during the data register scan timing diagram of FIG. 11.

FIG. 28 illustrates an alternate method of scanning gated data register 1 of FIG. 26. Since the WSP is combinational in operation it does not have to mimic TAP state transition timing. Indeed one of the primary reasons IEEE P1500 uses the WSP instead of the TAP is that the WSP allows greater flexibility in controlling scan operations. For example, in FIG. 28 the WSP provides scan timing control to data register 1 where the shift (S), capture (C), and update (U) operations are occurring in a tightly timed sequence.

FIGS. 29 and 30 are provided to illustrate that the WSP is capable of providing timing and control to the synchronous data register 2 design of FIG. 12. FIG. 31 illustrates that the WSP can mimic the synchronous TAP timing diagram of FIG. 13.

FIG. 31 illustrates an alternate method of scanning synchronous data register 2 of FIG. 26, whereby the shift (S), capture (C), and update (U) operations are occurring in a tightly timed sequence.

FIGS. 32 and 33 are provided to illustrate that the WSP is capable of providing timing and control to the gated data register 3 design of FIG. 14. FIG. 33 illustrates that the WSP can mimic the gated TAP timing diagram of FIG. 15.

FIGS. 34 and 35 illustrate alternate methods of scanning gated data register 3 of FIG. 32. FIG. 34 illustrates a tightly timed capture (C) and shift (S) scanning sequence, and FIG. 35 illustrates a tightly timed back to back capture (C) and shift (S) sequence.

FIGS. 36 and 37 are provided to illustrate that the WSP is capable of providing timing and control to the synchronous data register 4 design of FIG. 16. FIG. 37 illustrates that the WSP can mimic the synchronous TAP timing diagram of FIG. 17.

FIGS. 38 and 39 illustrate alternate methods of scanning synchronous data register 4 of FIG. 36. FIG. 38 illustrates a tightly timed capture (C) and shift (S) scanning sequence, and FIG. 39 illustrates a tightly timed back to back capture (C) and shift (S) sequence.

FIG. 40 illustrates one example of how the IEEE P1500 Transfer signal might be used during test. Data register 5, 4002, is comprised of a plurality of serially connected scan cells 4004, each capable of performing shift and transfer operations. As seen, the scan cell 4004 circuit example consists of an input multiplexer 4012, a series of flip flops 4014, and an output multiplexer 4016. The input multiplexer 4012 serves to either shift data from TDI (WSI) to TDO (WSO) in shift mode (Shift5 is high) or to shift in data from the output (OUT) of the output multiplexer 4016 during transfer mode (Transfer5 is high). Gates 4006 and 4008 of gating circuit 308 are enabled by signal 4010 to couple the ClockDR and TransferDR outputs from the WSP to the Clock-5 and Transfer-5 inputs to data register 5, respectively, when a transfer instruction is loaded into the instruction register.

As seen in FIG. 40, a pair of Mode-5 signals, Mode-5a and 5b, are output from the instruction register on bus 312 to control the scan cell output multiplexers 4016. During transfer operations, the output multiplexers 4016 of scan cells 4004 that output test signals will be controlled to couple the output of the flip flops 4014 to the output multiplexer output (OUT), while the output multiplexers 4016 of scan cells 4004 that input test signals will be controlled to couple the input (IN) of the scan cell to the output (OUT) of output multiplexers 4016. Thus two separately controllable Mode-5 signals, Mode-5a and 5b, will typically be required from the instruction register to achieve a desired output multiplexer test setting.

FIG. 41 illustrates an example transfer test arrangement whereby an AND gate function 4102 to be tested is bounded by two cells A and B 4004 for providing input to the AND gate and one cell C 4004 for receiving output from the AND gate. The AND gate can exist within a core containing the IEEE P1500 architecture or external to a core containing the IEEE P1500 architecture. Also, the cells A-C may be in the same data register 5 of one IEEE P1500 architecture or be in separate data register 5's of separate IEEE P1500 architectures. The dotted line beginning at the TDI input of cell A and ending at the TDO output of cell C indicates the process of shifting data through the cells to load test input data to cells A and B and unload test output data from cell C. As seen, the shifting occurs in response to Shift-5 being high, Transfer-5 being low, and Clock-5 being active. While for simplicity the example of FIG. 41 shows the serial path to only include cells A-C, additional scan cells of various types may exist in the scan path as well.

FIG. 42 illustrates cells A, B, and C 4004 in their transfer mode. As seen, the transfer mode occurs in response to Shift-5 being low, Transfer-5 being high, and Clock-5 being active. During transfer mode, cells A and B circulate their data, as shown in dotted line, from the output (OUT) of their output multiplexers to the input of their input multiplexers, to provide the test signal input to AND gate 4102. Simultaneously, cell C shifts in the test signal output from AND gate 4102, again as shown in dotted line. The Mode-5a and Mode-5b inputs to the cell output multiplexers have been set, as previously described, for this particular transfer test arrangement.

FIG. 43 shows a first transfer test input and output session to AND gate function 4102. FIG. 44 shows a second transfer test input and output session to AND gate function 4102. The first transfer test session tests the AND gate's ability to pass a stream of data from its In1 input to its Out output, while its In2 input is high. The second transfer test session tests the AND gate's ability to pass a stream of data from its In2 input to its Out output, while its In1 input is high.

FIG. 45 illustrates an example timing diagram for the transfer test of the test arrangement of FIGS. 41-44. Firstly, the cells A-C are shifted, during time frame 4502, to load the test input patterns to be applied during the first transfer test session of FIG. 43. Secondly, the first transfer test session of FIG. 43 is executed during time frame 4504. Thirdly, the cells A-C are shifted, during time frame 4506 to load the test input patterns to be applied during the second transfer test session of FIG. 44 and to unload the results of the first transfer test session of FIG. 43. Fourthly, the second transfer session of FIG. 44 is executed during time frame 4508. Lastly, the cells A-C are shifted, during time frame 4510 to unload the test results of the second transfer test session.

While the above description has provided one detailed example of how an IEEE P1500 transfer test may be performed, there are numerous other ways of designing and operating scan cells to achieve transfer testing.

FIG. 46 represents the problems the present invention anticipates if both TAP based (i.e. IEEE 1149.1, 1149.4, 1149.6, 1532, 5000, and ad-hoc) and the WSP based (i.e. IEEE P1500) standard architectures (domains) are required in core and/or IC designs. In FIG. 46, box 4602 represents a circuit which can be either a core circuit for use in an IC or an entire IC. The circuit 4602 is shown including both TAP based standards (1149.1, 1149.4, 1149.6, 1532, 5000, and/or ad-hoc) and the WSP based standard (IEEE P1500).

As seen in FIG. 46, each of the TAP based standards included in circuit 4602 advantageously share a common TAP 318 interface and architecture 4604. The architecture 4604 includes a commonly shared instruction register 314, a commonly shared set of selectable data registers 316, commonly shared gating circuitry 308, and commonly shared instruction 302 and data 304 control buses to the commonly shared TAP 318. The external TAP test bus 4608 is achieved using 5 signals (TDI, TDO, TCK, TMS, and TRST). Regardless of whether circuit 4602 is a core or an IC, these 5 signals are dedicated and reserved for use in accessing the TAP to perform testing or other operations with the common architecture 4604. The availability of the dedicated TAP test bus has proven very beneficial since it allows non-intrusive access to a functionally operating circuit 4602 to perform real time test, emulation, debug, and other operations. The dedicated TAP test bus has also lead to an ever increasing set of TAP interface support tools supporting test, emulation, debug, programming, and other TAP based operations.

As seen in FIG. 46, the IEEE P1500 WSP 202 interface and architecture 4610 is separate from the IEEE 1149.1 TAP 318 interface and architecture 4604. Therefore the IEEE P1500 architecture is forced to include its own instruction register 314, its own set of selectable data registers 316, its own gating circuitry 308, and its own instruction 302 and data 304 control buses to WSP 202. The primary reason for this forced separation is due to the differences in operation between the TAP 318 and WSP 202 interfaces. The external test bus 4612 to WSP 202 is achieved using 9 signals (WSI, WSO, Clock, Capture, Shift, Update, Transfer, Select, and Reset). If circuit 4602 is a core, these 9 signals will be dedicated terminals of the core. However, if circuit 4602 is an IC, these 9 signals are not required to be dedicated ICs pins, as are the TAP pins 4608, and will typically be shared with functional pins on the IC and invoked only when testing of the IC is required. If they are shared it is not possible to use them for real time test, emulation, debug, or other operations that can be used with the TAP 318 and its dedicated test bus 4608. The non-dedicated nature of the WSP test bus 4612 will most likely limit use of IEEE P1500 in other areas such as emulation and debug. However, since improved testing of core based ICs is the primary objective of IEEE P1500 that limitation will not matter, especially since TAP based solutions already exist for these expanded needs.

If the circuit 4602 is a core for use in an IC it will require a 5 signal bus for interfacing to the TAP 318 and a 9 signal bus for interfacing to the WSP 212. The total number of signals therefore that need to be routed in the IC for connection to core 4602 is 14. In some ICs the routing of 14 test signals to a core can be prohibitive, especially if multiple cores exist with each potentially needing its own bus of 14 test signals. Thus having two separate standards implemented in a core, each with separate test bus interfaces, can lead to problems related to wire routing area overhead.

From the above description it is clear that if TAP based and WSP based domains are used in a circuit 4602, the area overhead will be increased due to the need of the WSP domain to have its own architecture separate from the TAP domain architecture. Also it is clear that access to WSP domains, unlike TAP domains, will be limited to testing circuits 4602 when circuits 4602 are in a non-functional mode of operation. Further, it is clear that due to the nature of the non-dedicated WSP 9 pin interface, the range of WSP interface support will be most likely limited to testing. Lastly, having both TAP and WSP based domains in cores can lead to IC wire routing and density problems.

SUMMARY OF THE INVENTION

This disclosure describes methods of partially or completely combining the two test standards together such that an IC need only include one test standard instead of two test standards.

In accordance with the present invention, first and second embodiments are provided to remedy the described problems of having two separate standards implemented in cores and/or ICs. The first embodiment is an approach whereby a TAP 318 is allowed to commandeer control from the WSP 202 such that the P1500 architecture, normally controlled by the WSP, is rendered controllable by the TAP. The second embodiment is an approach whereby; (1) the TAP and WSP based architectures are merged together such that the sharing of the previously described architectural elements are possible, and (2) the TAP and WSP test interfaces are merged into a single optimized test interface that is operable to perform all operations of each separate test interface.

BRIEF DESCRIPTION OF THE DRAWINGS

FIGS. 14 and 14A illustrate an IEEE 1149.1 data register 3 design style.

FIG. 15 illustrates a TAP data register 3 timing diagram.

FIGS. 22, 22A, and 22B illustrate the WSP accessing the gated instruction register.

FIGS. 32 and 32A illustrate a WSP accessing data register 3.

FIG. 65 illustrates a timing diagram of the second embodiment using the gating signal.

DETAILED DESCRIPTION

Figure 47:
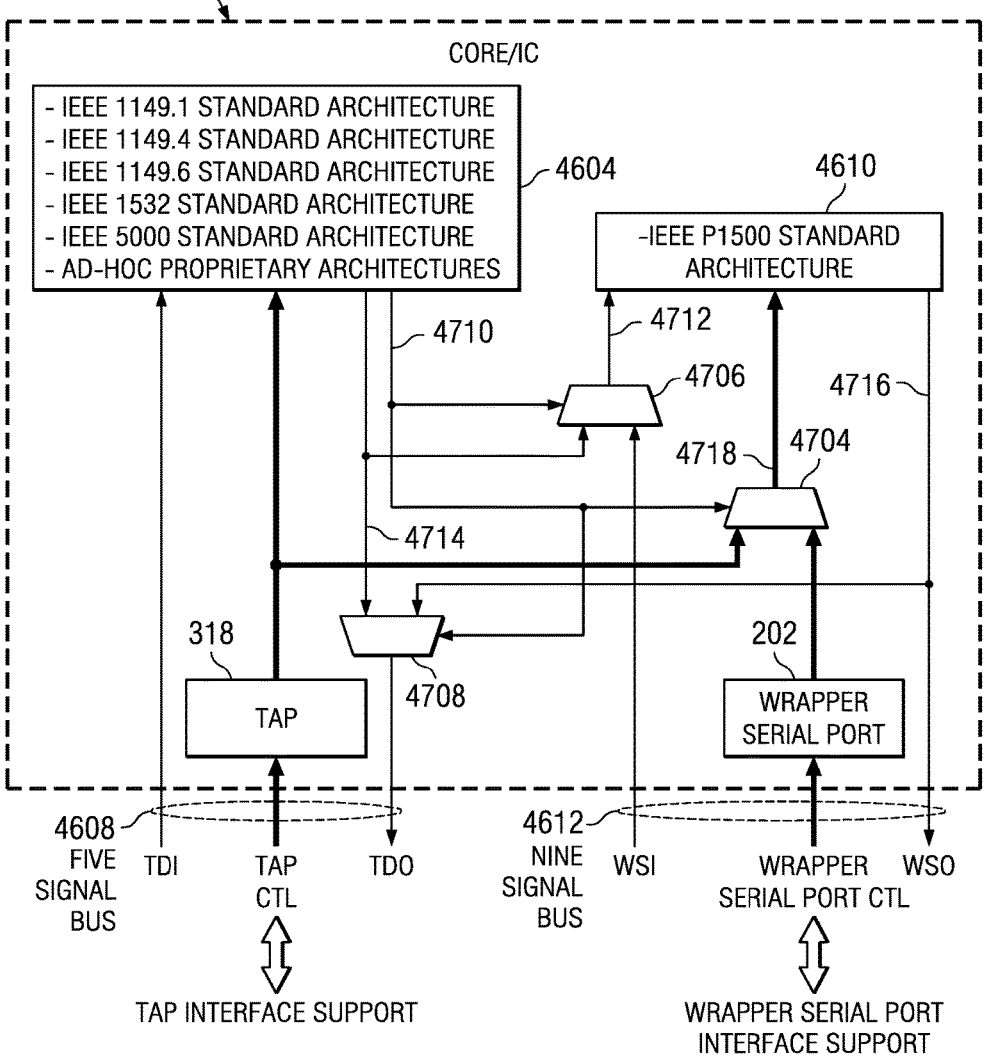
FIG. 47 illustrates the circuit of FIG. 46 implementing the first embodiment.

FIG. 47 illustrates a circuit 4702 which represents architectural modifications made to circuit 4602 according to the first embodiment. The modifications include the placement of a multiplexer 4704 in the WSP control bus path to architecture 4610, the placement of a multiplexer 4706 in the WSI input path to architecture 4610, the placement of a multiplexer 4708 in the TDO path from architecture 4604, and the addition of a multiplexer control output signal 4710 on the instruction register 314 bus 312 of architecture 4604. Multiplexer 4704 allows for the instruction and data register control bus input 4718 to architecture 4610 to selectively come from either the WSP 202 or the TAP 318. Multiplexer 4706 allows for the serial data input 4712 to architecture 4610 to selectively come from either the WSI input on bus 4612 or the serial data output 4714 from architecture 4604. Multiplexer 4708 allows for the TDO output of bus 4608 to selectively come from either the serial data output 4714 of architecture 4604 or the serial data output 4716 of architecture 4610. The control signal 4710 regulates the operation of all multiplexers 4704-4708. The value of the control signal 4710 is established by the instruction loaded into instruction register 314 of architecture 4604.

When initialized by power up, resetting or by the loading of an instruction that sets control signal 4710 low, the input multiplexers 4704-4708 in circuit 4702 are set to allow TAP 318 exclusive access of architecture 4604 via TDI and TDO and WSP 202 exclusive access of architecture 4610 via WSI and WSO. In this mode, the operation of the TAP based architecture 4604 and WSP based architecture 4610 is identical to that described in circuit 4602 of FIG. 46.

When TAP access of architecture 4610 is desired, the TAP will load an instruction into instruction register 314 of architecture 4604 that sets control signal 4710 high. In response, the multiplexers 4704-4708 will be set such that; (1) instruction and data register control bus 4718 to architecture 4610 is coupled to the TAP 318 instruction and data register control bus instead of the WSP 202 instruction and data register control bus, (2) the serial data input 4712 of architecture 4610 is coupled to the serial data output 4714 of architecture 4604 instead of the WSI input of bus 4612, and (3) the serial data output 4716 of architecture 4610 is coupled to the TDO output of bus 4608 instead of the serial output 4714 of architecture 4604. In this mode, architectures 4604 and 4610 are placed in series with each other between TDI and TDO and receive common control input from TAP 318. During TAP controlled instruction scan operations the instruction registers 314 of both architectures are serially shifted from TDI to TDO to load instructions into architecture 4604 and architecture 4601. During TAP controlled data scan operations the selected data register in the set of data registers 316 of both architectures are serially shifted from TDI to TDO to load test data into the selected data registers of architecture 4604 and architecture 4610.

Figure 48:
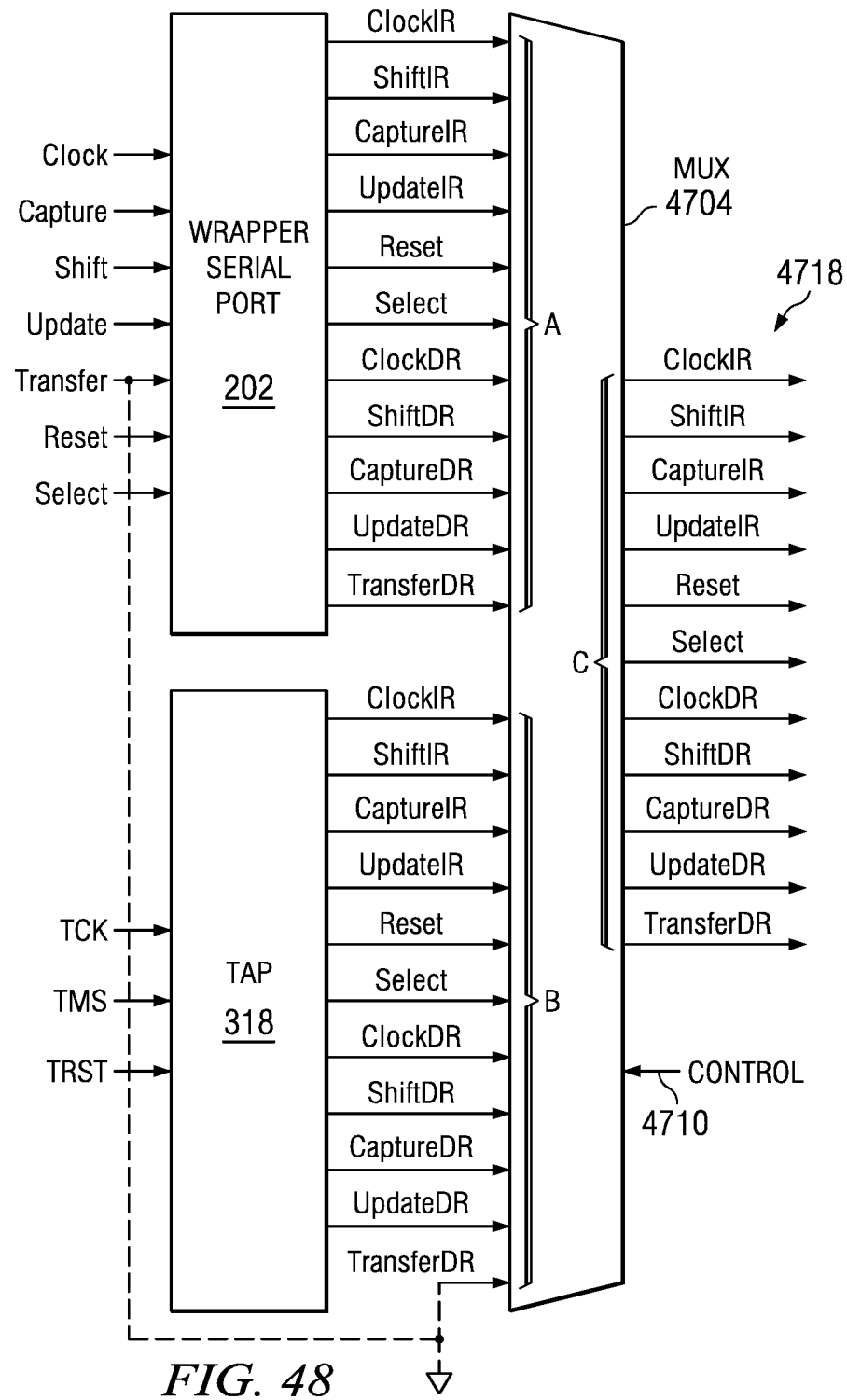
FIG. 48 illustrates the TAP and WSP control output multiplexer of FIG. 46.

FIG. 48 illustrates multiplexer 4704 in more detail. If the control signal 4710 is set low, multiplexer 4704 couples the WSP 202 instruction and data register control bus inputs to multiplexer input port A to the multiplexer instruction and data register control bus outputs on multiplexer output port C 4718. If the control signal 4710 is set high, multiplexer 4704 couples the TAP 318 instruction and data register control bus inputs to multiplexer input port B to the multiplexer instruction and data register control bus outputs on output port C 4718. Thus by control of multiplexer 4704, the TAP can determine, by the loading of instructions in the instruction register 314 of architecture 4604, whether the control for operating instruction and data registers in architecture 4610 comes from the WSP 202 or from the TAP 318. As seen in FIG. 48, the TAP has no equivalent control signal for the TransferDR output from the WSP. Therefore the TransferDR input to multiplexer input port B can be wired to a fixed value (low) or wired to the Transfer input to the WSP, both possibilities being shown in dotted line.

If architecture 4610 does not include data registers with transfer cells (i.e. data register 5 types), the TransferDR input on input port B may be wired to a fixed value, or deleted altogether along with the TransferDR output on output port C. If architecture 4610 includes data register 5 types, the TransferDR input to port B can be wired to the WSP's Transfer input. If wired to the WSP's Transfer input, it is possible to control the TransferDR signal, via the Transfer input, during times when the TAP 318 is selected to access data register 5 types and during times when the TAP is in the Shift-DR state.

Figure 40:
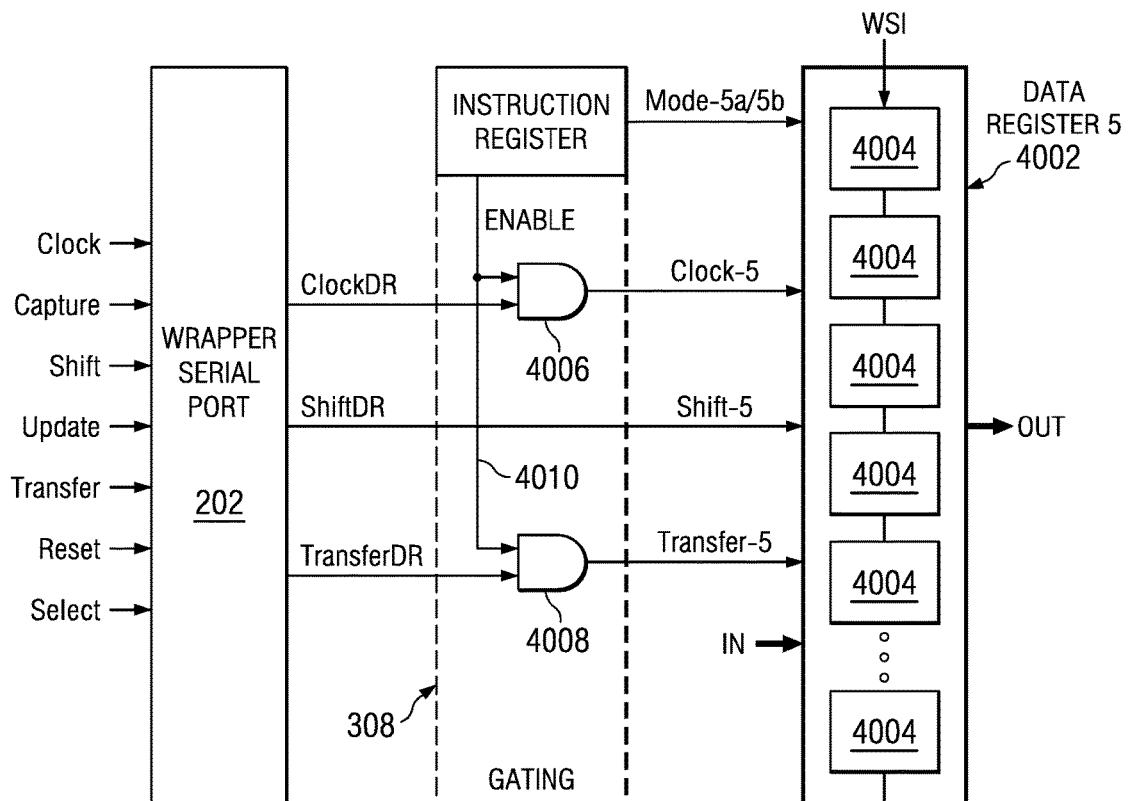
FIGS. 40 and 40A illustrate a WSP accessing a data register 5 design style.
Figure 40A:
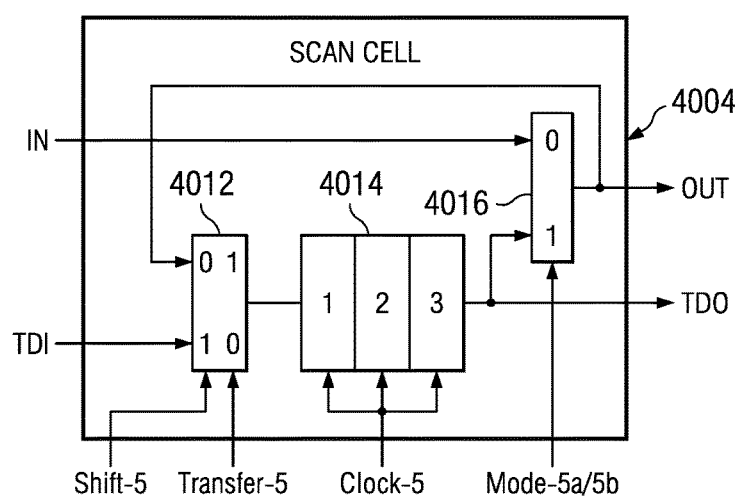
Figure 41:
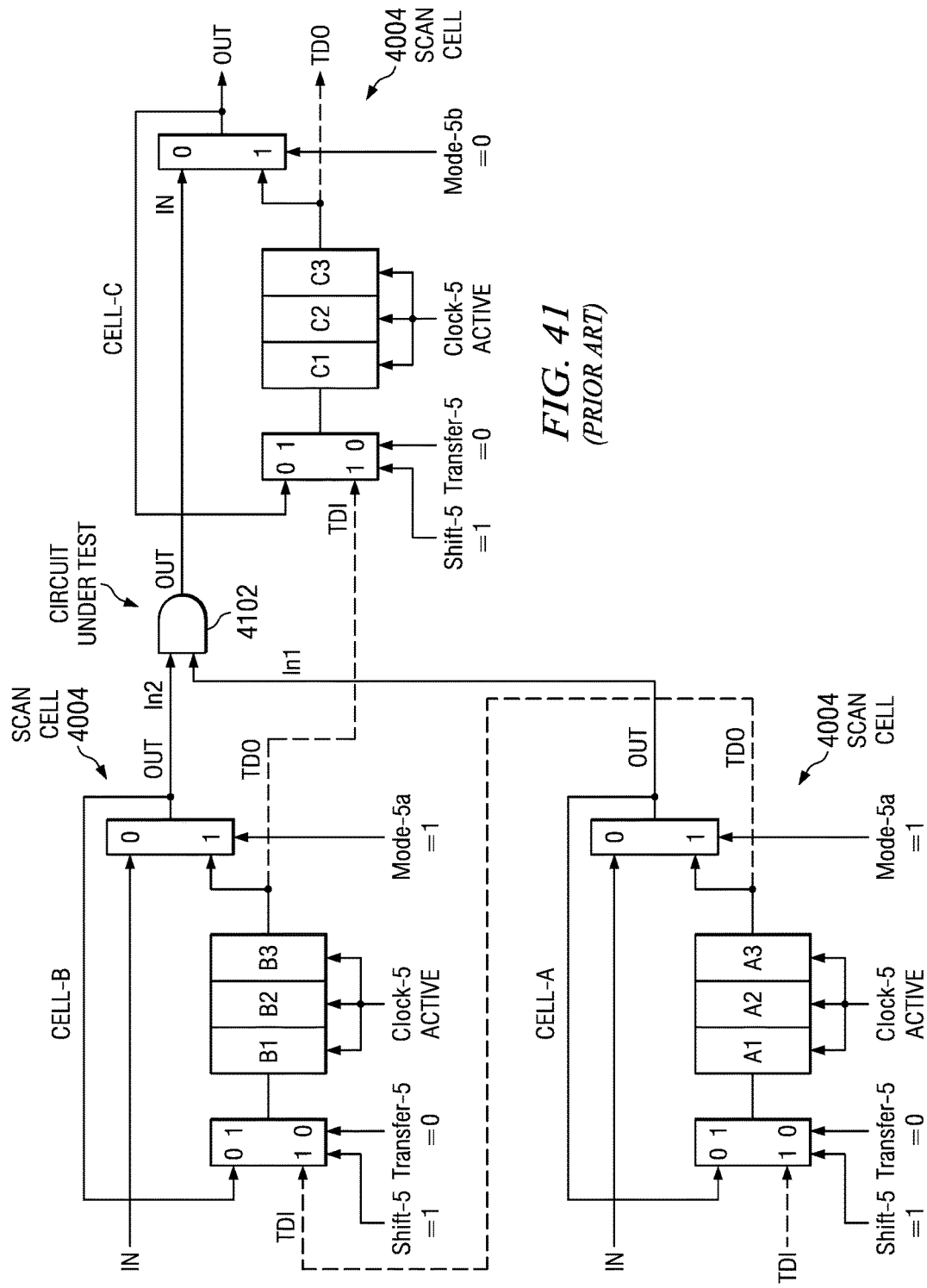
FIG. 41 illustrates the shift mode of scan cells in data register 5.
Figure 42:
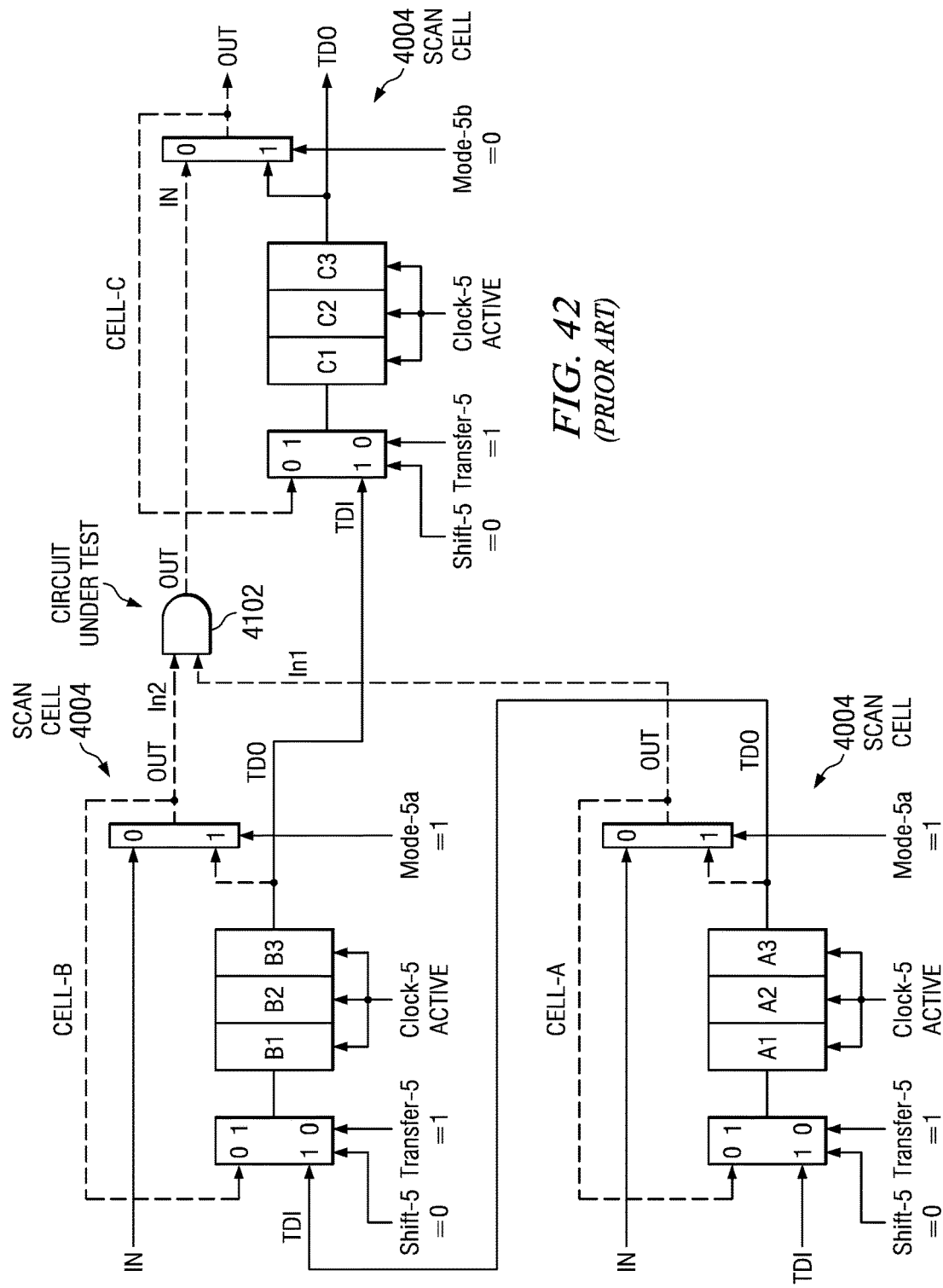
FIG. 42 illustrates the transfer mode of scan cells in data register 5.
Figure 43:
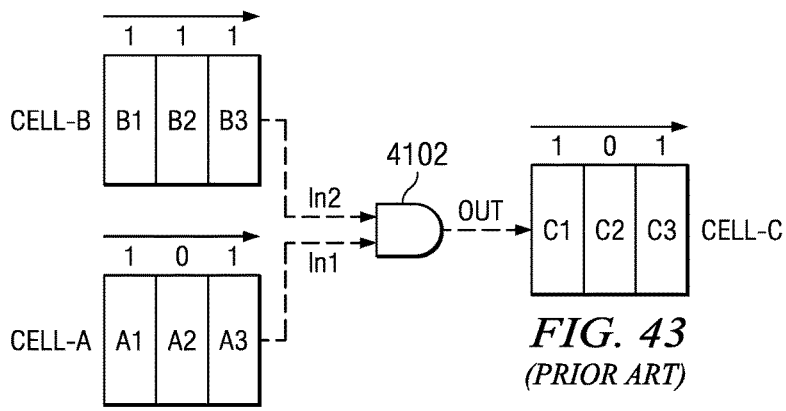
FIG. 43 illustrates the first transfer operation of data register 5 scan cells.
Figure 44:
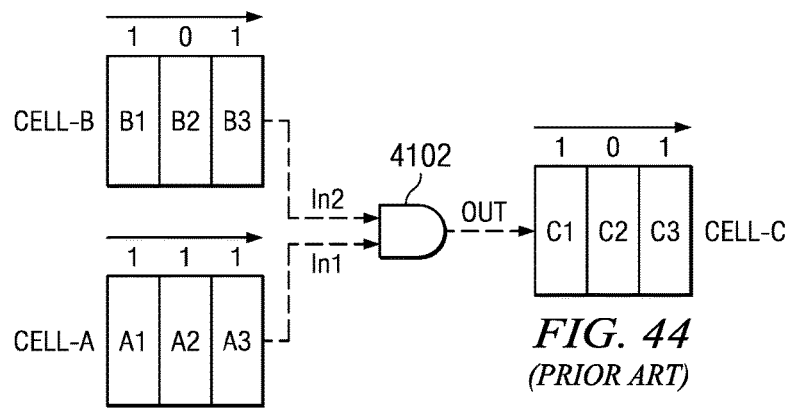
FIG. 44 illustrates the second transfer operation of data register 5 scan cells.

These Shift-DR state times were previously indicated in timing diagram FIGS. 11, 13, 15, and 17 as dotted boxes beginning with A and ending with B. To achieve Transfer operations when the TAP is accessing a data register 5 type and during the TAP Shift-DR state, a subtle modification to the input multiplexer 4012 of transfer cell 4004 in FIG. 40 is required. This modification is shown in transfer cell 6204 of FIG. 62 where it is seen by dotted box that the input multiplexer 6206 selects the transfer mode of operation whenever the Transfer-5 signal (TransferDR) is high, regardless of the state of the Shift-5 signal (ShiftDR).

Figure 63:
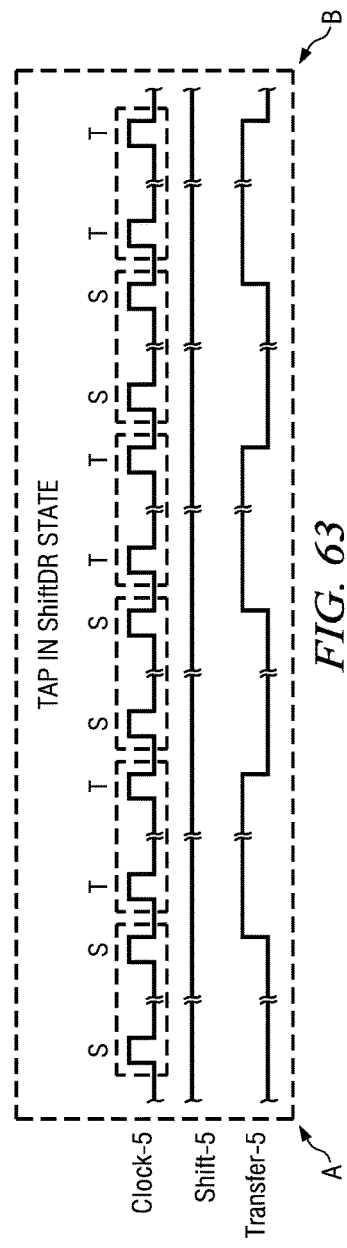
FIG. 63 illustrates a data register 5 timing diagram of the second embodiment.

The timing diagram of FIG. 63 indicates transfer operations taking place by manipulation of the Transfer-5 input while the TAP is in the Shift-DR state (Shift-5 high), as indicated by the A and B dotted line box. By mentally substituting transfer cell 6204 for transfer cell 4004 and the TAP of FIG. 62 for the WSP of FIG. 40 it is clear that all the shift (S) and transfer (T) operation examples given in FIGS. 41-44 are operable from the timing diagram of FIG. 63.

Figure 46:
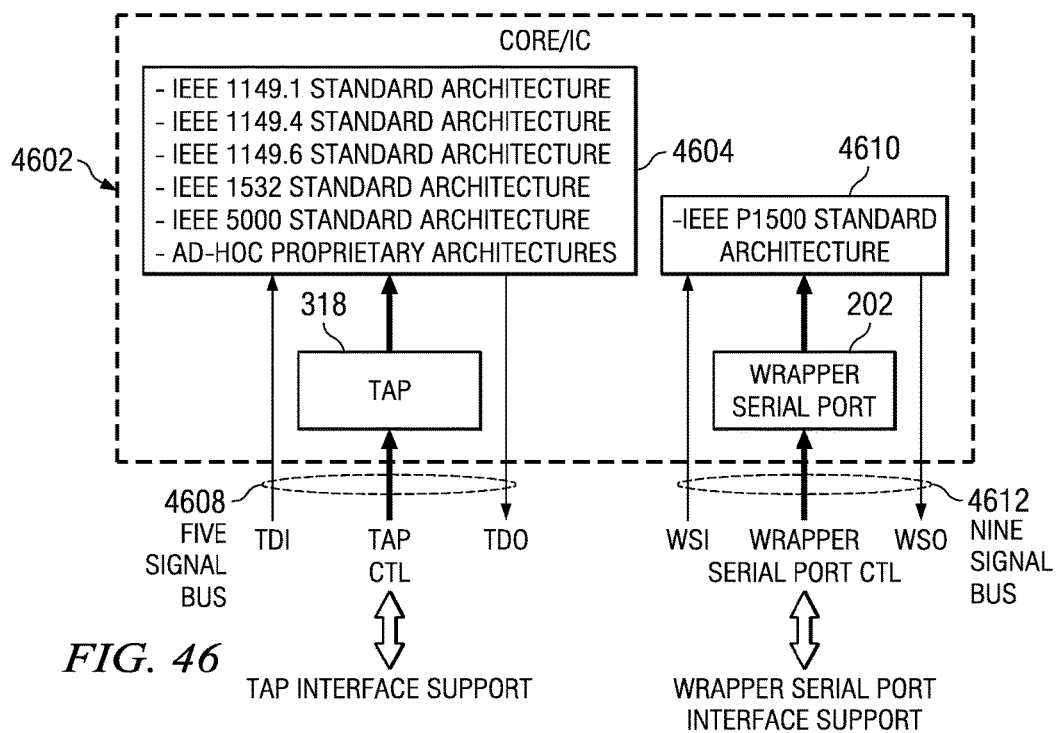
FIG. 46 illustrates a circuit including both IEEE 1149.1 and P1500 standards.
Figure 45:
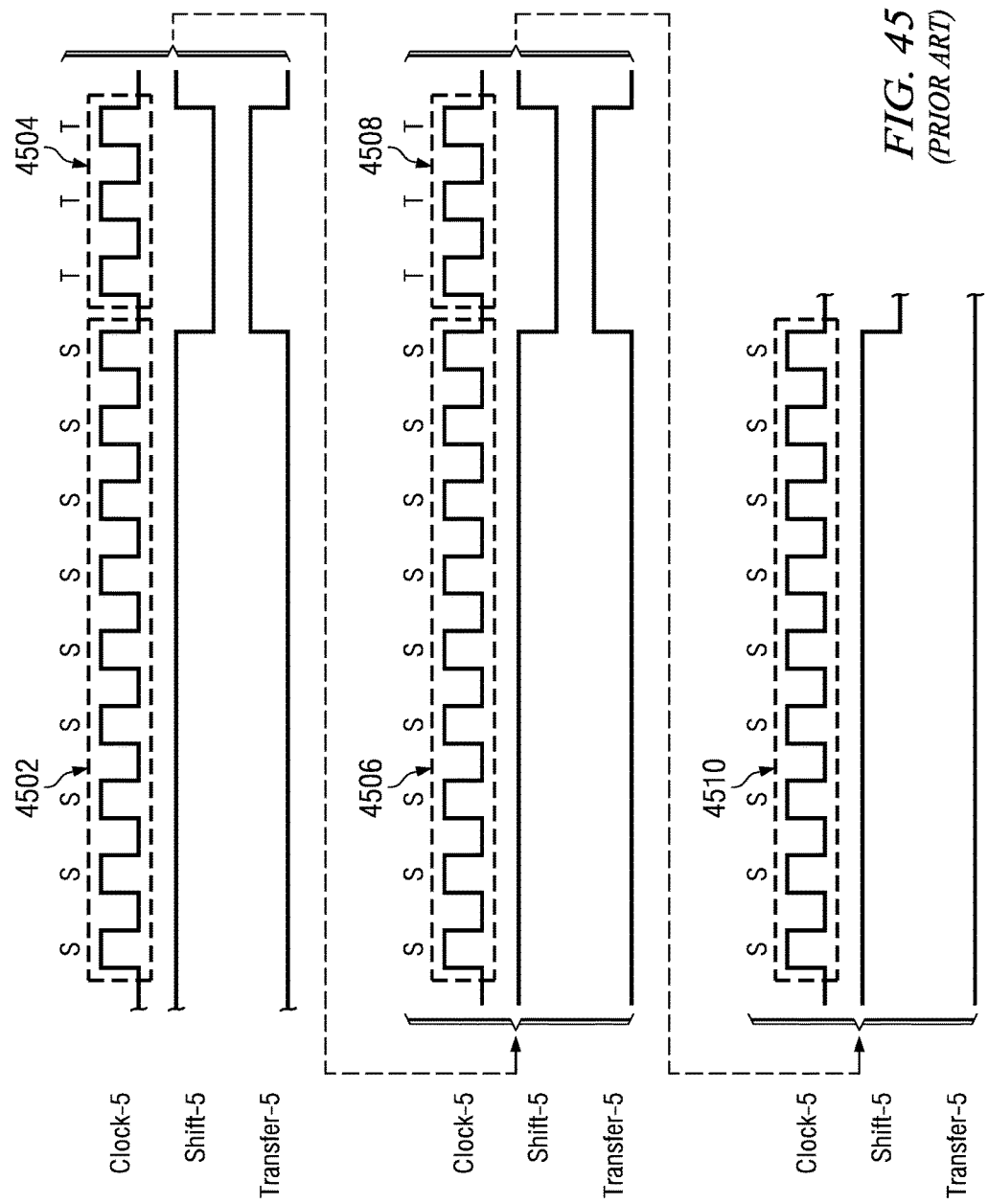
FIG. 45 illustrates a data register 5 shift and transfer timing diagram.

From the above description it is seen that the first embodiment, as depicted in the test architecture arrangement of circuit 4702 of FIG. 47, provides the following improvements over the test architecture arrangement of circuit 4602 of FIG. 46.

The test architecture arrangement of circuit 4702, like the test architecture arrangement of circuit 4602, allows for the separate operation of the TAP based and WSP based test architectures 4604 and 4610. Having separate operation of the WSP 202 and its architecture 4610 allows compatibility with the IEEE P1500 standard.

The test architecture arrangement of circuit 4702, unlike the test architecture of circuit 4602, allows for serially linking architectures 4604 and 4610 together and controlling the serially linked architectures using TAP 318. Also the linking and unlinking of the architectures 4604 and 4610 is controlled by the TAP loading of instruction register 314 in architecture 4604. Thus the TAP 318 and its architecture 4604 has mastership over the WSP 202 and its architecture 4610. Among other benefits, this importantly allows test architecture 4610 to be expandable into providing the previously described real time operations (test, emulation, debug, etc.) currently enjoyed by architecture 4604, which is made possible by the TAP's dedicated test bus 4608 interface.

The test architecture arrangement of circuit 4702 allows, while the architectures 4602 and 4702 are serially linked and controlled by the TAP in the Shift-DR state, performing transfer operations to data registers that include transfer cells. This allows duplicating the transfer mode of operation introduced by the IEEE P1500 standard using the TAP test bus and an additional signal for enabling the Transfer operation.

Figure 4:
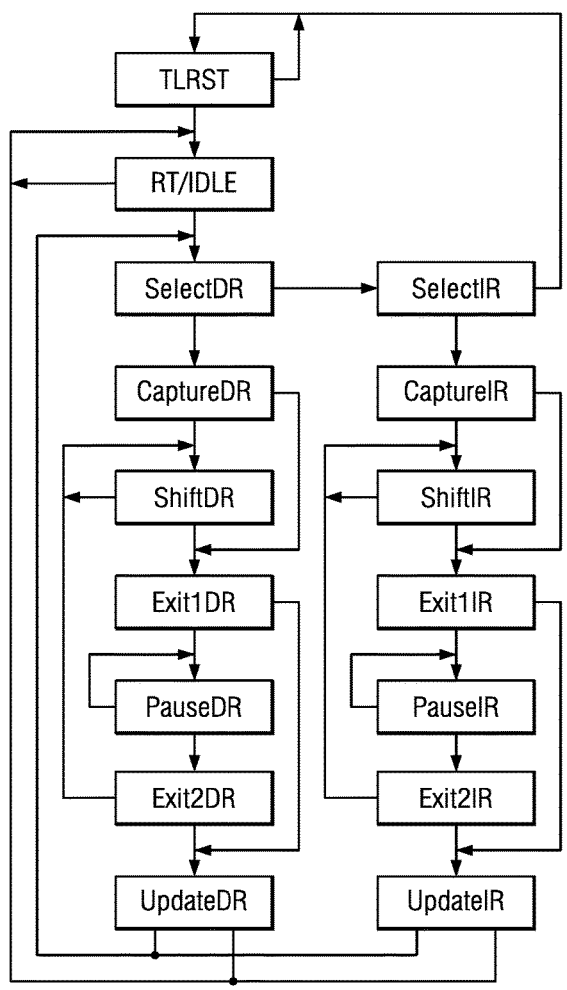
FIG. 4 illustrates the state diagram of the IEEE 1149.1 TAP state machine.
Figure 5:
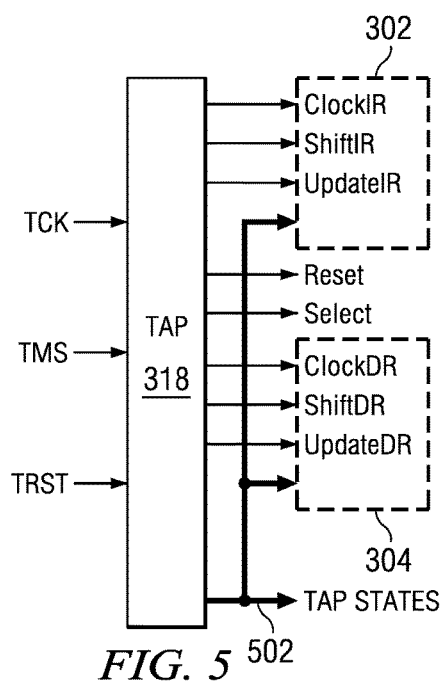
FIG. 5 illustrates an IEEE 1149.1 TAP state machine in more detail.
Figure 6:
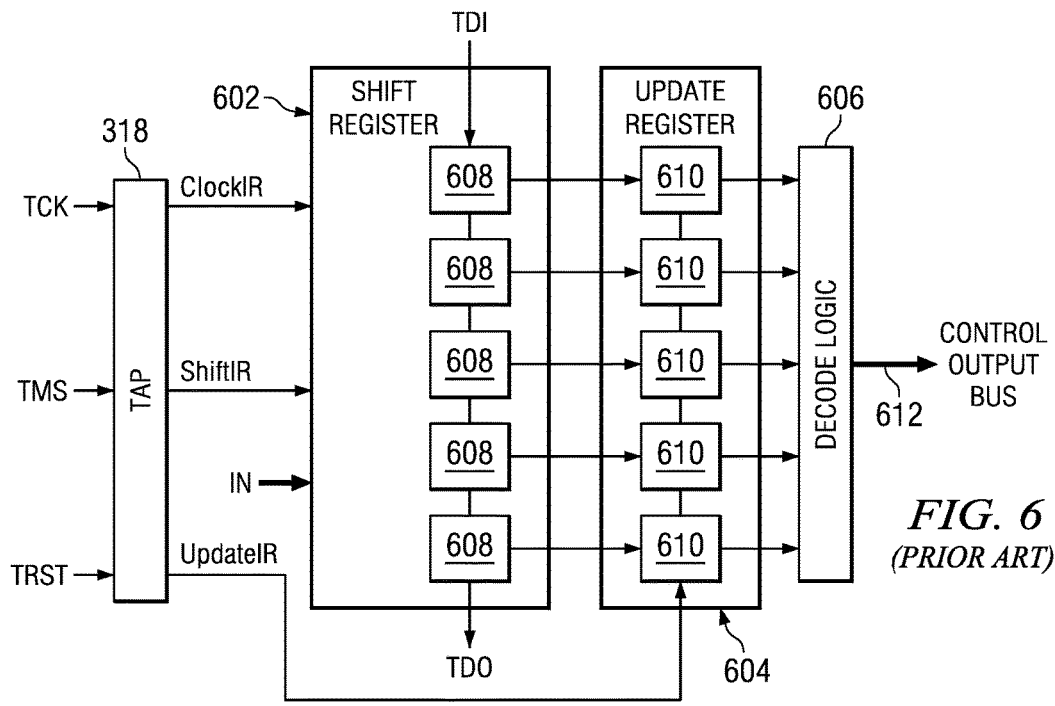
FIGS. 6, 6A, and 6B illustrate a IEEE 1149.1 gated instruction register design style.
Figure 6A:
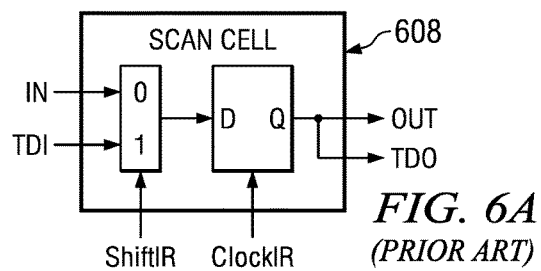
Figure 6B:
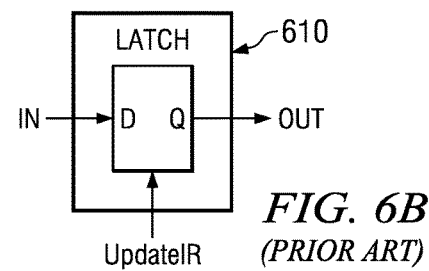
Figure 7:
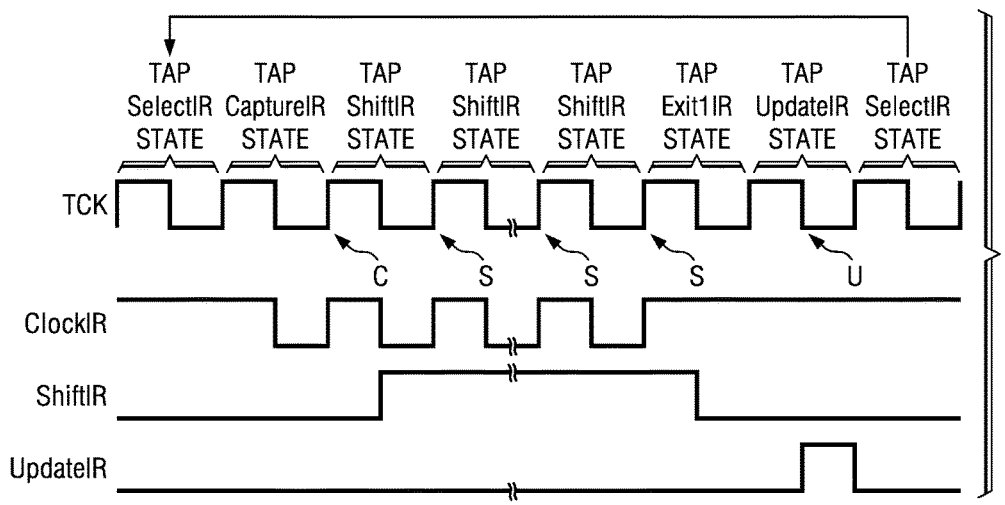
FIG. 7 illustrates a TAP gated instruction register timing diagram.
Figure 8:
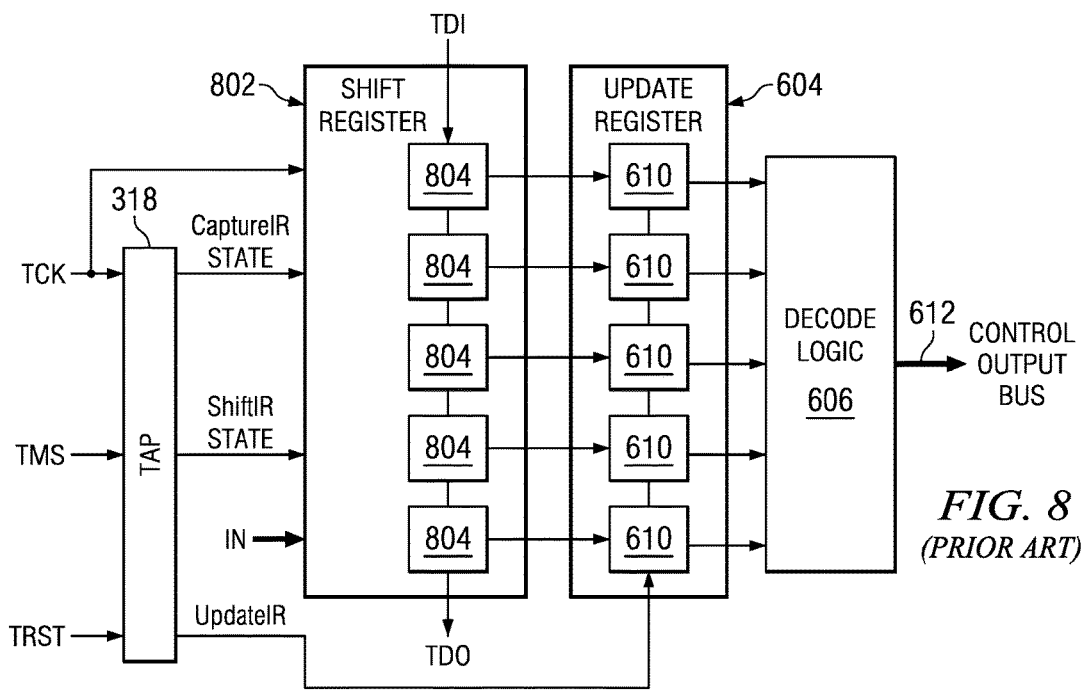
FIGS. 8, 8A, and 8B illustrate a IEEE 1149.1 synchronous instruction register design style.
Figure 8A:
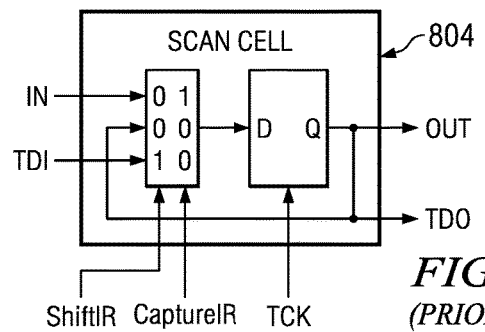
Figure 8B:
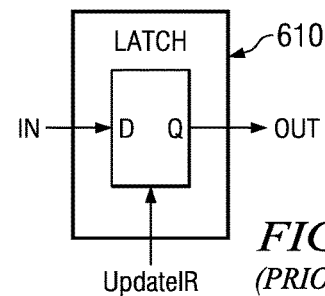
Figure 9:
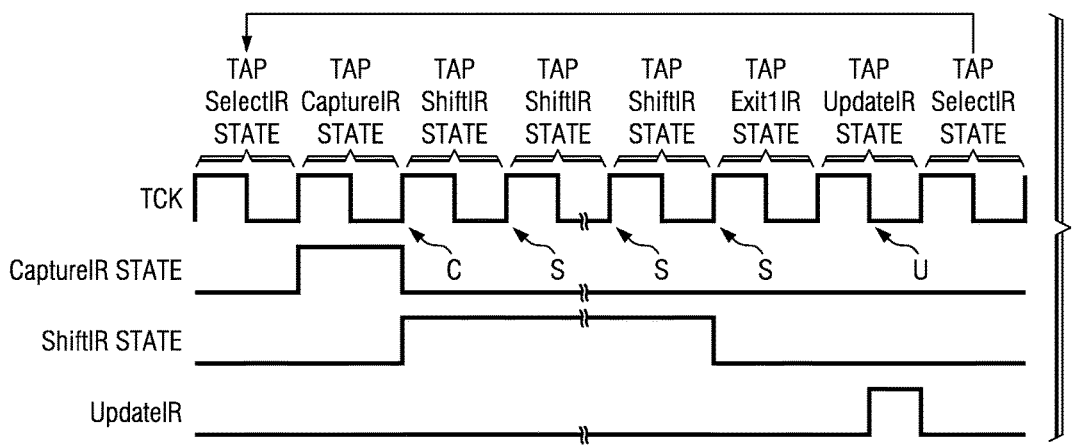
FIG. 9 illustrates a TAP synchronous instruction register timing diagram.

A problem with the first embodiment is that it still requires both TAP 318 and WSP 202 test interfaces and their associated architectures 4604 and 4610 to be used in circuit 4702. Requiring both test interfaces and architectures increases test circuitry overhead in circuit 4702. Also requiring both architectures decreases instruction and data scan efficiency since, when the architectures are serially linked and controlled by the TAP, there is always two instruction registers to shift through from TDI to TDO during instruction scan operations and two data registers to shift through from TDI to TDO during data scan operations. Further, when the architectures 4604 and 4610 are serially linked and controlled by the TAP, it is not possible to perform the flexible and tightly timed IEEE P1500 WSP controlled capture, shift, and update operations on a data register as shown in FIGS. 28, 31, 34, 35, 38, and 39. When under control of the TAP, the capture, shift, and update timing occurs in a regimented fashion according to TAP state diagram of FIG. 4.

Figure 49:
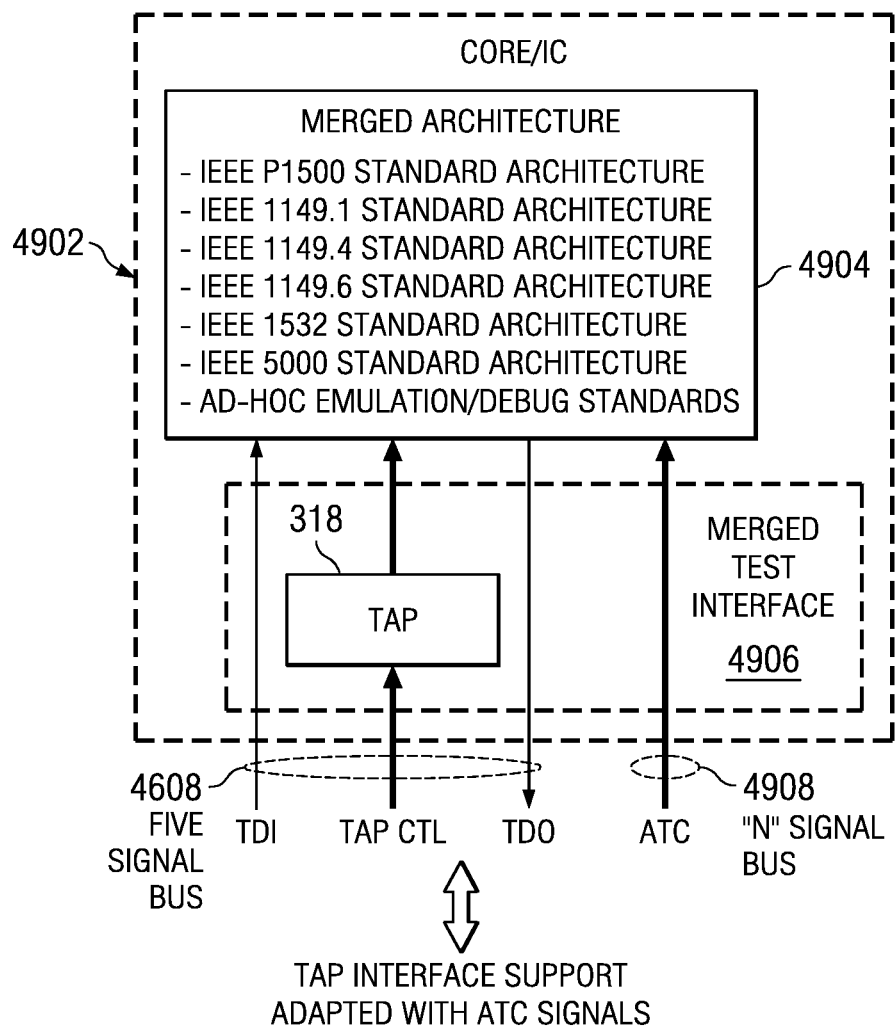
FIG. 49 illustrates the circuit of FIG. 46 implementing the second embodiment.

FIG. 49 illustrates a circuit 4902 which represents architectural modifications to circuit 4602 according to the second embodiment. The modifications include: (1) combining the architectures 4604 and 4610 of circuit 4602 to form a single merged architecture 4904, (2) eliminating the WSP 202 test interface of circuit 4602, and (3) adding an auxiliary test control (ATC) bus of signals 4908 and combining those signals with the TAP 318 test bus 4608 to form a merged test interface 4906 which provides control and access to the merged architecture 4904.

Figure 2:
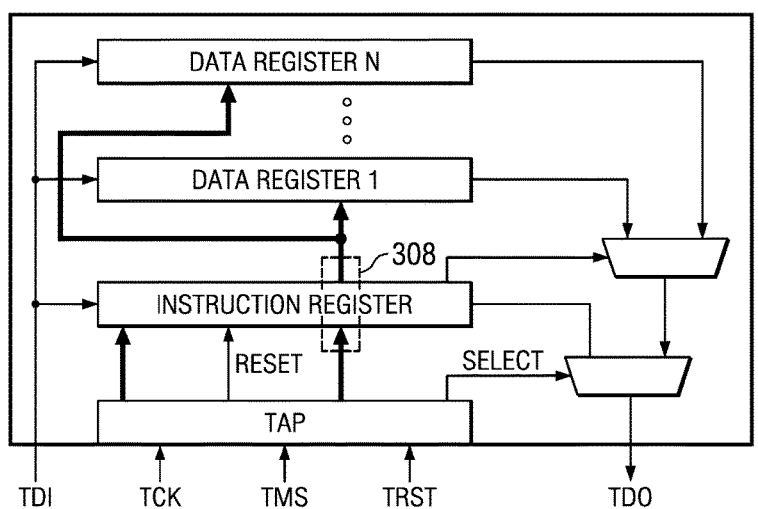
FIG. 2 illustrates a simplified view of IEEE standard 1149.1.
Figure 50:
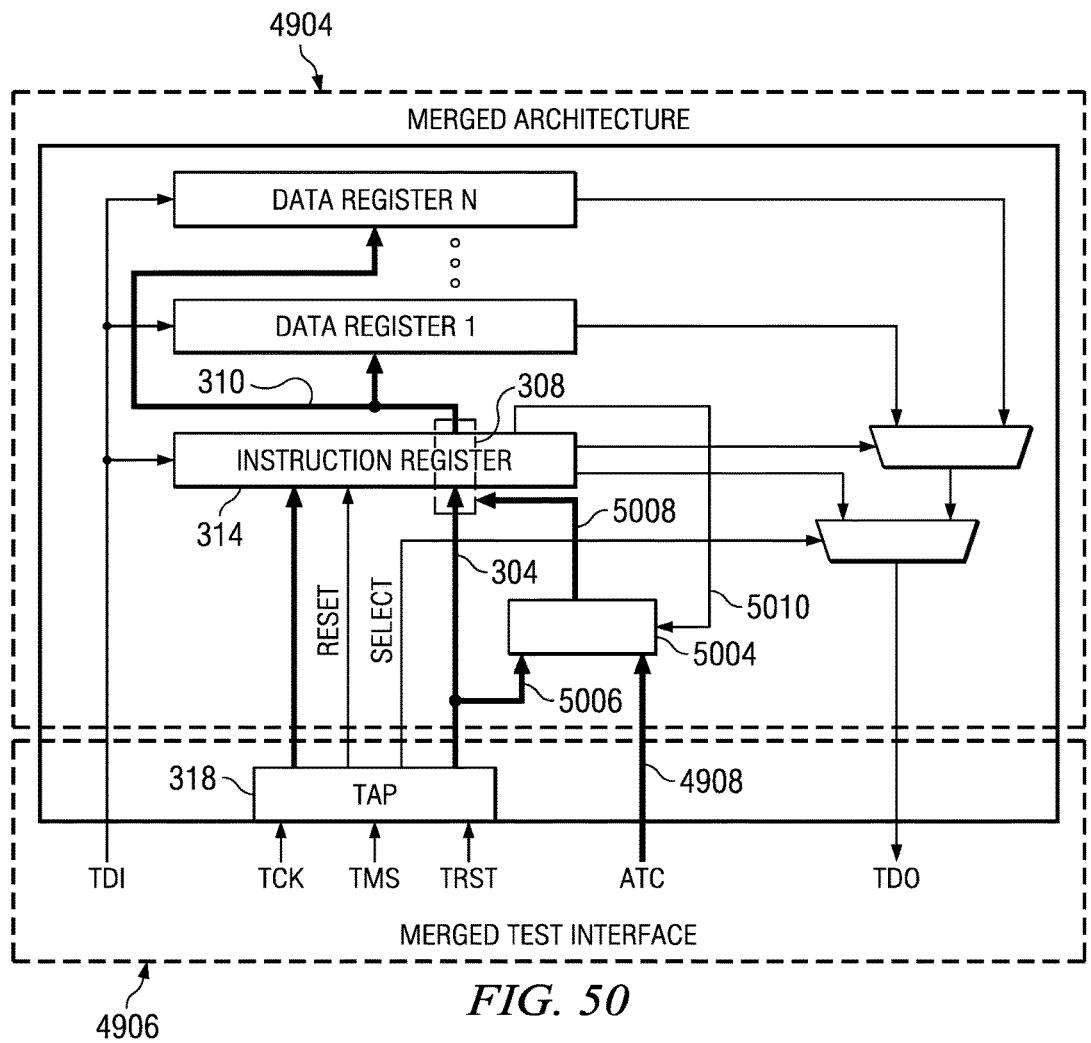
FIG. 50 illustrates the test interface and architecture of the second embodiment.

FIG. 50 illustrates the merged test interface 4906 and merged architecture 4904 in more detail. As seen, the merged test interface 4906 and architecture 4904 is identical to the TAP based architecture of FIG. 2, with the exception that the merged architecture 4904 includes an additional gating circuit 5004. The gating circuit 5004 receives input 5006 from the data register control bus 304 from TAP 318, the ATC bus 4908, and input 5010 from the instruction register 314. The gating circuit 5004 outputs signals 5008 to gating circuit 308.

Figure 3:
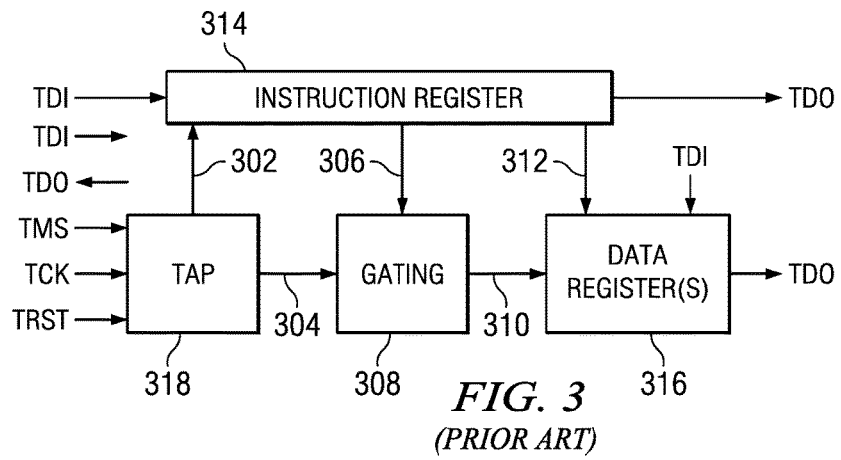
FIG. 3 illustrates circuit blocks of IEEE standard 1149.1.
Figure 51:
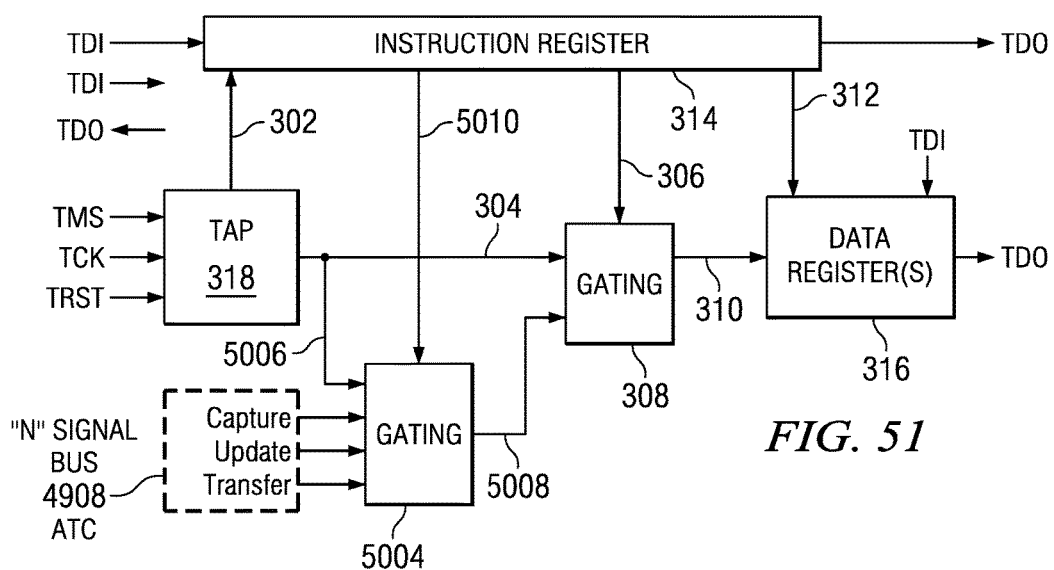
FIG. 51 illustrates the circuit blocks of the second embodiment.

FIG. 51 illustrates in further detail the merged test interface and architecture of FIGS. 49 and 50. The similarity to the TAP based architecture of FIG. 3 is clearly apparent. The key difference being the addition of the gating circuit 5004 and the ATC bus 4908. As will be seen in more detail later, gating circuit 5004 serves to intercept certain ones of signals from the TAP's data register control bus 304 on bus 5006, gate the intercepted signals with signals input from the ATC bus 4908 (Capture, Update, and Transfer), and output the gated signals to gating circuit 308 via bus 5008. The purpose of gating circuit 5004 is to allow signals on the ATC bus 4908 to operate while the TAP is in the Shift-DR state to perform the flexible and tightly timed capture, shift, update, and/or update operations that were achieved using the WSP.

The TAP 318 accesses the instruction register 314 in the same way as described previously in regard to FIGS. 6-9. In the merged architecture 4904, it is seen that a single instruction register 314 is advantageously utilized instead having two separate instruction registers in the non-merged architectures 4604 and 4610 of FIGS. 46 and 47.

In preparation for the following description, it is good to revisit the dotted line box beginning with A and ending with B in timing diagram FIGS. 11, 13, 15, and 17. This A-B time frame indicates when the TAP is in its ShiftDR state. While in the ShiftDR state, the TAP continuously enables its ClockDR output to allow data to be transferred through the gated data register design examples of FIGS. 10 and 14. Likewise, while in the ShiftDR state the TAP sets the ShiftDR state indication output on bus 304 high to allow data to be transferred in the synchronous data register design example of FIGS. 12 and 16. The second embodiment utilizes the TAP's ShiftDR state in combination with the ATC bus signals 4908 to allow data registers to perform all the flexible and tightly timed capture, shift, update, and/or transfer operations achieved by the WSP. All the flexible and tightly timed test operations, as described below using the previous examples, will occur entirely within the A-B time frame with the TAP in the ShiftDR state.

Figure 10:
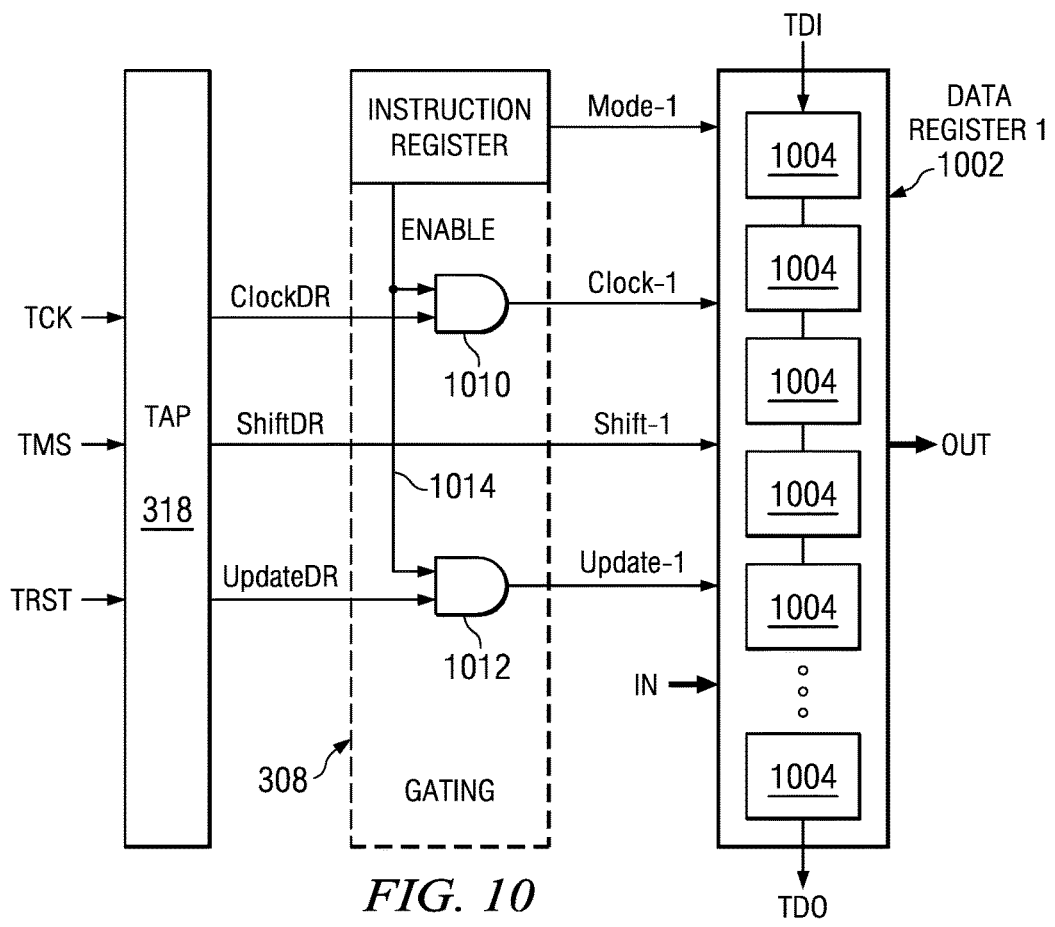
FIGS. 10 and 10A illustrate an IEEE 1149.1 data register 1 design style.
Figure 10A:
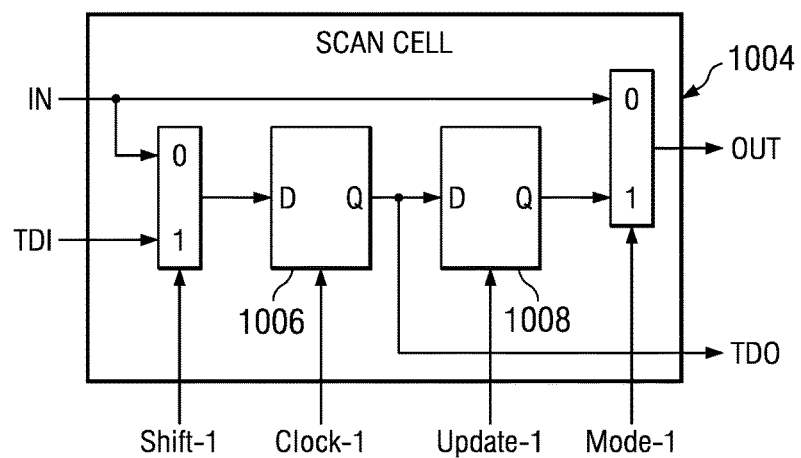
Figure 52:
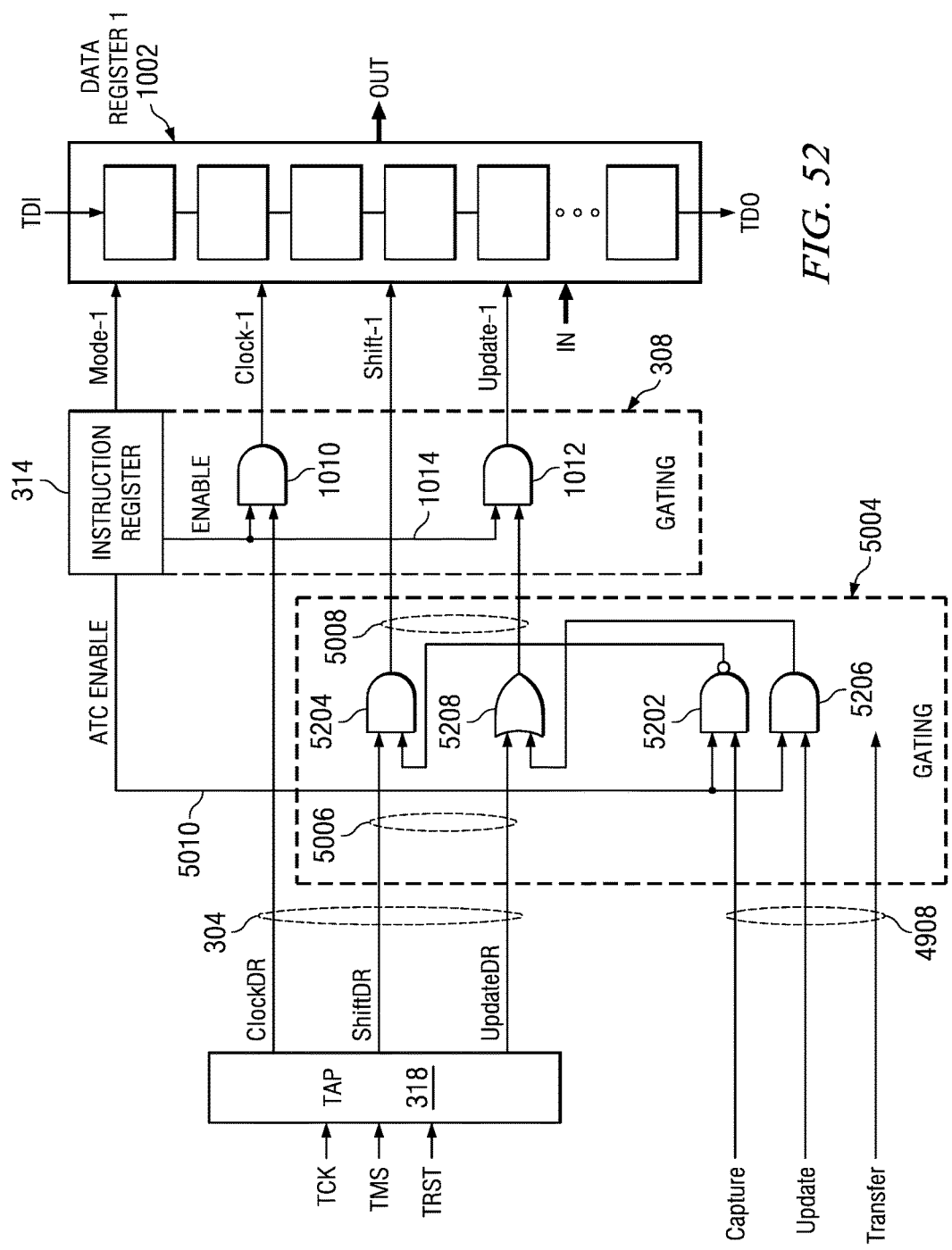
FIG. 52 illustrates the second embodiment accessing data register 1.

FIG. 52 illustrates the data register 1 example of FIG. 10 adapted to include the gating circuit 5004 and ATC bus 4908. As seen, gating circuit 5004 inputs, on bus 5006, the ShiftDR and UpdateDR signals from TAP bus 304, the ATC bus signals 4908, and the ATC enable signal 5010 from instruction register 314. The gating circuit 5004 outputs, on bus 5008, gated versions of the ShiftDR and UpdateDR signals to gating circuit 308. If the TAP is to control scan operations to data register 1, as previously described in FIGS. 10 and 11, the ATC enable signal 5010 will be set low to disable the ATC bus signals 4908 from effecting the TAP's mode of operation. However, if data register 1 is to be controlled using the mode of operation of the second embodiment the ATC enable signal 5010 will be set high by an instruction scanned into the instruction register to enable the ATC bus signals 4908.

When the ATC enable signal 5010 is high, gates 5202 and 5204 of gating circuit 5004 are enabled to allow the ATC Capture signal to directly control the Shift-1 input of data register 1. Also gates 5206 and 5208 of gating circuit 5004 are enabled to allow the ATC Update signal to directly control the Update-1 input of data register 1. Since the ATC Transfer signal is not used in this example, it is simply shown as an input to gating circuit 5004.

Figure 11:
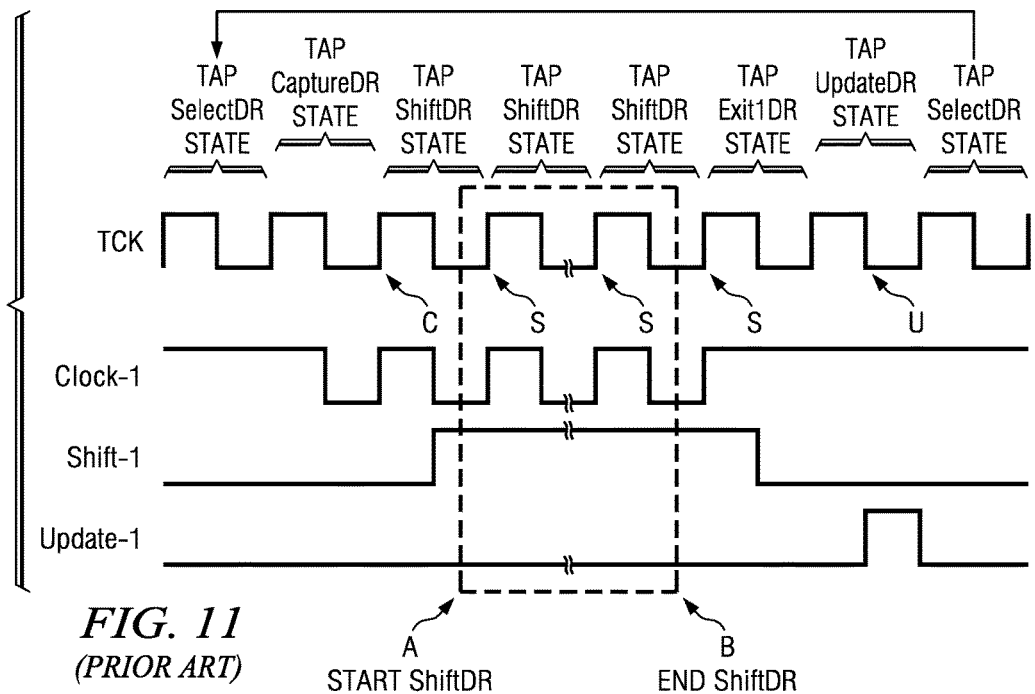
FIG. 11 illustrates a TAP data register 1 timing diagram.

Recalling from FIGS. 10 and 11 that the TAP's ShiftDR output is high during the ShiftDR state, it is clear that a logic one asserted onto the ATC Capture signal will cause a logic low on the Shift-1 input of data register 1, causing scan cells 1004 in data register 1 to capture data. Also recalling from FIGS. 10 and 11 that the TAP's UpdateDR output is low during the ShiftDR state, it is clear that a clock pulse on the ATC Update signal will cause a clock pulse on the Update-1 input of data register 1, causing scan cells 1004 in data register 1 to update data.

Figure 28:
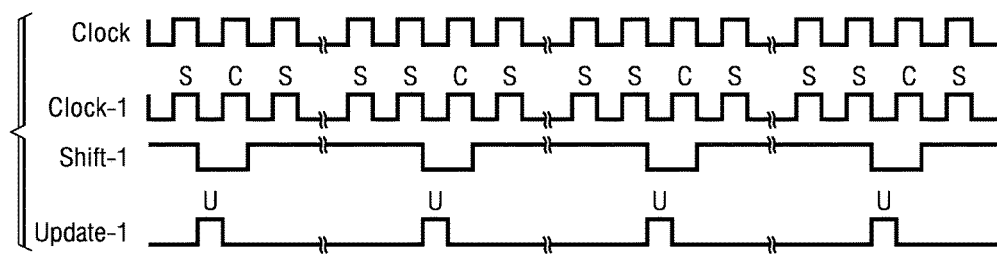
FIG. 28 illustrates a second WSP data register 1 timing diagram.
Figure 29:
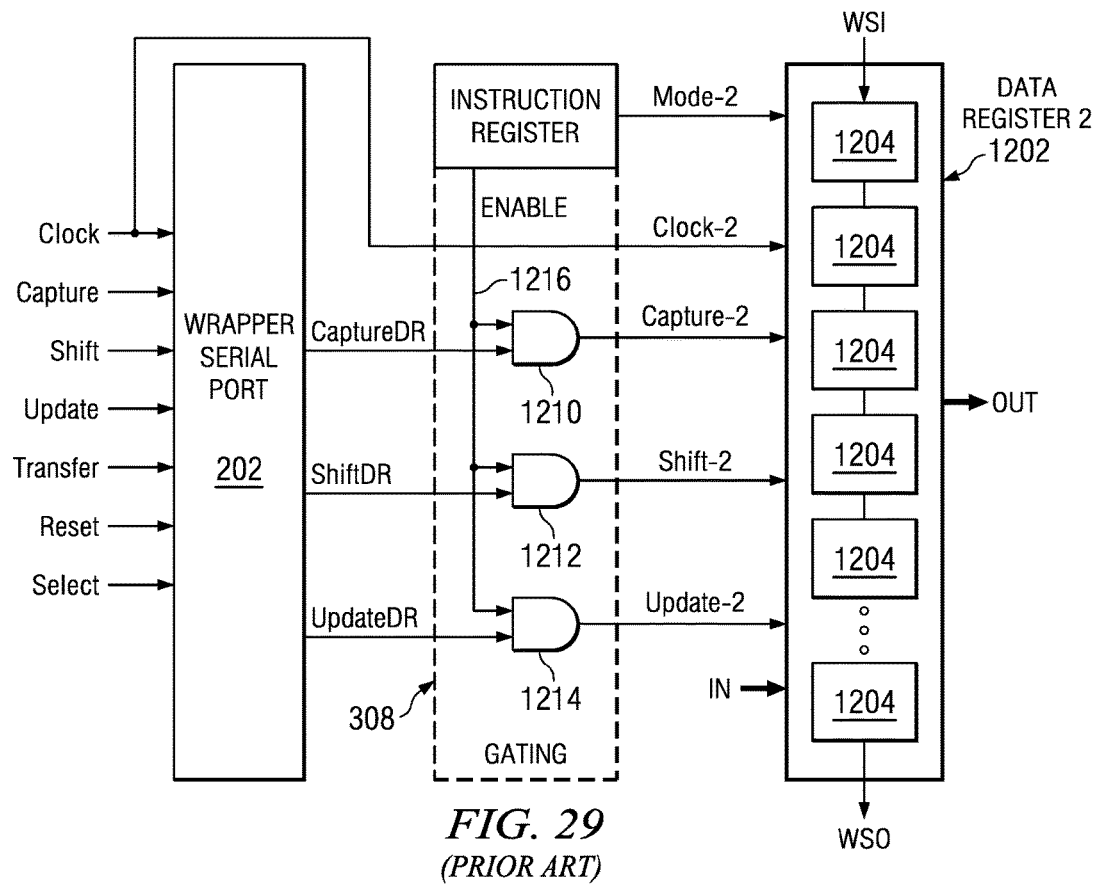
FIGS. 29 and 29A illustrate a WSP accessing data register 2.
Figure 29A:
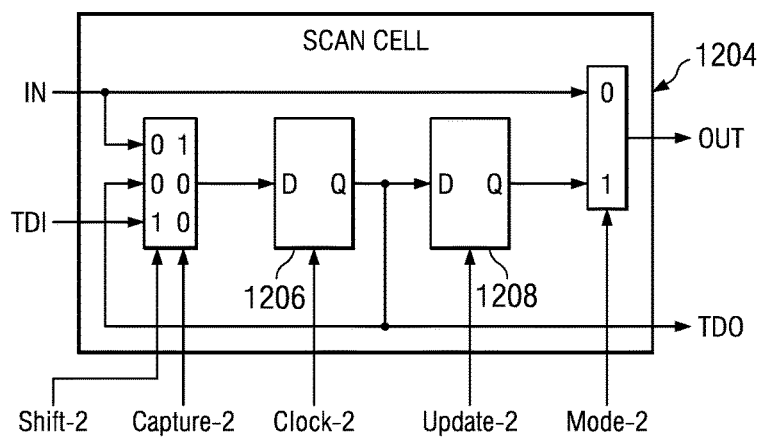
Figure 30:
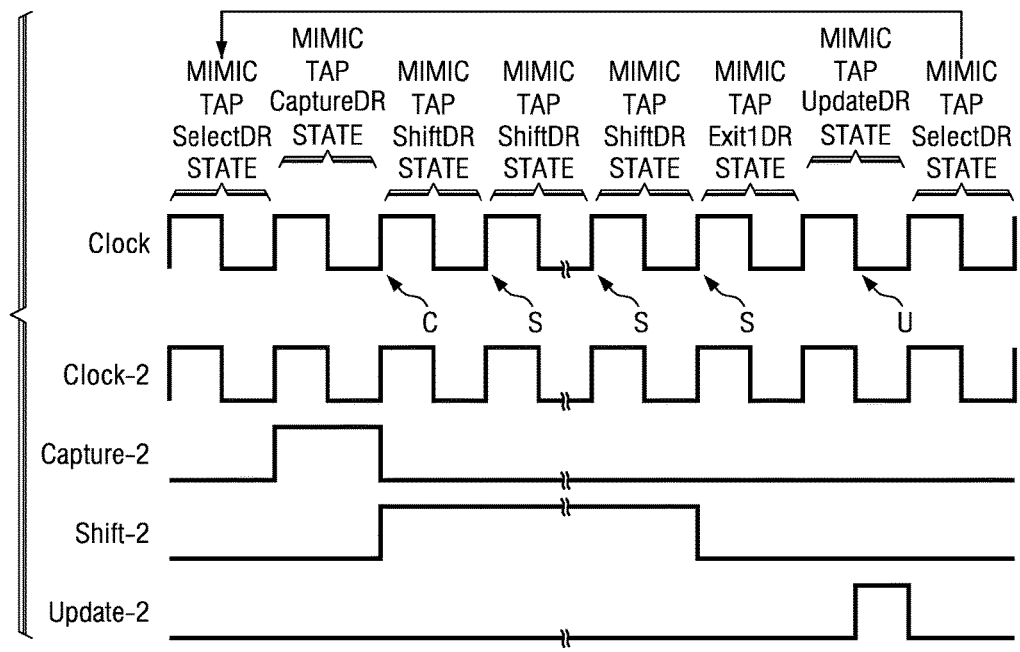
FIG. 30 illustrates a first WSP data register 2 timing diagram.
Figure 53:
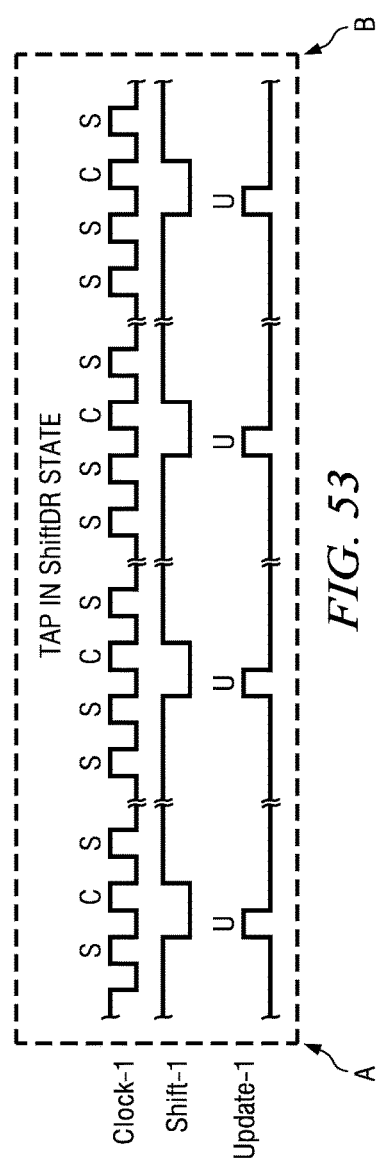
FIG. 53 illustrates a data register 1 timing diagram of the second embodiment.

FIG. 53 illustrates a timing example of the second embodiment whereby the ATC Capture and Update signals of FIG. 52 are activated during an A-B time frame while the TAP is in the ShiftDR state to duplicate the tightly timed WSP capture and shift operations of FIG. 28. Clock-1 runs continuously with the ClockDR output from the TAP during the ShiftDR state.

Figure 12:
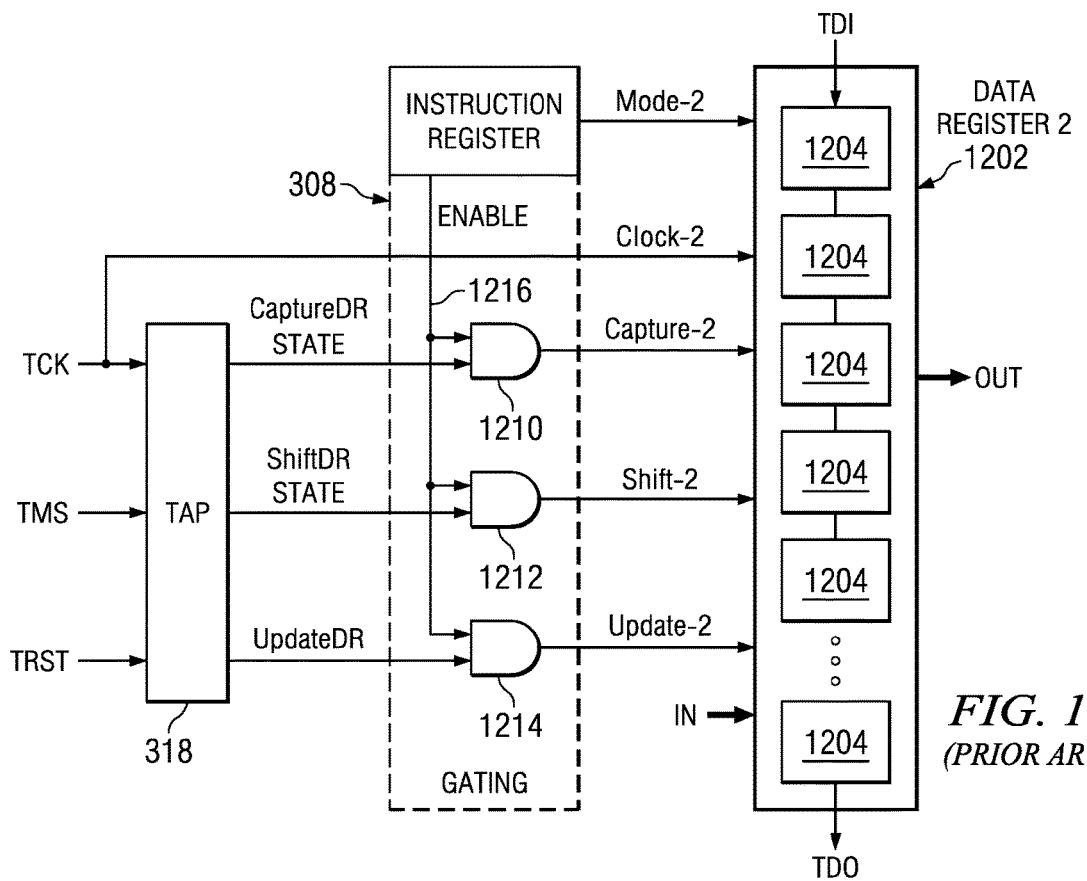
FIGS. 12 and 12A illustrate an IEEE 1149.1 data register 2 design style.
Figure 12A:
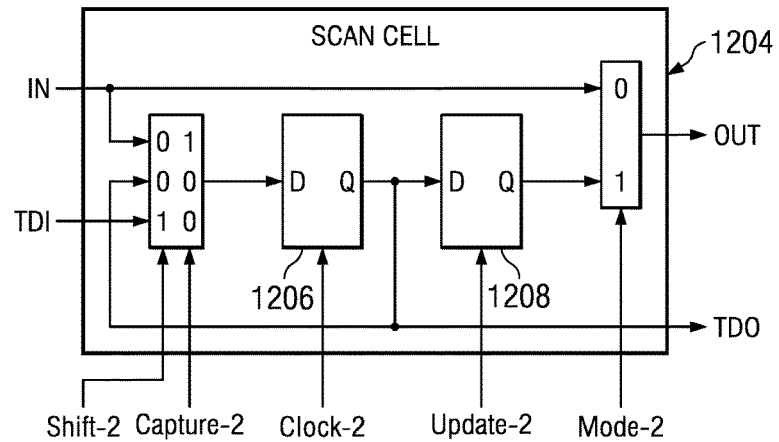
Figure 13:
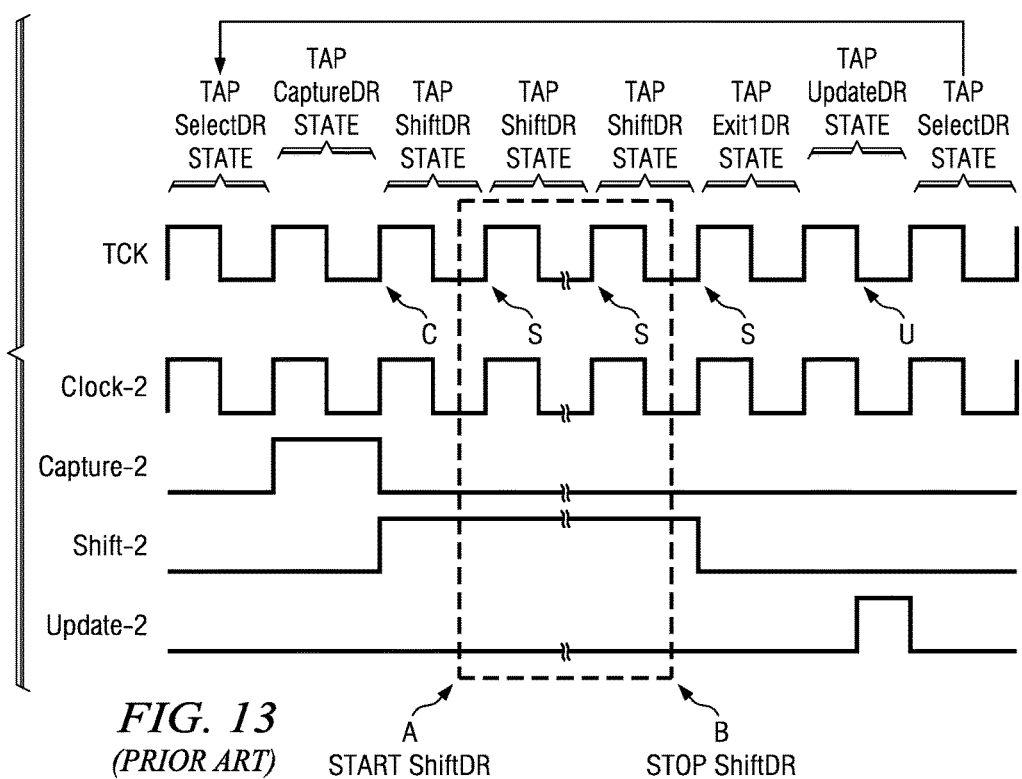
FIG. 13 illustrates a TAP data register 2 timing diagram.
Figure 54:
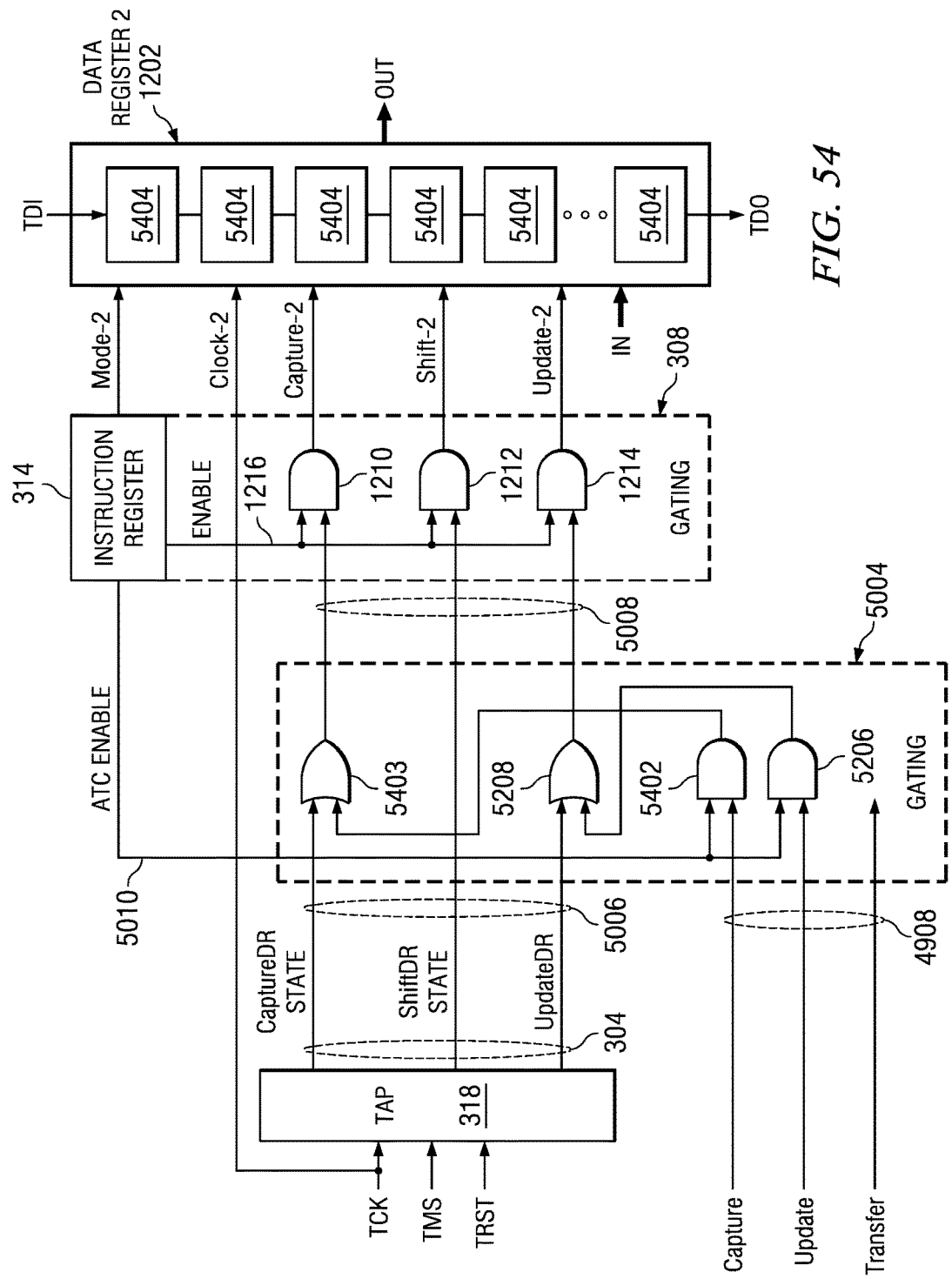
FIGS. 54 and 54A illustrate the second embodiment accessing data register 2.
Figure 54A:
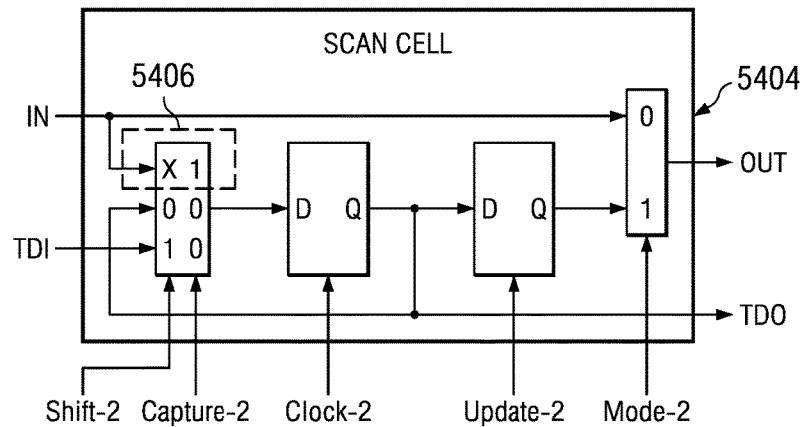

FIG. 54 illustrates the data register 2 example of FIG. 12 adapted to include the gating circuit 5004 and ATC bus 4908. The scan cells 5404 in data register 2 are shown modified from the scan cells 1204 of FIG. 12 to the extent that the input multiplexer 5406 is changed to cause a capture operation to occur whenever the Capture-2 input goes high. This is required since the Shift-2 input remains high by the TAP remaining in the ShiftDR state when testing according to the second embodiment. As seen, gating circuit 5004 inputs, on bus 5006, the CaptureDR state and the UpdateDR signals from TAP bus 304, the ATC bus signals 4908, and the ATC enable signal 5010 from instruction register 314.

The gating circuit 5004 outputs, on bus 5008, gated versions of the CaptureDR state and UpdateDR signals to gating circuit 308. If the TAP is to control scan operations to data register 2, as previously described in FIGS. 12 and 13, the ATC enable signal 5010 will be set low to disable the ATC bus signals 4908 from effecting the TAP's mode of operation. However, if data register 1 is to be controlled using the mode of operation of the second embodiment the ATC enable signal 5010 will be set high by an instruction scanned into the instruction register to enable the ATC bus signals.

When the ATC enable signal 5010 is high, gates 5402 and 5404 of gating circuit 5004 are enabled to allow the ATC Capture signal to directly control the Capture-2 input of data register 2. Also gates 5206 and 5208 of gating circuit 5004 are enabled to allow the ATC Update signal to directly control the Update-2 input of data register 2. Recalling from FIGS. 12 and 13 that the TAP's CaptureDR state signal is low during the ShiftDR state, it is clear that a logic one asserted onto the ATC Capture signal will cause a logic one on the Capture-2 input of data register 2, causing scan cells 5404 in data register 2 to capture data. Also recalling from FIGS. 12 and 13 that the TAP's UpdateDR output is low during the ShiftDR state, it is clear that a clock pulse on the ATC Update signal will cause a clock pulse on the Update-2 input of data register 2, causing scan cells 5404 in data register 2 to update data.

Figure 31:
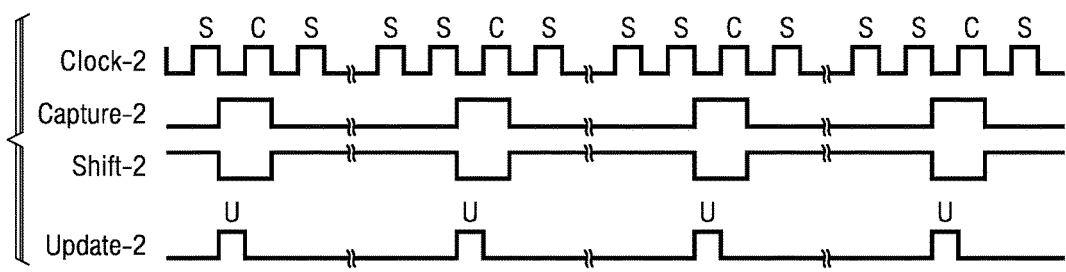
FIG. 31 illustrates a second WSP data register 2 timing diagram.
Figure 32:
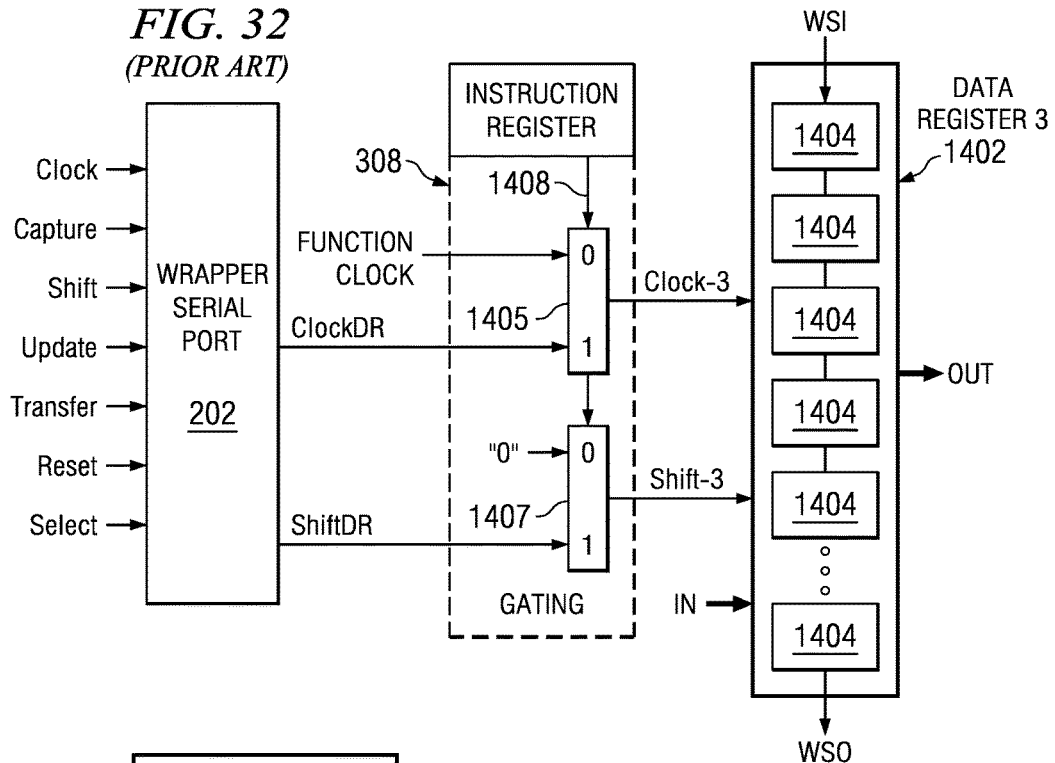
Figure 33:
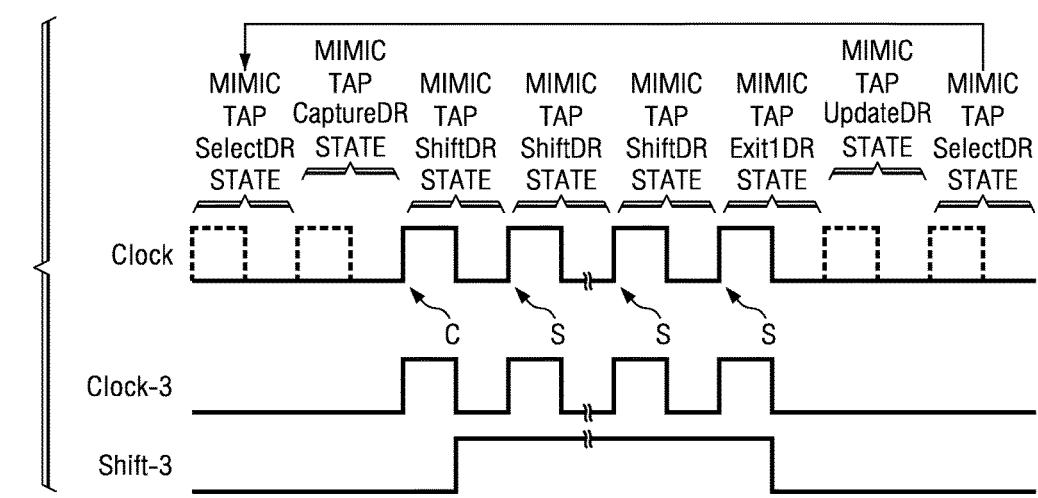
FIG. 33 illustrates a first WSP data register 3 timing diagram.
Figure 55:
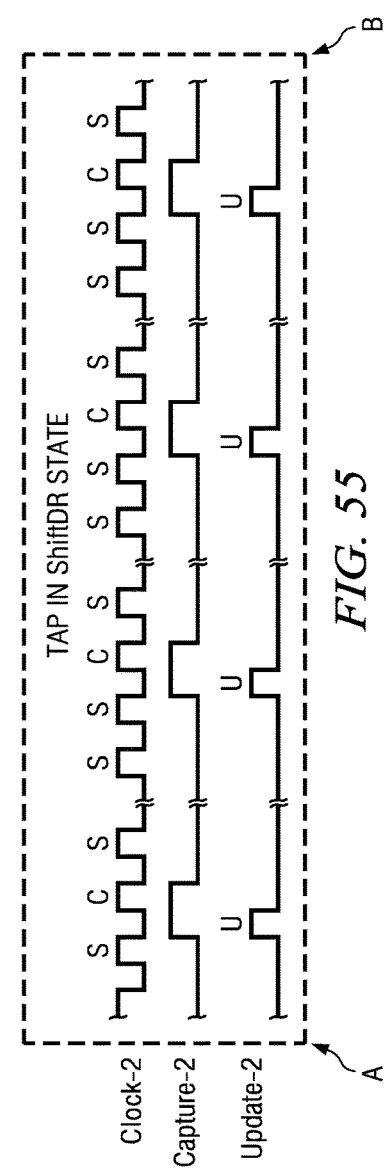
FIG. 55 illustrates a data register 2 timing diagram of the second embodiment.

FIG. 55 illustrates a timing example of the second embodiment whereby the ATC Capture and Update signals of FIG. 54 are activated during an A-B time frame while the TAP is in the ShiftDR state to duplicate the tightly timed WSP capture, shift, and update operations of FIG. 31. While not shown, the Shift-2 signal is high during the A-B time frame since the TAP is in the ShiftDR state. Clock-2 runs continuously with TCK during test.

Figure 56:
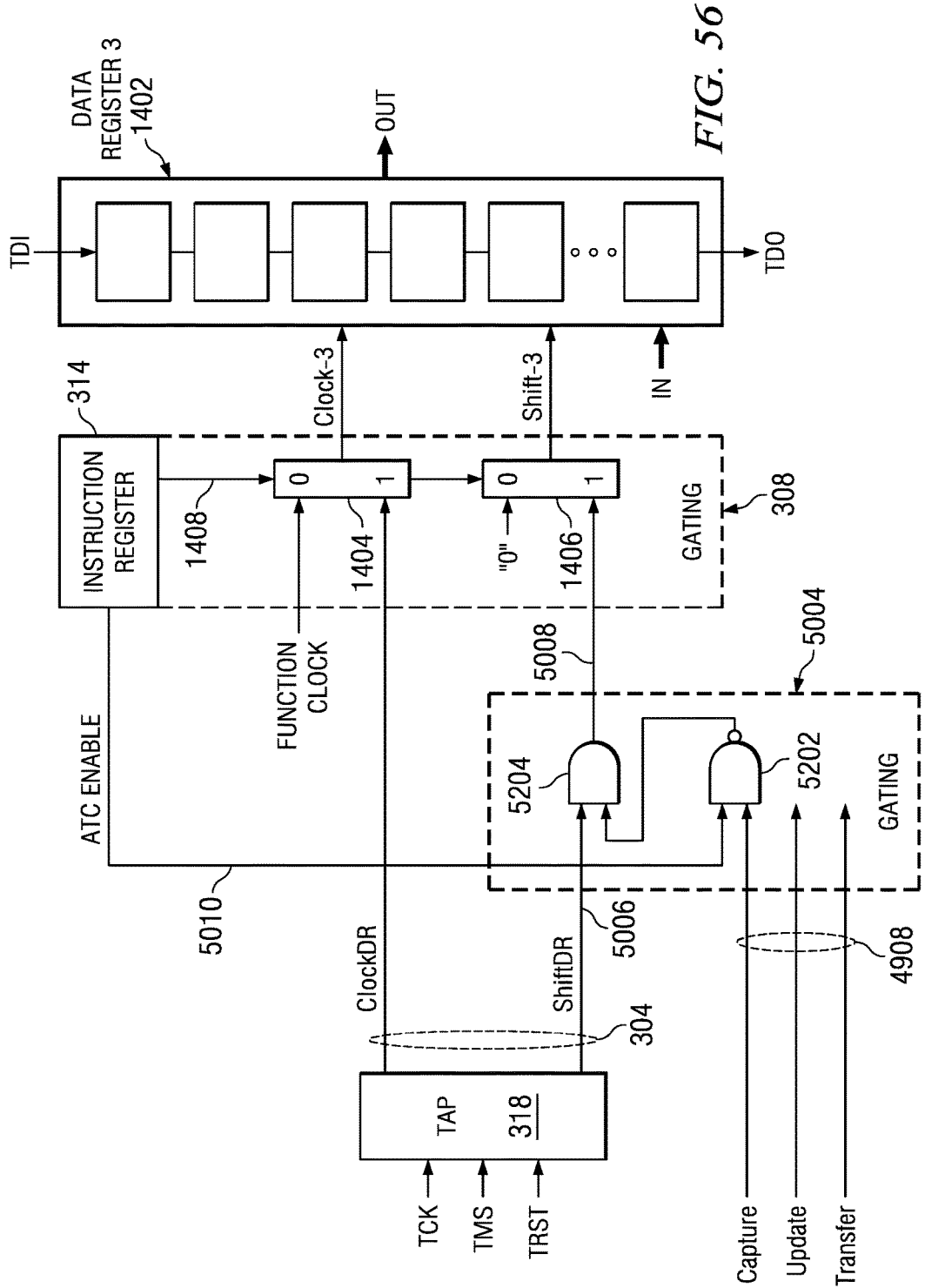
FIG. 56 illustrates the second embodiment accessing data register 3.

FIG. 56 illustrates the data register 3 example of FIG. 14 adapted to include the gating circuit 5004 and ATC bus 4908. As seen, gating circuit 5004 inputs, on bus 5006, the ShiftDR signal from TAP bus 304, the ATC bus signals 4908, and the ATC enable signal 5010 from instruction register 314. The gating circuit 5004 outputs, on bus 5008, a gated version of the ShiftDR signal to gating circuit 308. If the TAP is to control scan operations to data register 3, as previously described in FIGS. 14 and 15, the ATC enable signal 5010 will be set low to disable the ATC bus signals 4908 from effecting the TAP's mode of operation. However, if data register 3 is to be controlled using the mode of operation of the second embodiment the ATC enable signal 5010 will be set high by an instruction scanned into the instruction register to enable the ATC bus signals.

When the ATC enable signal 5010 is high, gates 5202 and 5204 of gating circuit 5004 are enabled to allow the ATC Capture signal to directly control the Shift-3 input of data register 3. Since the ATC Update and Transfer signals are not used they are shown simply as inputs to gating circuit 5004. Recalling from FIGS. 14 and 15 that the TAP's ShiftDR output is high during the ShiftDR state, it is clear that a logic one asserted onto the ATC Capture signal will cause a logic low on the Shift-3 input of data register 3, causing scan cells 1404 in data register 3 to capture data.

Figure 34:
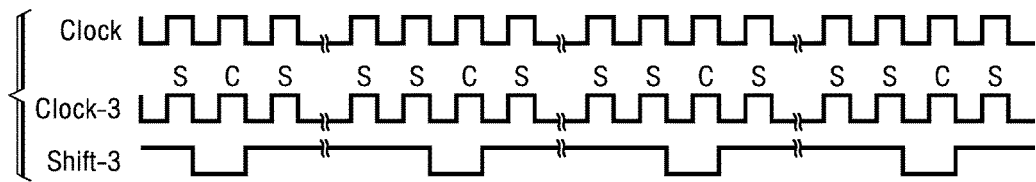
FIG. 34 illustrates a second WSP data register 3 timing diagram.
Figure 35:
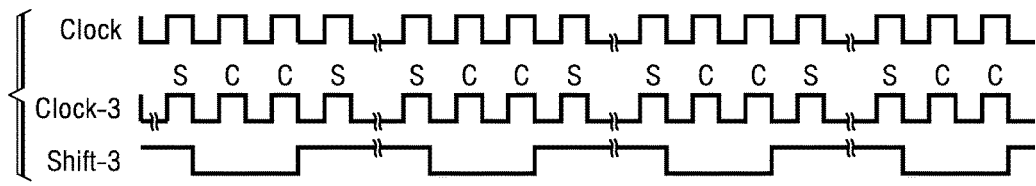
FIG. 35 illustrates a third WSP data register 3 timing diagram.
Figure 36:
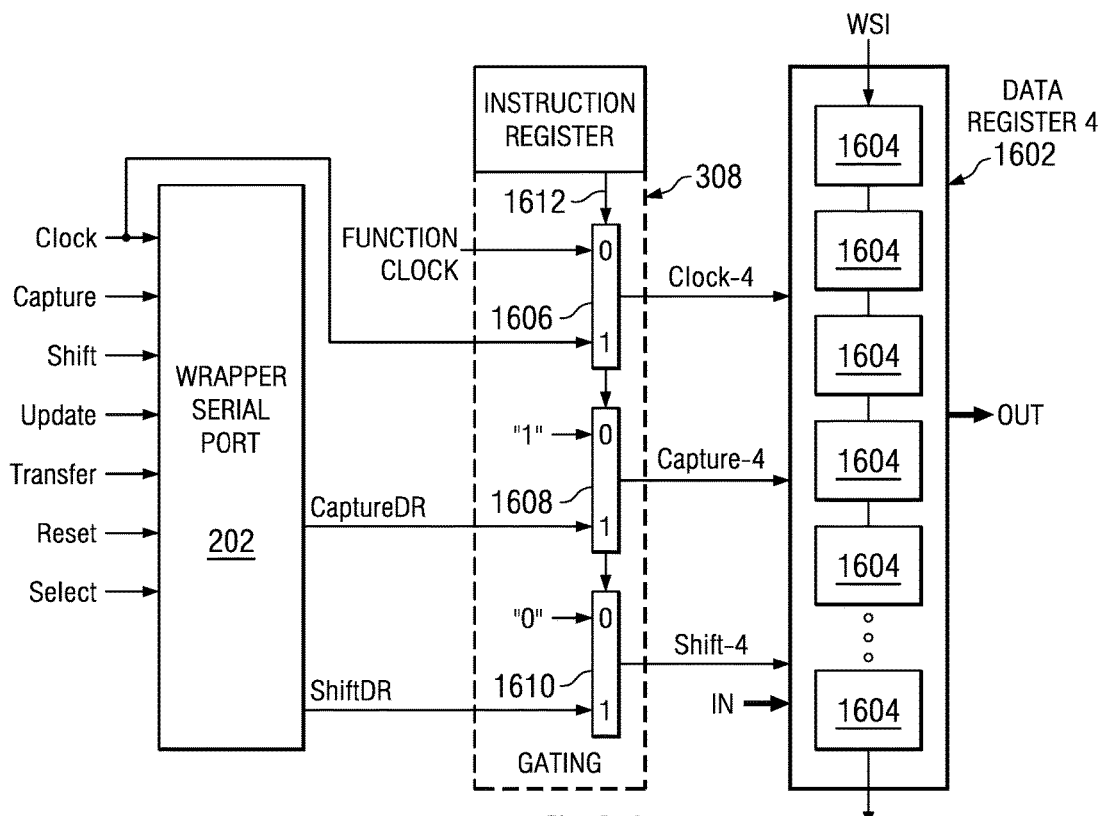
FIGS. 36 and 36A illustrate a WSP accessing data register 4.
Figure 36A:
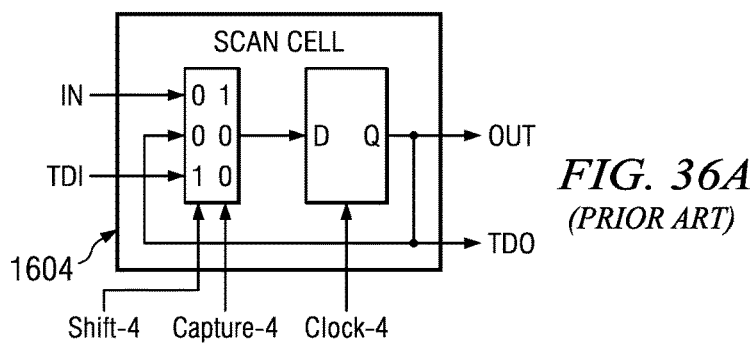
Figure 37:
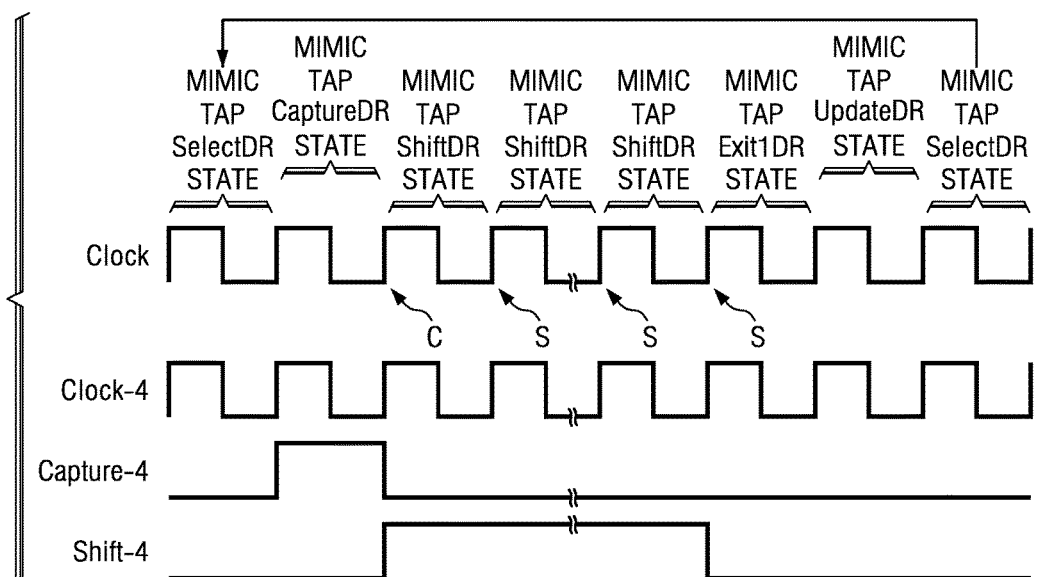
FIG. 37 illustrates a first WSP data register 4 timing diagram.
Figure 57:
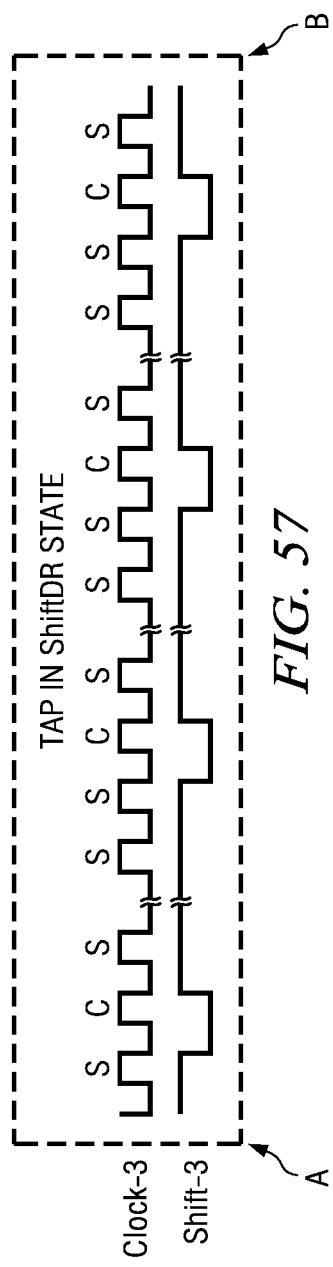
FIG. 57 illustrates a first data register 3 timing diagram of the second embodiment.
Figure 58:
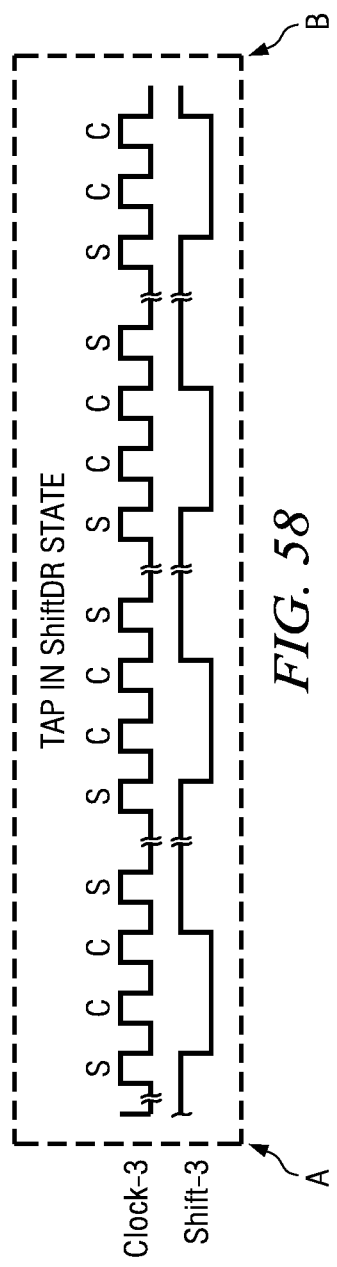
FIG. 58 illustrates a second data register 3 timing diagram of the second embodiment.

FIGS. 57 and 58 illustrate timing examples of the second embodiment whereby the ATC Capture signal of FIG. 56 is activated during A-B time frames while the TAP is in the ShiftDR state to duplicate the tightly timed WSP capture and shift operations of FIGS. 34 and 35. Clock-3 runs continuously with the ClockDR output from the TAP during the ShiftDR state.

Figure 16:
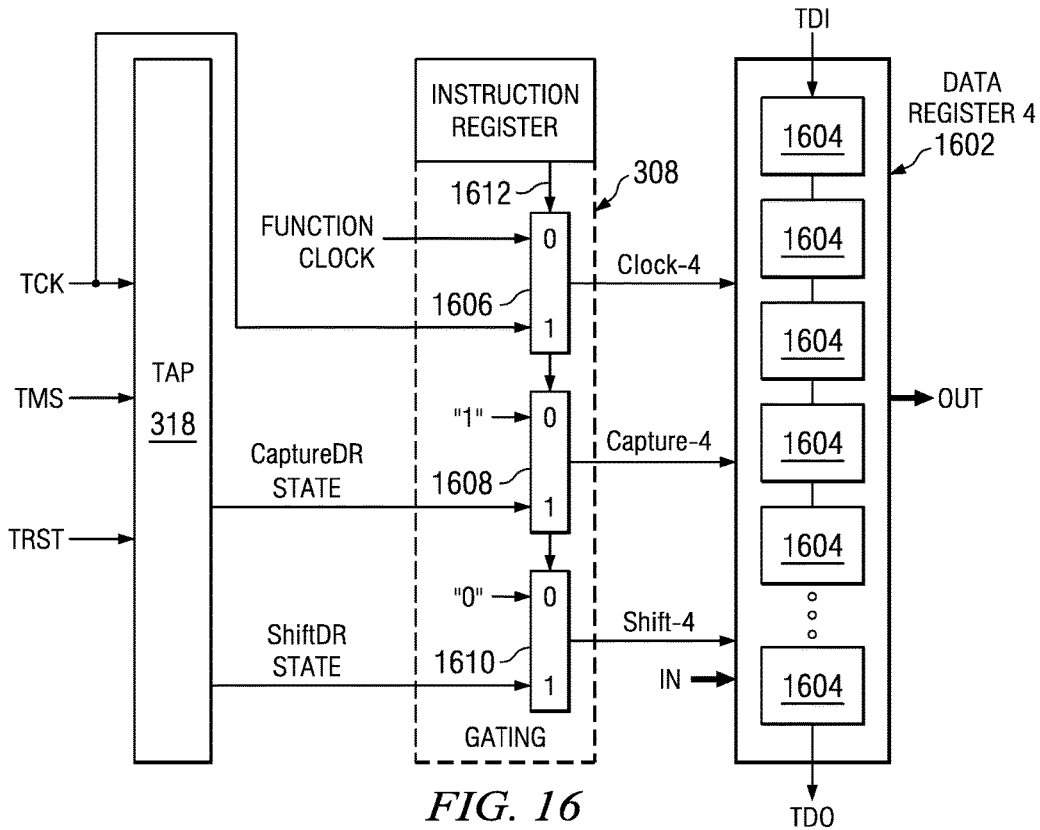
FIGS. 16 and 16A illustrate an IEEE 1149.1 data register 4 design style.
Figure 16A:
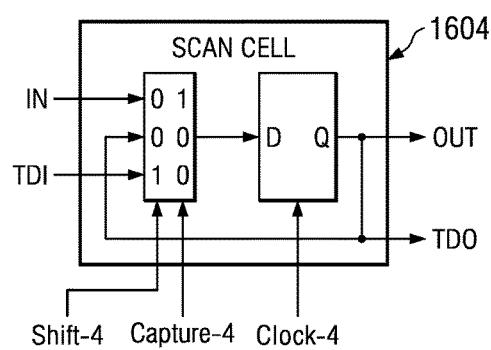
Figures 59, 59A:
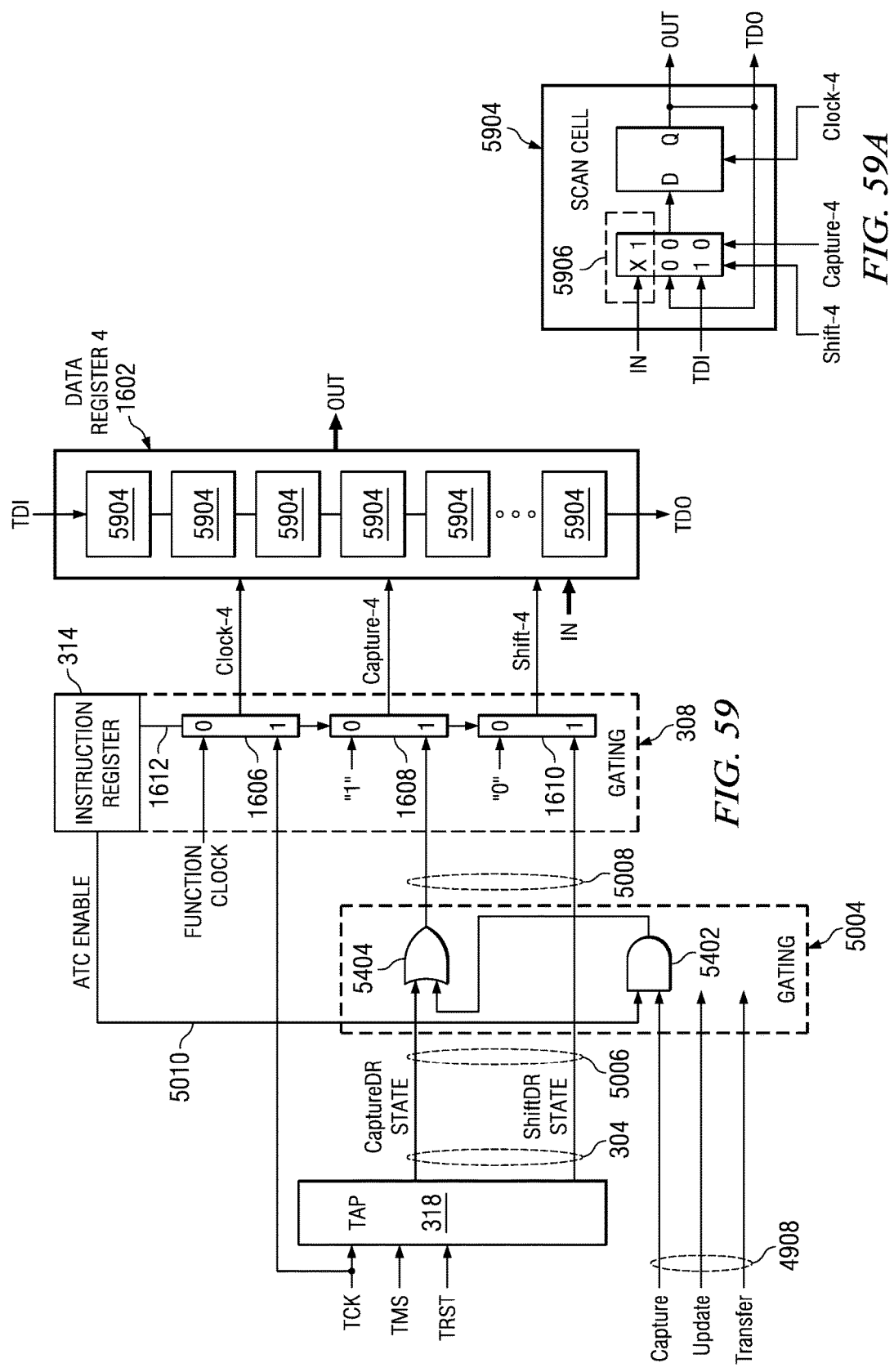
FIGS. 59 and 59A illustrate the second embodiment accessing data register 4.

FIG. 59 illustrates the data register 4 example of FIG. 16 adapted to include the gating circuit 5004 and ATC bus 4908. The scan cells 5904 in data register 4 are shown modified from the scan cells 1604 of FIG. 16 to the extent that the input multiplexer 5906 is changed to cause a capture operation to occur whenever the Capture-4 input goes high. This is required since the Shift-4 input remains high by the TAP remaining in the ShiftDR state when testing according to the second embodiment. As seen, gating circuit 5004 inputs, on bus 5006, the CaptureDR state signal from TAP bus 304, the ATC bus signals 4908, and the ATC enable signal 5010 from instruction register 314. The gating circuit 5004 outputs, on bus 5008, gated versions of the CaptureDR state signal to gating circuit 308.

Figure 17:
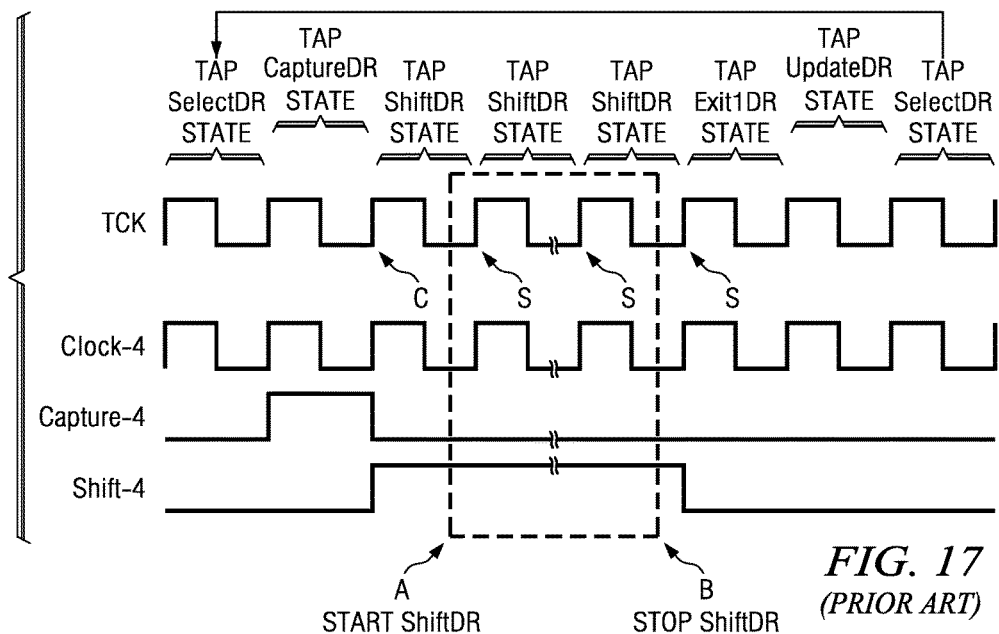
FIG. 17 illustrates a TAP data register 4 timing diagram.
Figure 18:
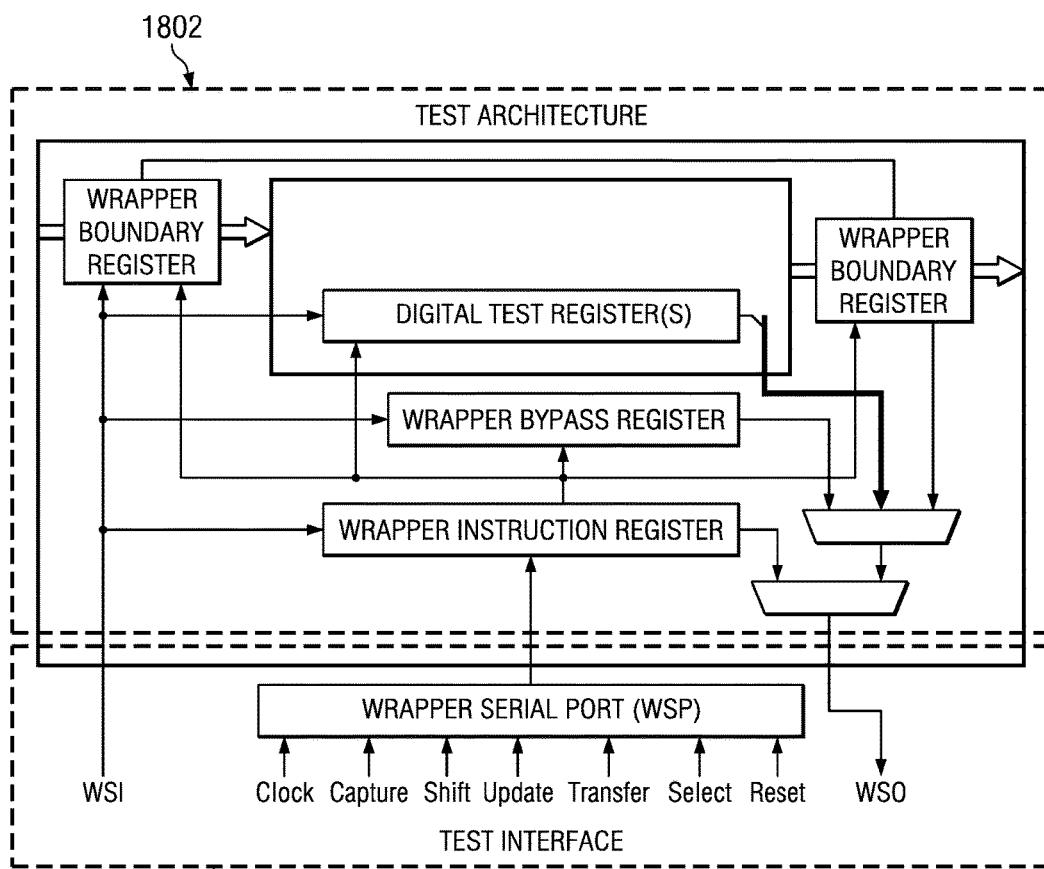
FIG. 18 illustrates IEEE standard P1500.
Figure 19:
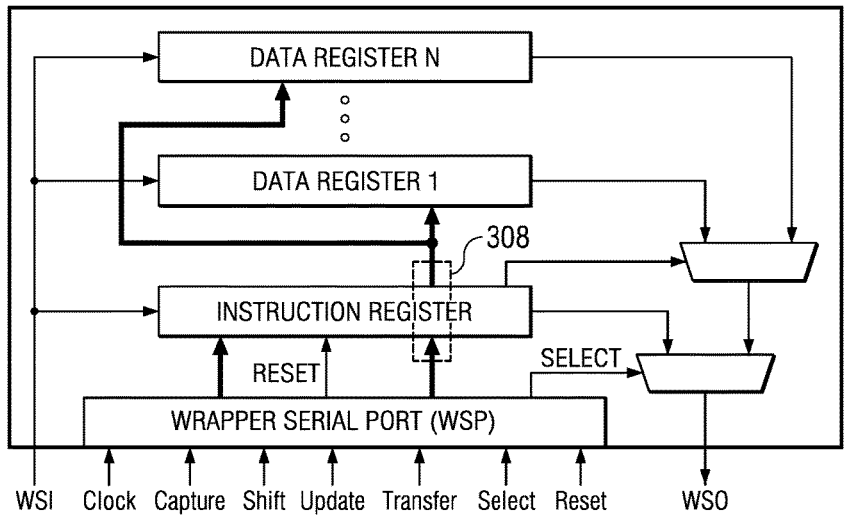
FIG. 19 illustrates a simplified view of IEEE standard P1500.

If the TAP is to control scan operations to data register 4, as previously described in FIGS. 16 and 17, the ATC enable signal 5010 will be set low to disable the ATC bus signals 4908 from effecting the TAP's mode of operation. However, if data register 4 is to be controlled using the mode of operation of the second embodiment the ATC enable signal 5010 will be set high by an instruction scanned into the instruction register to enable the ATC bus signals.

When the ATC enable signal 5010 is high, gates 5402 and 5404 of gating circuit 5004 are enabled to allow the ATC Capture signal to directly control the Capture-4 input of data register 4. Recalling from FIGS. 16 and 17 that the TAP's CaptureDR state signal is low during the ShiftDR state, it is clear that a logic one asserted onto the ATC Capture signal will cause a logic one on the Capture-4 input of data register 4, causing scan cells 5904 in data register 4 to capture data.

Figure 38:
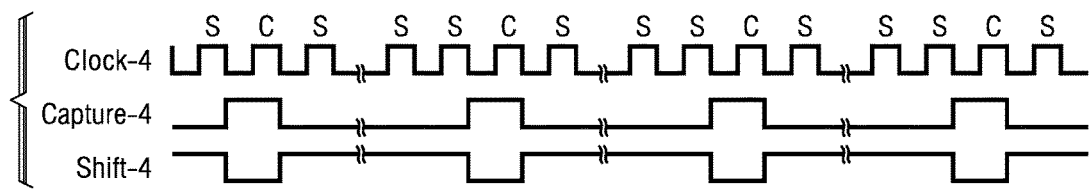
FIG. 38 illustrates a second WSP data register 4 timing diagram.
Figure 39:
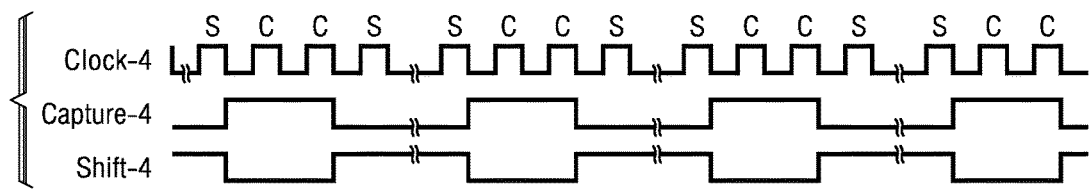
FIG. 39 illustrates a third WSP data register 4 timing diagram.
Figure 60:
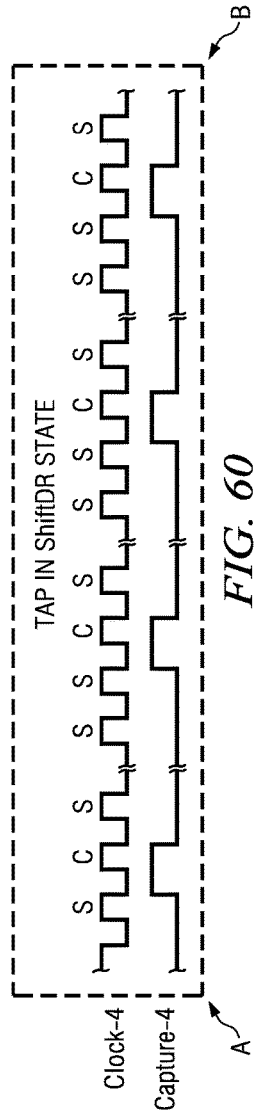
FIG. 60 illustrates a first data register 4 timing diagram of the second embodiment.
Figure 61:
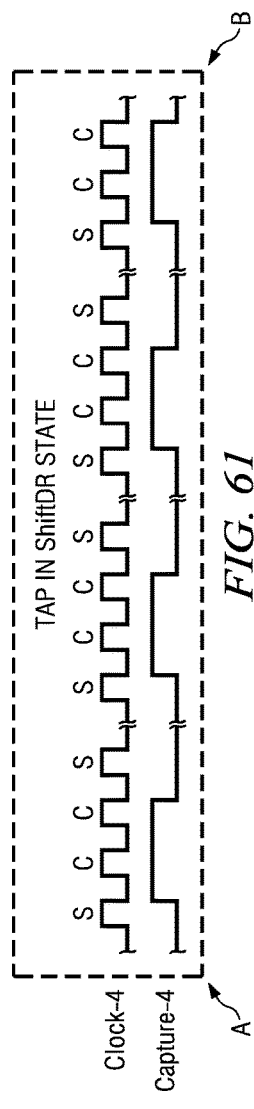
FIG. 61 illustrates a second data register 4 timing diagram of the second embodiment.

FIGS. 60 and 61 illustrate timing examples of the second embodiment whereby the ATC Capture signal of FIG. 59 is activated during A-B time frames while the TAP is in the ShiftDR state to duplicate the tightly timed WSP capture and shift operations of FIGS. 38 and 39. While not shown, the Shift-4 signal is high during the A-B time frame since the TAP is in the ShiftDR state. Clock-4 runs continuously with the TCK during the test.

Figures 62, 62A:
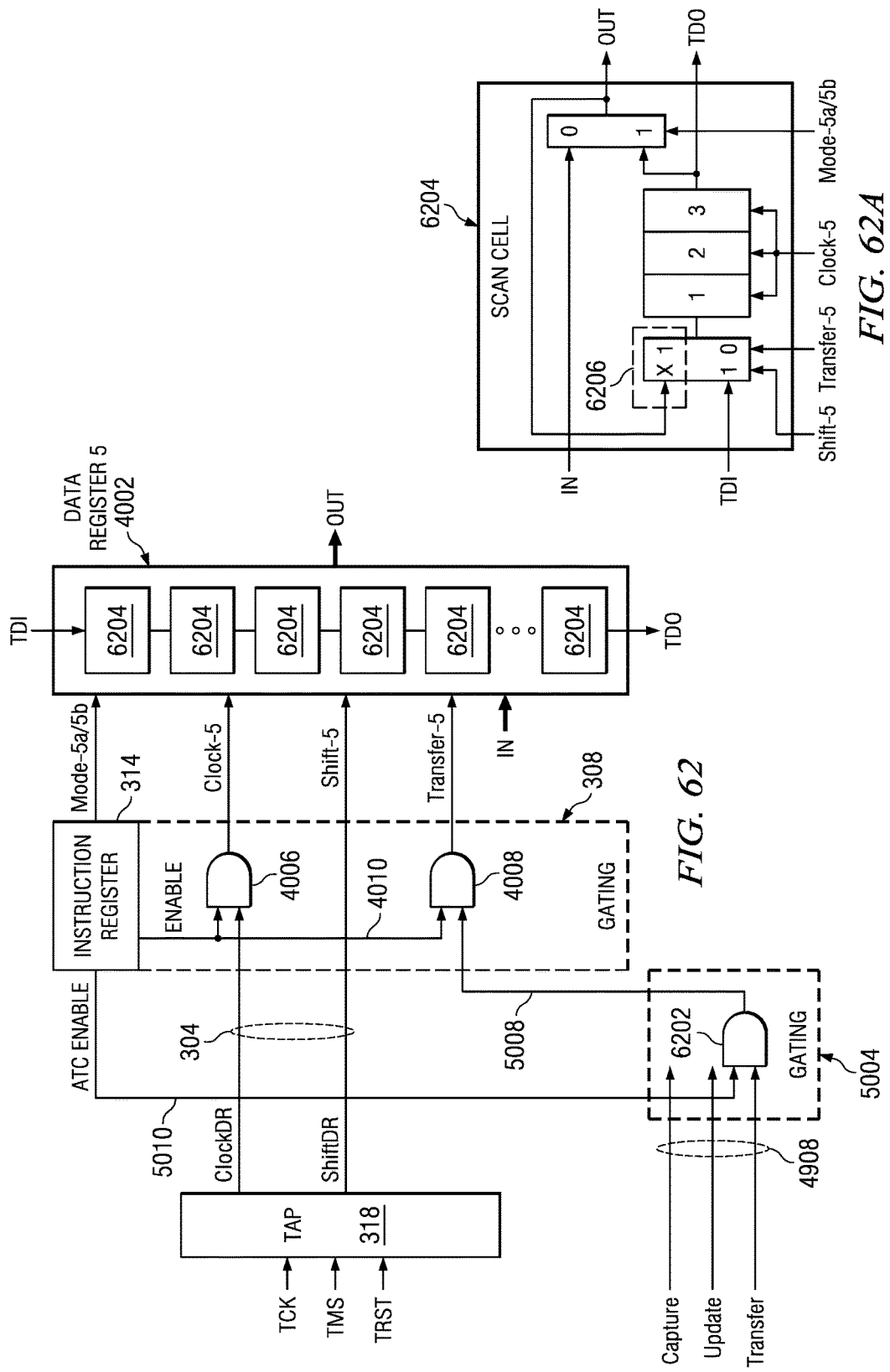
FIGS. 62 and 62A illustrate the second embodiment accessing data register 5.

FIG. 62 illustrates the data register 5 example of FIG. 40 adapted to include TAP 318 in place of WSP 202, the gating circuit 5004, and ATC bus 4908. As seen, gating circuit 5004 inputs the ATC bus signals 4908 and the ATC enable signal 5010 from instruction register 314. Since TAP 318 does not have an equivalent transfer signal to be gated with the ATC Transfer signal, no input bus 5006 is required. The gating circuit 5004 outputs, on bus 5008, a Transfer signal to gating circuit 308.

When the ATC enable signal 5010 is set high by an instruction in instruction register 314, gate 6202 of gating circuit 5004 is enabled to allow the ATC Transfer signal to directly control the Transfer-5 input of data register 5. Since the ATC Capture and Update signals are not used they are shown simply as inputs to gating circuit 5004. During the transfer test mode, the TAP is placed in the ShiftDR state to enable the ClockDR output to drive the Clock-5 input and to set the ShiftDR output high to set the Shift-5 input high. While the TAP is in the ShiftDR state, the ATC Transfer signal can be manipulated to cause data register 5 to perform shift (S) and transfer (T) operations as shown in timing diagram of FIG. 63.

The TAP and ATC Transfer signal can therefore duplicate the WSP transfer test mode operation and timing shown in FIGS. 41-45. As previously mentioned in regard to FIG. 48, the data register 5 transfer cells 6204 of FIG. 62 are modified from the data register 5 transfer cells 4004 to the extent that the input multiplexer 6206 selects transfer operations (T) whenever the Transfer-5 input is high, independent of the state of the Shift-5 input.

Figure 64:
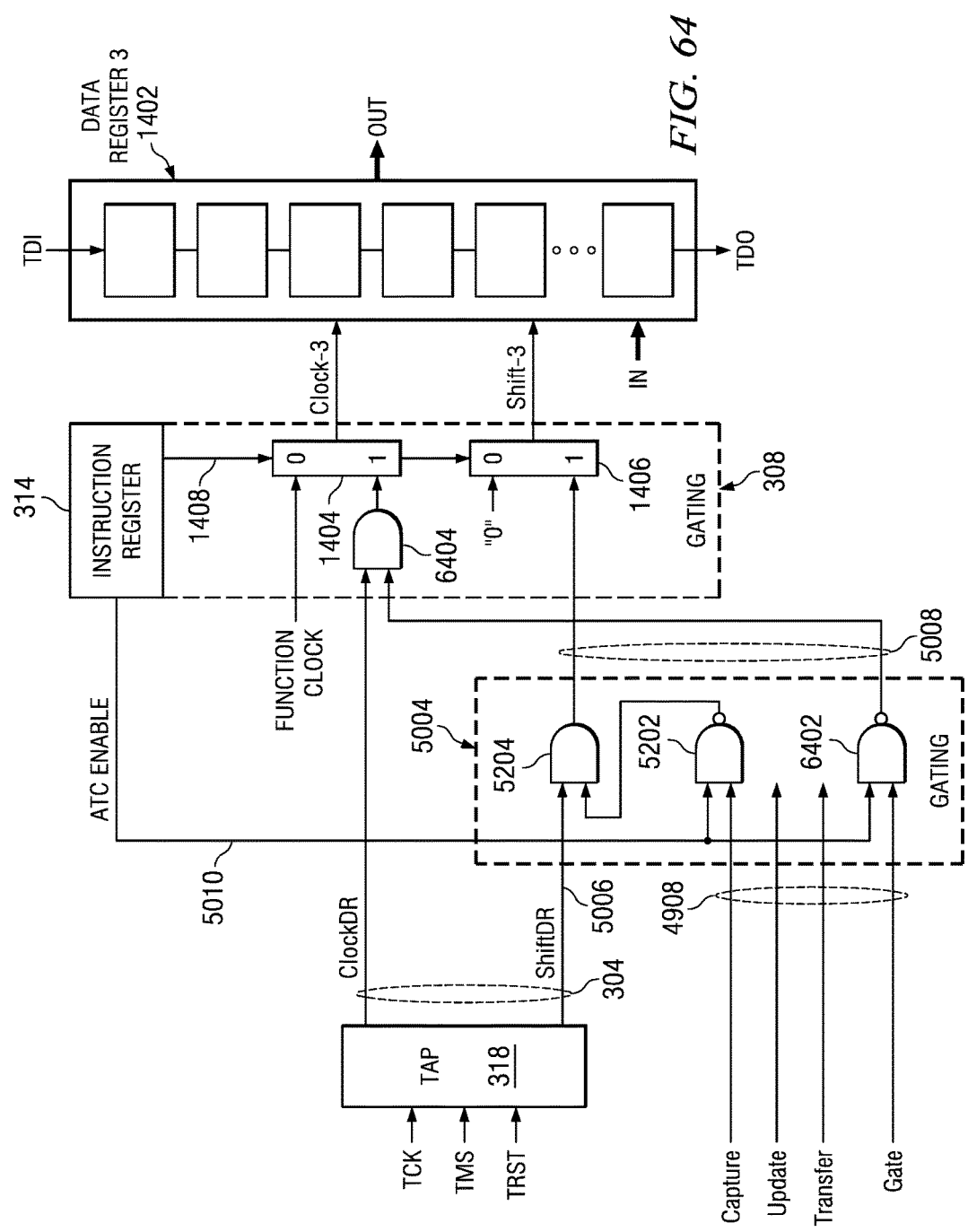
FIG. 64 illustrates the use of a clock gating signal by the second embodiment.

FIG. 64 illustrates that the ATC bus 4908 may include additional signals in addition to the Capture, Update, and Transfer that may be required for controlling a data register during test. FIG. 64 is the same as the previously described FIG. 56 with the exceptions that (1) the ATC bus includes a Gate signal, (2) gating circuit 5004 includes a gate 6402, and (3) gating circuit 308 includes a gate 6404. When ATC enable signal 5010 is set high, data register 3 can be accessed and operated as described in FIGS. 56, 57, and 58.

If during the operating it is desired to disable ClockDR from driving the Clock-3 input of data register 3, the ATC Gate signal is set high which causes gate 6402 to force the output of gate 6404 low. As seen in the timing diagram of FIG. 65 all capture and shift operations of data register 3 are suspended while the ATC Gate input is high. While simply turning off the TAP's TCK could be used to do the same thing, the following example illustrates a test situation where it is required to keep the TCK running to clock one data register while using the ATC Gate input to gate off clocking of another data register.

Figure 66A:
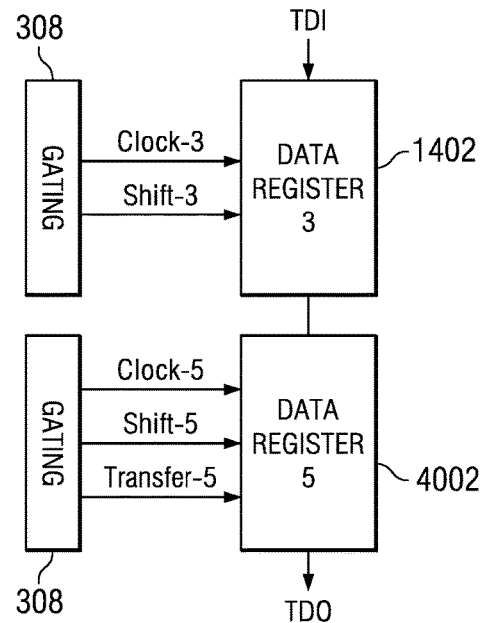
FIG. 66A illustrates data registers 3 and 5 placed in series between TDI and TDO.

FIG. 66A illustrates a configuration where data register 3 (1402) of FIG. 64 is placed in series with data register 5 (4002) of FIG. 62 between TDI and TDO. Gating circuit 308 of FIG. 64 is shown providing Clock-3 and Shift-3 input to data register 3 (1402) and gating circuit 308 of FIG. 62 is shown providing Clock-5, Shift-5, and Transfer-5 input to data register 5 (4002). Both data registers are operated while the TAP is in the ShiftDR state according to the second embodiment as previously described.

Figure 66B:
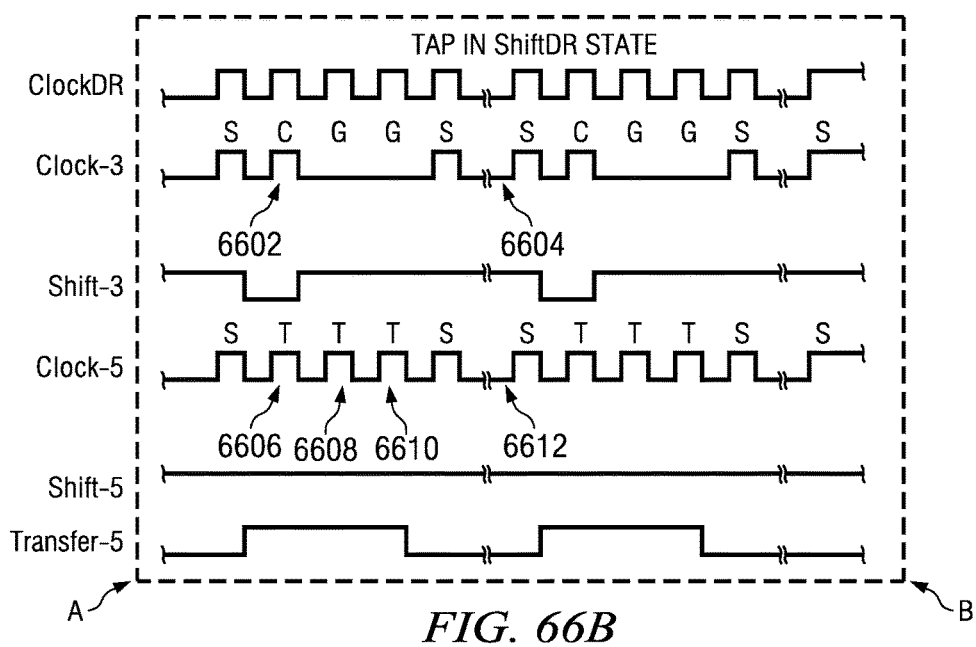
FIG. 66B illustrates a timing diagram using the gating signal of the second embodiment.

In the timing diagram of FIG. 66B is it seen that data register 3 operates to do a single capture (C) operation 6602 followed by a sequence of shift (S) operations 6604 while data register 5 operates to do three transfer (T) operations 6606-6610 followed by a sequence of shift (S) operations 6612. To insure that only one capture (C) operation 6602 is performed by data register 3 and to insure that shifting (S) operations 6604 and 6612 of both registers are aligned and work properly from TDI to TDO, the ATC Gate input of FIG. 64 is set high to gate off the Clock-3 input to data register 3 during the second 6608 and third 6610 transfer (T) operations of data register 5. As can be seen, without the ATC Gate input it would not be possible to properly operate data registers 3 and 5 in their respective modes in the serial TDI to TDO arrangement of FIG. 66A.

Thus the importance of the ATC Gate input is that it allows for locally suspending clocking operations on one data register while continuing clocking operations on another data register. While an ATC Gate input is shown providing this local clock suspension for the gated data register 3 and 5 designs, other ATC input signal types could be provided to suspend data register operations based on synchronous data register designs that use scan cells with the ability to be placed in a holding state while being clocked, similar in nature to the scan cells 1204 and 1604 of FIGS. 12 and 16 respectively.

Figure 67:
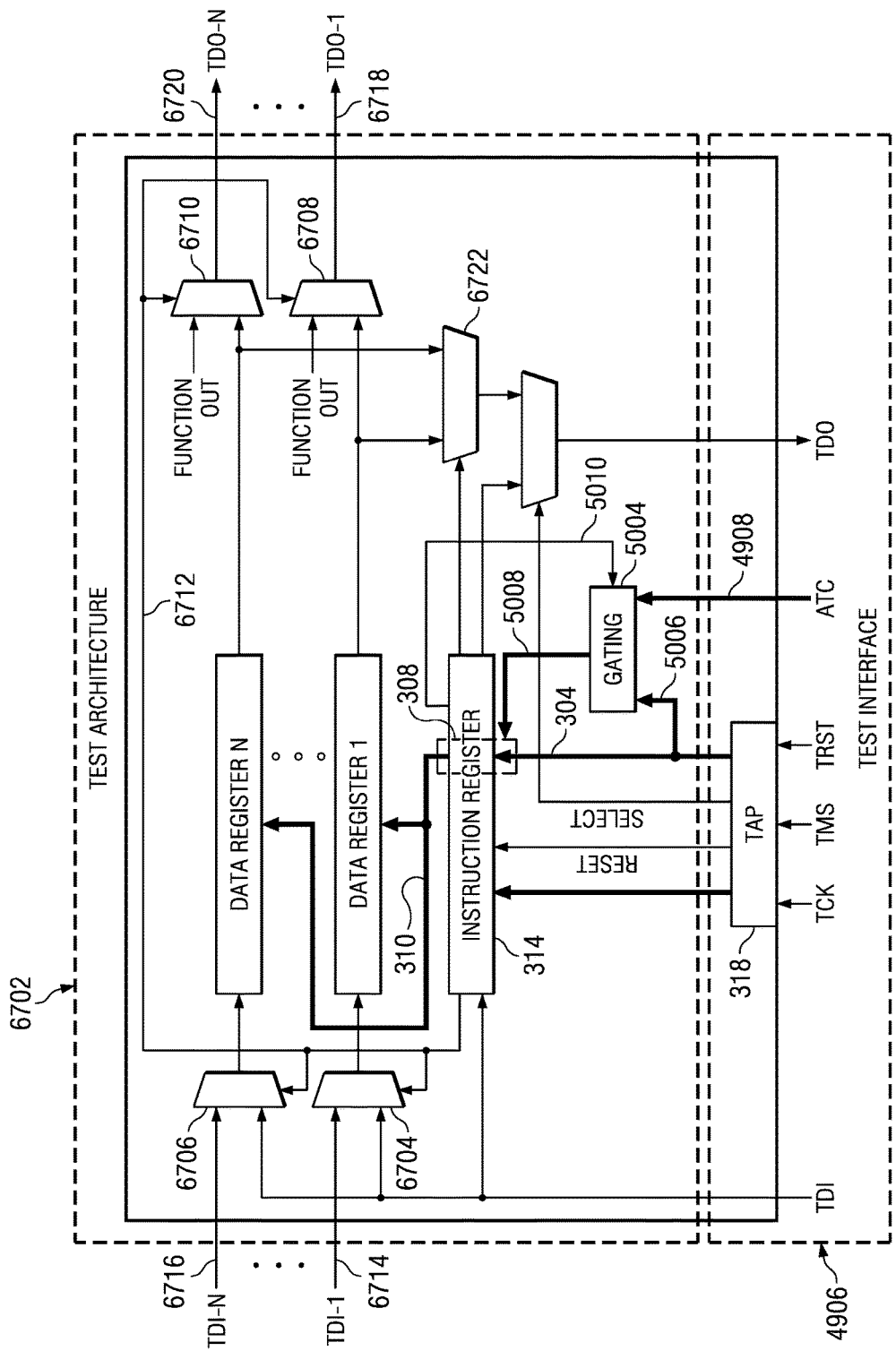
FIG. 67 illustrates a parallel data register access architecture of the second embodiment.

FIG. 67 illustrates the test interface 4906 of the second embodiment used in combination with an architecture 6702 of the second embodiment. The architecture 6702 is the same as architecture 4904 of FIG. 50 with the exception that architecture 6702 is designed to provide parallel access to data registers 1-N, in addition to the previously described serial access of data registers 1-N. As seen, input multiplexers 6704-6706 have been placed on the serial data inputs of data registers 1-N to allow the serial data input of the data registers to be coupled to either the TDI input of test interface 4906 for serial access or to a separate TDI 1-N inputs 6714-6716 to the architecture for parallel access.

Also, the serial data outputs of data registers 1-N are input to output multiplexers 6708-6710 for parallel access, in addition to being input to the TDO multiplexer 6722 for serial access. The input and output multiplexers are controlled by a signal output 6712 from instruction register 314. Instructions loaded into the instruction register control the output value of signal 6712.

During non-test modes, the TDI1-N inputs and TDO1-N outputs may used as functional input and output signals, as indicated by functional outputs shown being input to the output multiplexers 6708-6710. During test modes, the TDI1-N inputs and TDO1-N outputs may be selected by signal 6712 to become parallel inputs to and parallel outputs from data registers 1-N. Thus the architecture 6702 may operate to access a single data register between TDI and TDO of test interface 4906 as previously described, or it may operate to access a parallel set of data registers between TDI1-N and TDO1-N.

If parallel TDI1-N to TDO1-N access of a set of data registers is selected, the operation can be controlled by the TAP alone or by the TAP in combination with the ATC bus signals 4908. Thus all the flexible and tightly timed capture, shift, update, and/or transfer operations previously described in regard to single data registers being accessed between TDI to TDO are possible when parallel data registers are being accessed between TDI1-N and TDO1-N.

Figure 68A:
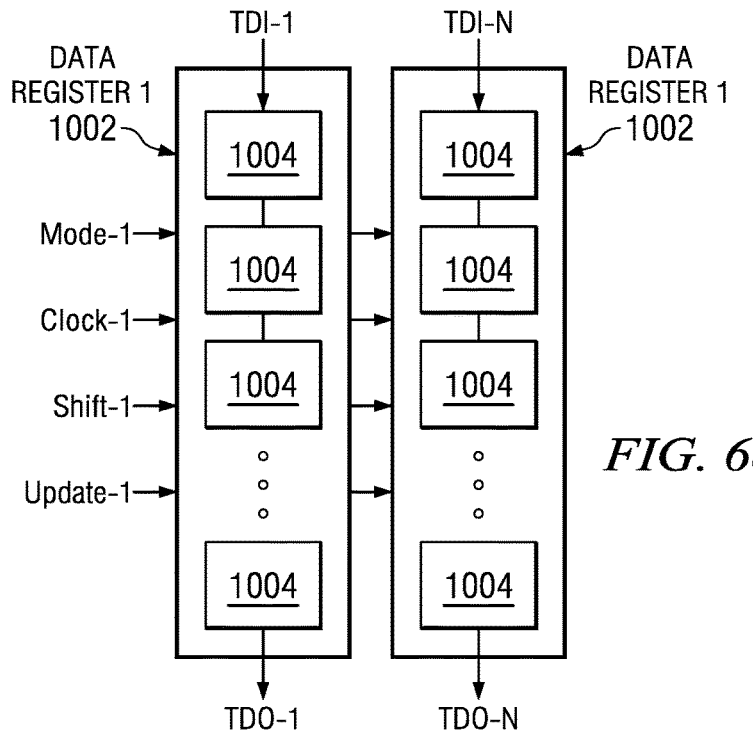
FIG. 68A illustrates access to parallel data registers 1 by the second embodiment.
Figure 68B:
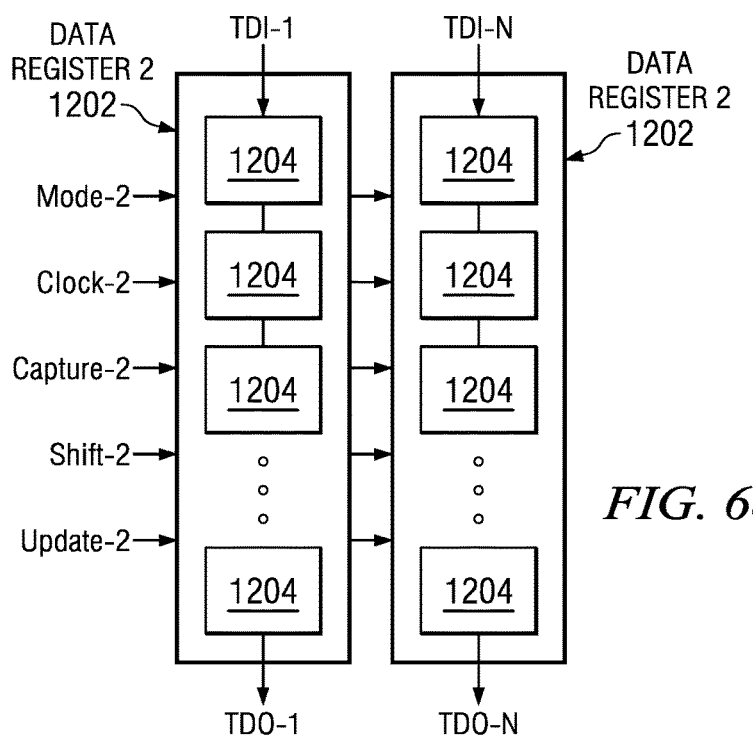
FIG. 68B illustrates access to parallel data registers 2 by the second embodiment.
Figure 68C:
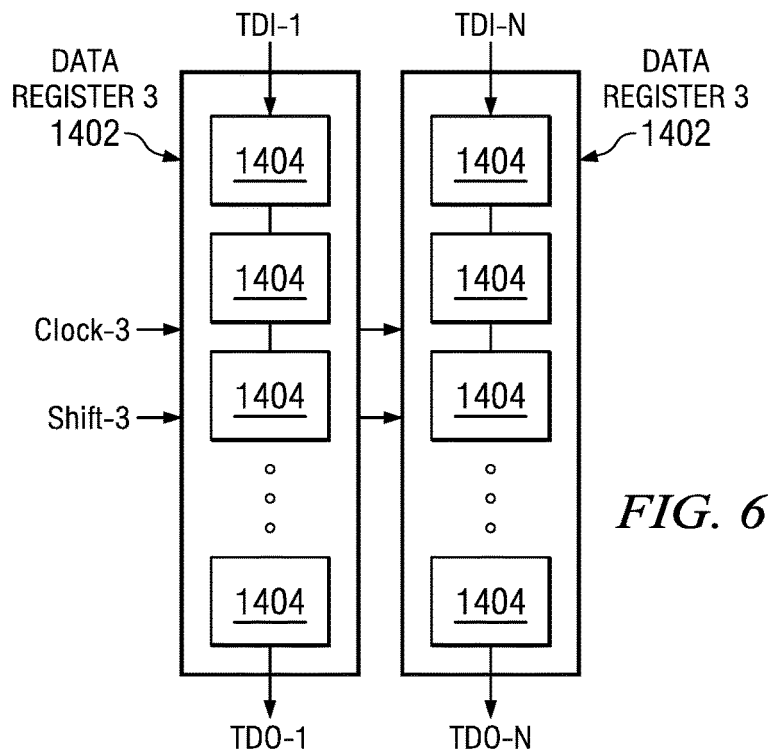
FIG. 68C illustrates access to parallel data registers 3 by the second embodiment.
Figure 68D:
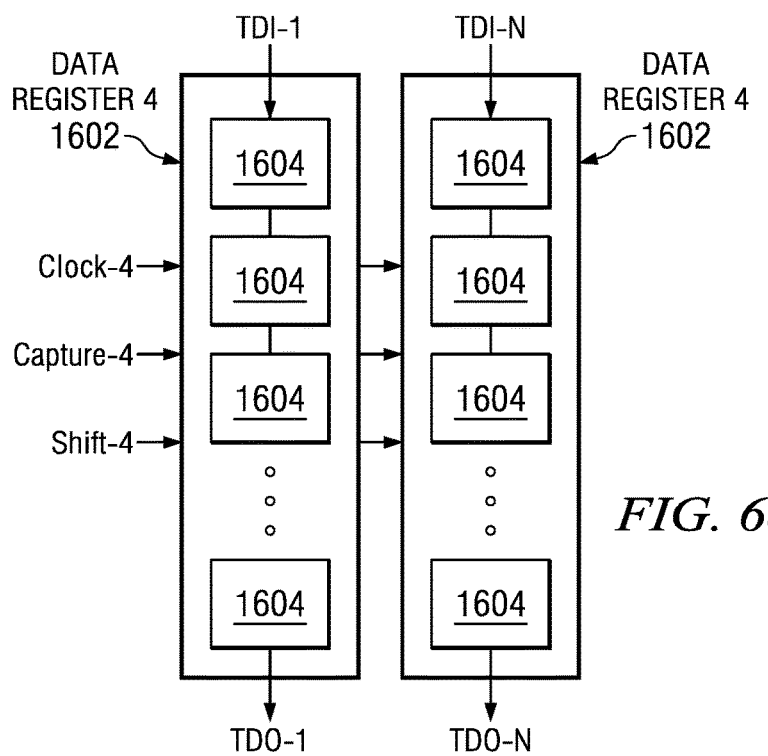
FIG. 68D illustrates access to parallel data registers 4 by the second embodiment.
Figure 68E:
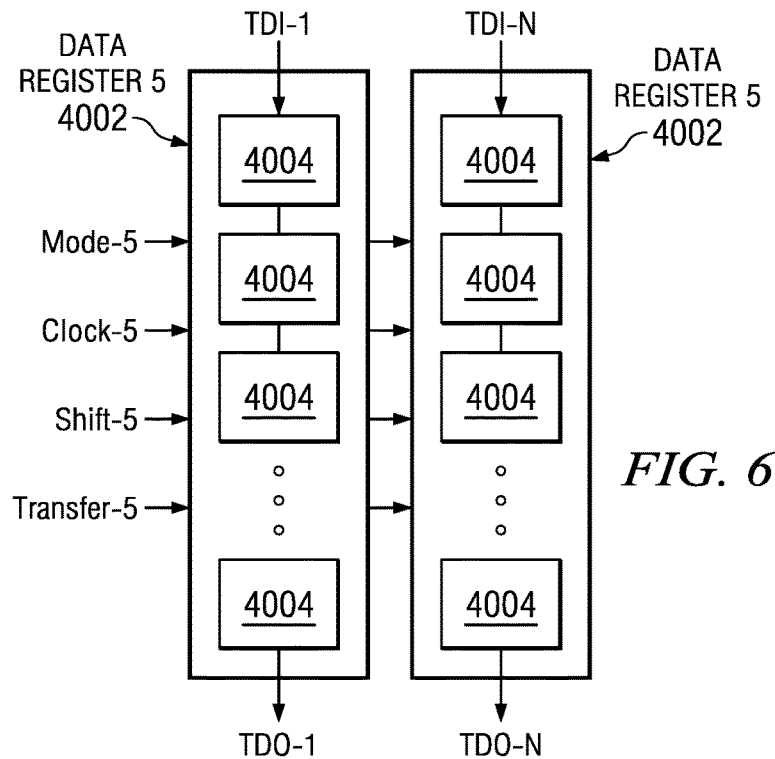
FIG. 68E illustrates access to parallel data registers 5 by the second embodiment.
Figure 68F:
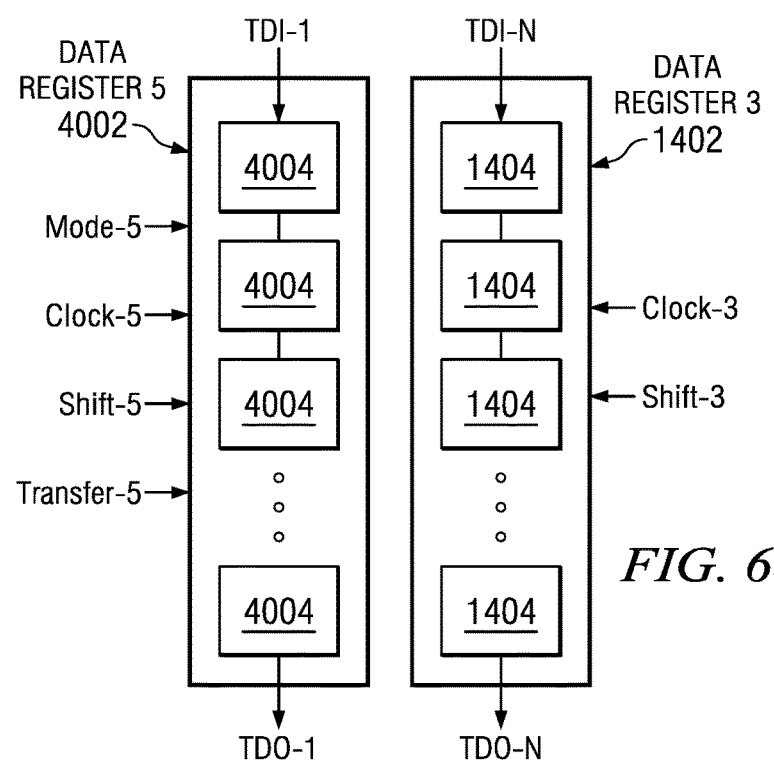
FIG. 68F illustrates access to parallel data registers 3 and 5 by the second embodiment.

FIGS. 68A-68E illustrate examples of parallel access of same type data registers 1 of FIG. 52, 2 of FIG. 54, 3 of FIG. 56, 4 or FIGS. 59, and 5 of FIG. 62 between TDI1-N and TDO1-N. FIG. 68F illustrates parallel access of different type data registers 3 of FIG. 56 and 5 of FIG. 62 between TDI1-N and TDO1-N. If alignment of the capture, transfer, and shifting operations of differing parallel data registers 3 and 5 is desired, the ATC Gate signal can be used as previously described in the examples of FIGS. 66A and 66B.

The following FIGS. 69-82 are provided to illustrate various configurations of connecting core circuits residing in an IC that include the TAP+ATC test domains of the second embodiment (i.e. the TAP+ATC test interface and architectures of FIGS. 50 and 67). Also shown is configuration examples of mixtures of core circuits that use the standard TAP test domain (i.e. the TAP test interface and architecture of FIG. 1) and core circuits that use the TAP+ATC test domains of the second embodiment. In the configurations showing a mixture of TAP domains and TAP+ATC domains, it is important to notice the test compatibility between these domains.

Figure 69:
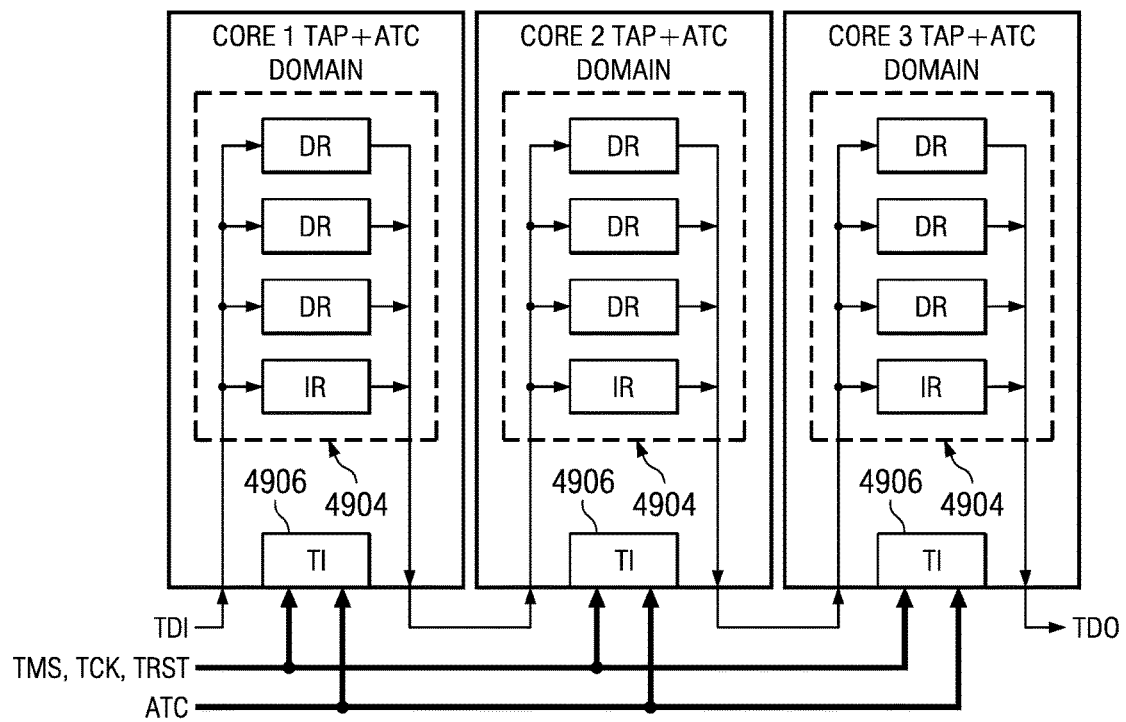
FIG. 69 illustrates a first test configuration according to the second embodiment.

FIG. 69 illustrates an example configuration of three core circuits in an IC, each having a TAP+ATC domain consisting of test interface 4906 and architecture 4904 of FIG. 50 of the second embodiment. The core TAP+ATC domains are serially connected in a serial path between TDI and TDO to allow all TAP+ATC domains to be serially accessed at the same time for loading instruction and data. The core TAP+ATC domains may operate in the standard TAP domain (FIG. 1) mode to achieve testing according to the IEEE 1149.1 and other mentioned sister standards, or in the TAP+ATC mode to achieve testing according the second embodiment.

As previously mentioned and described, the TAP+ATC domains can duplicate all the flexible and tightly timed test operations of the IEEE P1500 standard. Thus the core circuits do not need to include the separate IEEE P1500 standard comprising the WSP 202 and architecture 4610 of FIG. 46.

Figure 70:
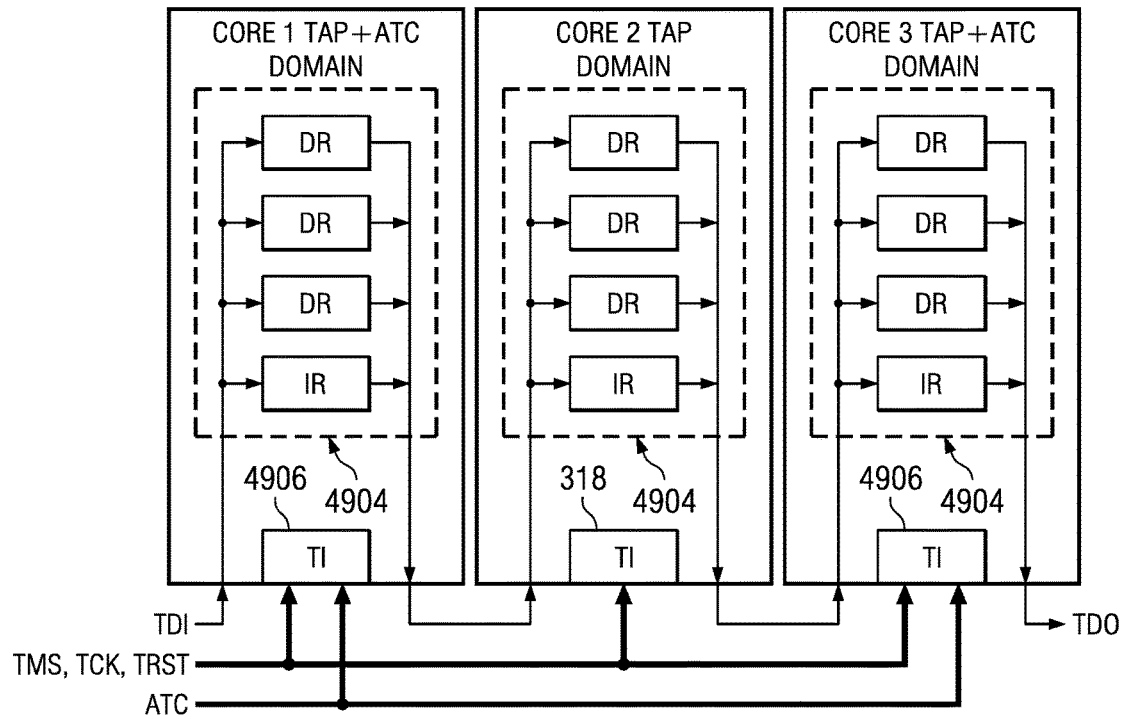
FIG. 70 illustrates a second test configuration according to the second embodiment.

FIG. 70 illustrates an example configuration of three core circuits in an IC. Core circuits 1 and 3 have TAP+ATC domains consisting of the test interface 4906 and architecture 4904 of FIG. 49 of the second embodiment. Core circuit 2 has the IEEE 1149.1 standard TAP domain consisting of test interface 104 and architecture 102 of FIG. 1. The core TAP and TAP+ATC domains are serially connected in a serial path between TDI and TDO to allow all domains to be serially accessed at the same time for loading instruction and data. All cores can operate in the standard TAP domain mode of FIG. 1 to achieve testing according to IEEE 1149.1.

Cores 1 and 3 can additionally operate in the TAP+ATC domain mode to achieve testing according to the second embodiment. Since testing according to the second embodiment occurs while the TAP is in the ShiftDR state, i.e. within the A-B time frames of FIGS. 53, 55, 57, 58, 60, 61, 63, 65, and 66B, the TAP domain of core 2 may participate with the TAP+ATC domain testing of cores 1 and 3 by simply shifting data through a selected data register during the ShiftDR state. During TAP+ATC testing of cores 1 and 3, the selected data register in the TAP domain of core 2 serves simply as shifting path connection between the selected data register output of core 1 and the selected data register input of core 3.

Since all the flexible and tightly timed capture, shift, update, and/or transfer operations occur by manipulation of the ATC bus inputs to cores 1 and 3, and while the TAPs of cores 1-3 are in the ShiftDR state, the presence of the data register of core 2 in the overall TDI to TDO serial path of the cores is transparent to the testing.

Figure 1:
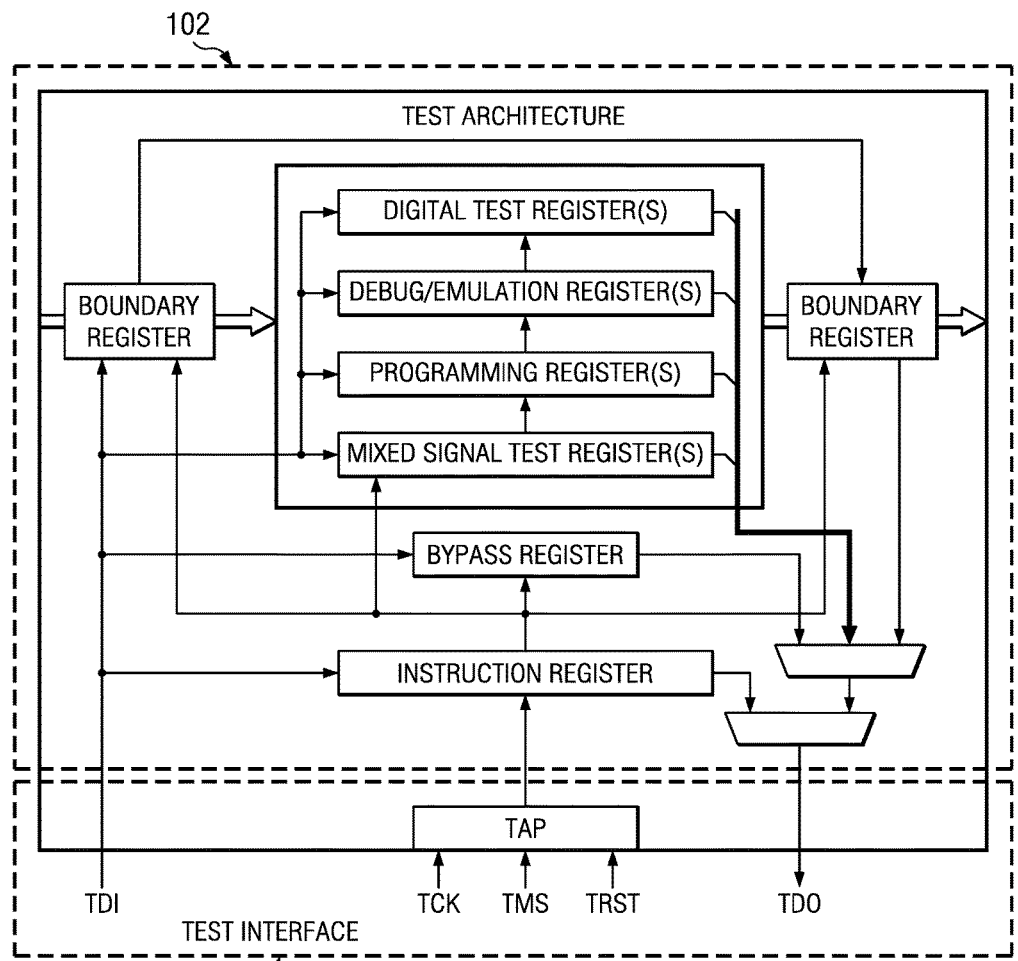
FIG. 1 illustrates IEEE standard 1149.1.
Figure 71:
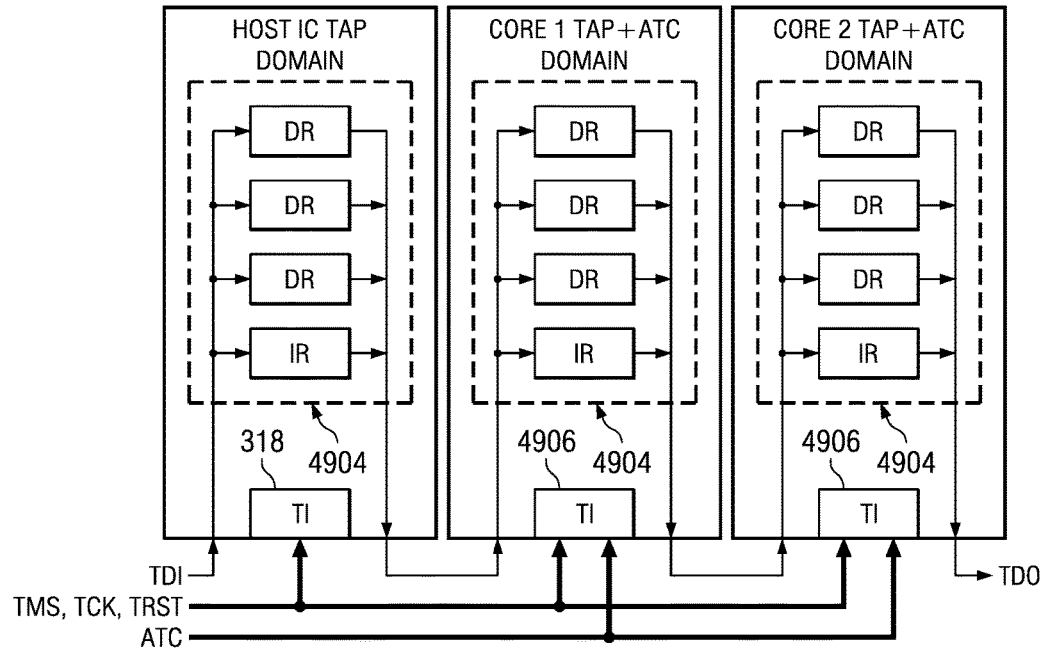
FIG. 71 illustrates a third test configuration according to the second embodiment.

FIG. 71 illustrates an example configuration of the TAP domain of FIG. 1 serially connected to two TAP+ATC domains of FIG. 50. The TAP domain is the host IC's IEEE 1149.1 standard TAP domain. The TAP+ATC domains reside in cores 1 and 2 within the host IC. The IC's TAP domain and core's TAP+ATC domains are serially connected in a serial path between TDI and TDO to allow all domains to be serially accessed at the same time for loading instruction and data. All domains can operate in the TAP domain mode to achieve testing according to IEEE 1149.1. The domains of cores 1 and 2 can additionally operate in the TAP+ATC domain mode to achieve testing according to the second embodiment.

Again, as in the FIG. 70 example, since testing according to the second embodiment occurs while the TAP is in the ShiftDR state, the host IC's TAP domain may participate with the TAP+ATC testing of cores 1 and 2 to the extent that it serves to shift data from TDI to the serial input of core 1 during the ShiftDR state while the ATC bus signals of cores 1 and 2 are manipulated to perform the flexible and tightly timed capture, shift, update, and/or transfer operations previously described.

Figure 72:
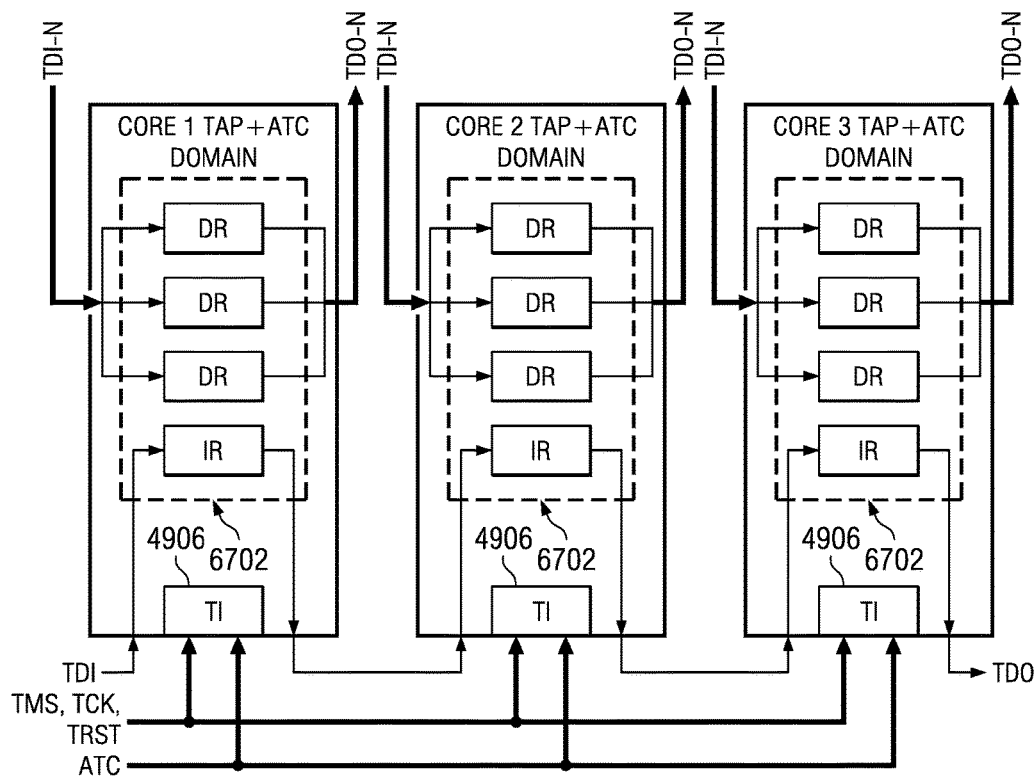
FIG. 72 illustrates a fourth test configuration according to the second embodiment.

FIG. 72 illustrates an example configuration of three core circuits in an IC, each having the TAP+ATC domain of FIG. 67 consisting of test interface 4906 and architecture 6702. The TAP+ATC domains are serially connected in a serial path between TDI and TDO to allow all domains to be serially accessed at the same time for loading instruction and data. As described in FIG. 67, the data registers of architecture 6702 can be accessed individually via the TDI to TDO serial path or in parallel using each domain's parallel TDI1-N inputs and parallel TDO1-N outputs.

In FIG. 72, instructions have been loaded into the instruction registers of each TAP+ATC domain to allow data registers to be accessed via the TDI1-N inputs and TDO1-N output of each core. Once so configured, any of the previously described flexible and tightly timed parallel test operations may be applied to each core using the TAP+ATC interfaces 4906. The TAP+ATC domains of each core 1-3 are also operable by instructions loaded into the instruction register to operate in the serial TDI to TDO test mode using either the serial TAP mode of operation of IEEE 1149.1 or the serial TAP+ATC mode of operation of the second embodiment.

Figure 73:
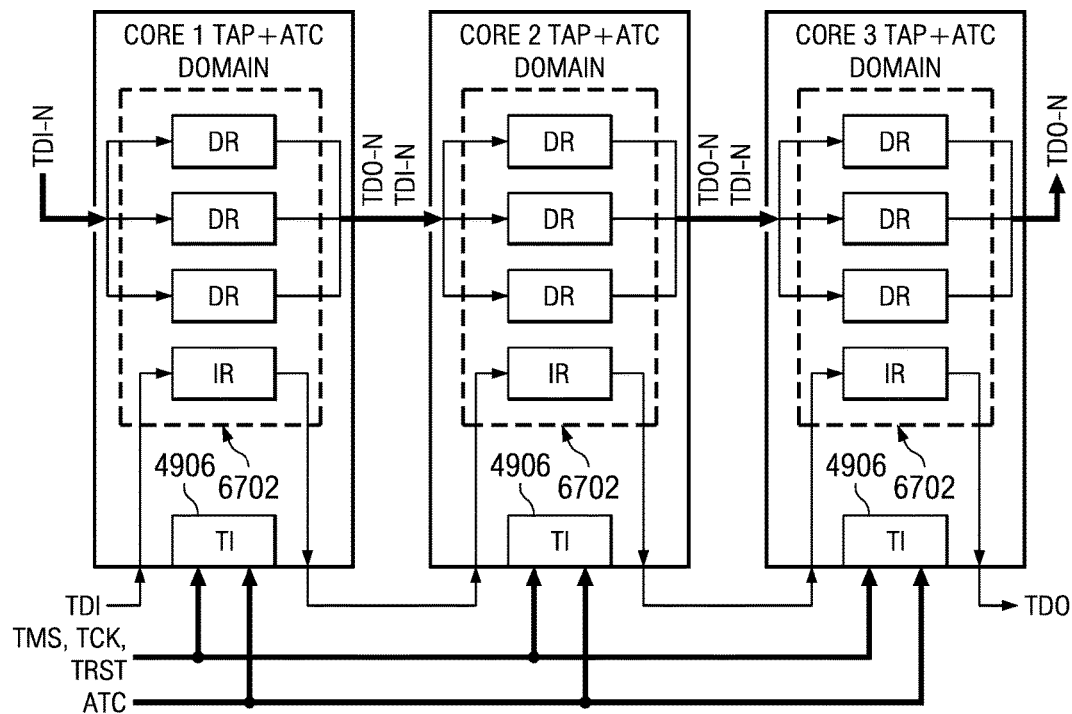
FIG. 73 illustrates a fifth test configuration according to the second embodiment.

FIG. 73 illustrates an alternate connection example of the three core circuits of FIG. 72 whereby the parallel TDI1-N inputs and TDO1-N outputs of each TAP+ATC domain are connected in series to form a serial connection from the TDI1-N input of the core 1 domain to the TDO1-N output of the core 3 domain. Again, any of the flexible and tightly timed test operations of the second embodiment may occur in each domain during an A-B time frame using the TAP+ATC interfaces 4906.

Figure 74:
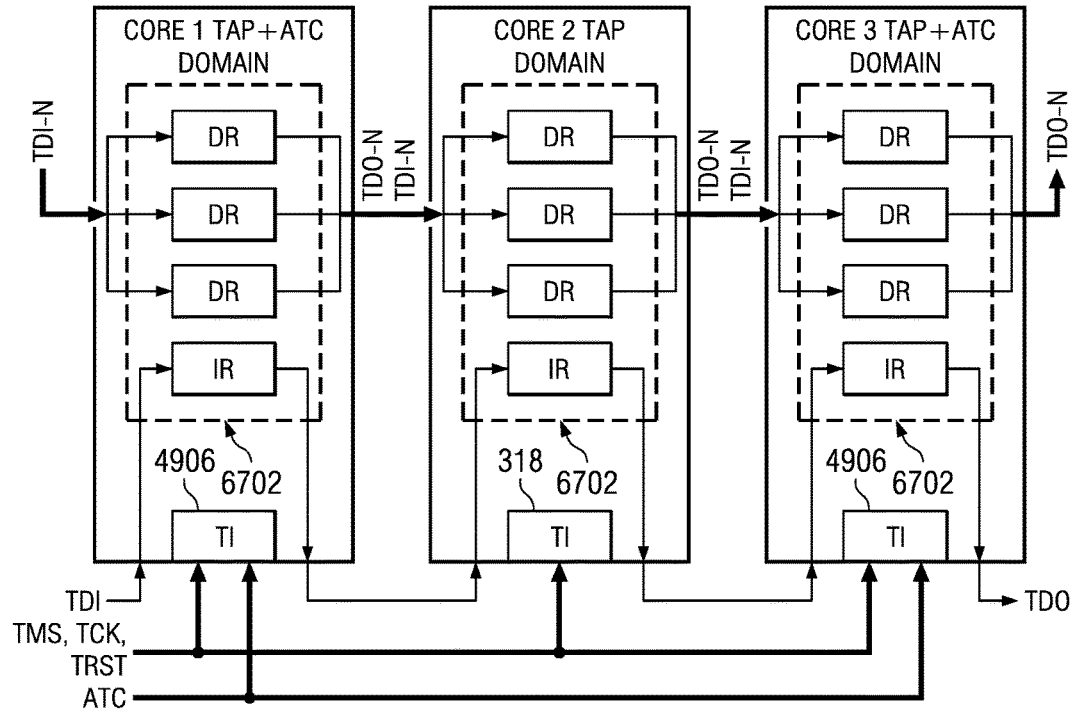
FIG. 74 illustrates a sixth test configuration according to the second embodiment.

FIG. 74 illustrates an example configuration of three core circuits in an IC. Core circuits 1 and 3 have TAP+ATC domains consisting of test interface 4906 and architecture 6702 of the second embodiment. Core circuit 2 has the IEEE 1149.1 standard TAP test interface 104 of FIG. 1, but the architecture 102 of FIG. 1 has been replaced in core 2 with the parallel TDI1-N input and TDO1-N output capable architecture 6702 of FIG. 67. The core TAP and TAP+ATC domains are serially connected in a serial path between TDI and TDO to allow all domains to be serially accessed at the same time for loading instruction and data.

Testing of the cores via the serial TDI to TDO path can occur using either the TAP or TAP+ATC modes described previously in regard to FIG. 70. Like FIG. 73, the TAP and TAP+ATC domains are also serially connected together via the parallel TDI1-N and TDO1-N bus. All cores can operate in the standard TAP domain mode using the parallel TDI1-N to TDO1-N bussing path. Cores 1 and 3 can additionally operate in the TAP+ATC domain mode using the parallel TDI1-N to TDO1-N bussing path of the second embodiment. Since testing according to the second embodiment occurs while the TAP is in the ShiftDR state, i.e. within the A-B time frame, the TAP domain of core 2 may participate with the TAP+ATC domain testing of cores 1 and 3 by simply shifting data through a selected set of data registers when testing occurs via the parallel TDI1-N to TDO1-N bussing path.

During TAP+ATC testing of cores 1 and 3, the selected data registers in the TAP domain of core 2 serve simply as shifting path connections between the selected data register outputs of core 1 and the selected data register inputs of core 3. Since all the flexible and tightly timed capture, shift, update, and/or transfer operations occur by manipulation of the ATC bus inputs to cores 1 and 3, and while the TAPs of cores 1-3 are in the ShiftDR state, the presence of the data registers of core 2 in the overall TDI1-N to TDO1-N bussing path of the cores is transparent to the testing.

Figure 75:
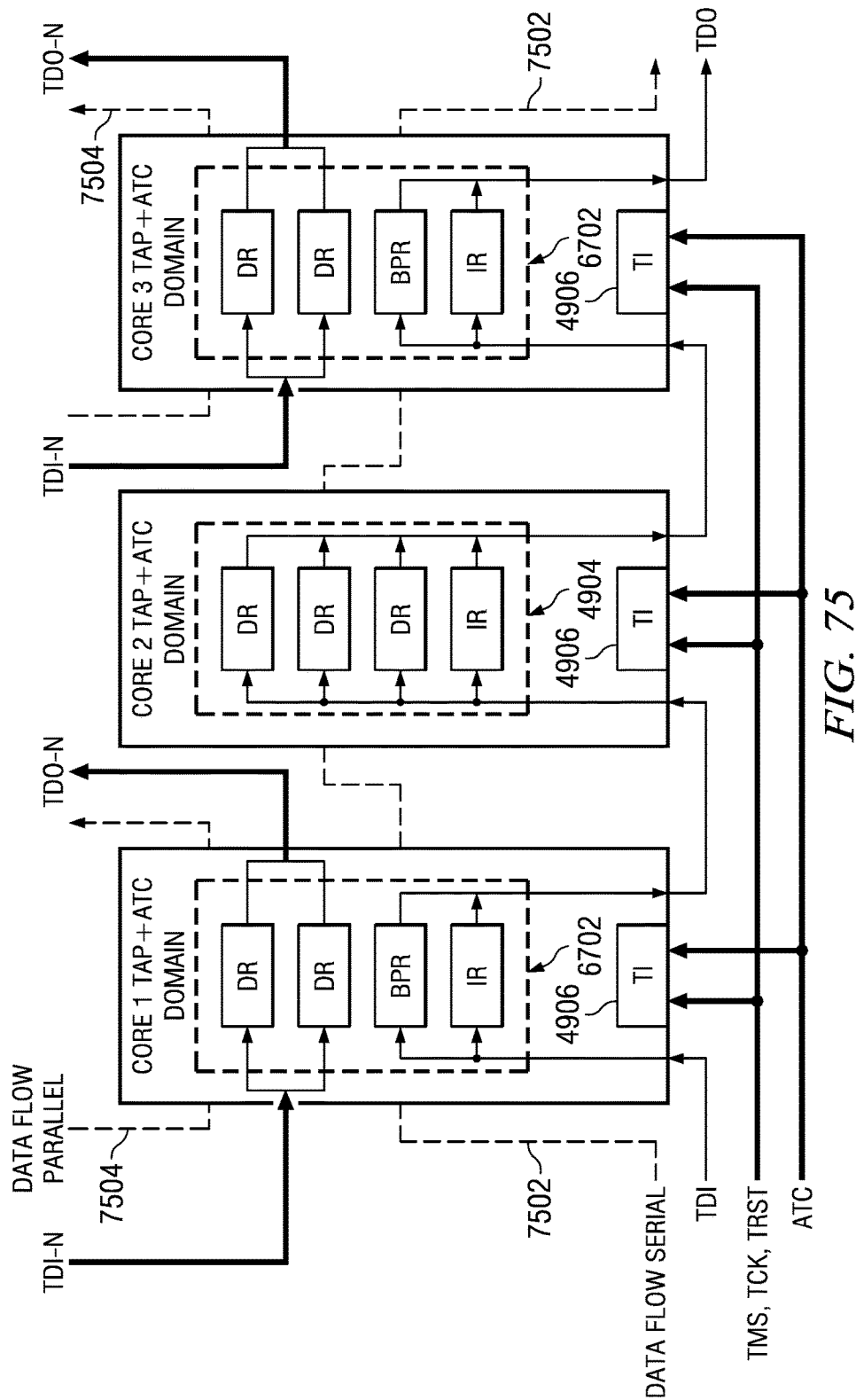
FIG. 75 illustrates a seventh test configuration according to the second embodiment.

FIG. 75 illustrates an example configuration of three core circuits in an IC. Cores 1 and 3 have TAP+ATC domains consisting of test interface 4906 and architecture 6702, and core 2 has a TAP+ATC domain consisting of test interface 4906 and architecture 4904. FIG. 75 is provided to indicate that it is possible to execute simultaneously both a parallel test via TDI1-N to TDO1-N on cores 1 and/or 3 and a serial test via TDI to TDO on core 2. The data flow path of the parallel test is indicated by dotted line 7504 and the data flow path of the serial test is indicated by dotted line 7502. As seen, the bypass data registers (BPR) of cores 1 and 3 are selected to be in series with the selected data register of core 2 during the serial TDI to TDO testing, to provide an abbreviate shifting path through cores 1 and 3.

During simultaneous serial and parallel testing, the TAPs of test interfaces 4906 are placed in the ShiftDR state and the ATC bus signals are manipulated to operate any of the flexible and tightly timed capture, shift, update, and/or transfer operations the test requires. During the test, the BPRs of cores 1 and 3 remain in the shift data mode since the TAP remains in the ShiftDR state. The data registers performing the test, other than the BPR, respond to the ATC bus signals while the TAP is in the ShiftDR state.

Assuming in the example of FIG. 75 that; (1) the bit length through the TDI1-N to TDO1-N parallel path of core 1 is 100 bits, (2) the length of the TDI to TDO serial path through cores 1, 2 and 3 is 1000 bits, (3) the bit length of the TDI1-N and TDO1-N parallel path through core 3 is 500 bits, (4) the test operations of each path are controlled during the TAP ShiftDR state by a common ATC bus 4908, and (5) the testing of each path comprises the capture and shift operations of FIG. 57, the following problem can be seen. When the ATC bus activates the capture signal, all data register in the paths perform a capture operation. Following the capture operation all data registers in the paths resume their shifting operation to unload the captured data and load new test data.

Since the TDI to TDO serial path must be unloaded and loaded following each capture operation, it establishes the length of the shift operation for all paths at 1000 bits. Even though the parallel paths through cores 1 and 3 could complete their unload and load operations in 100 and 500 bit shifts respectively, they must operate in the shift mode for the entire 1000 bit shift to accommodate the unload and load of the TDI to TDO serial path. Thus the shifting time of the lesser length parallel paths are forced to be equal to the shifting time of the longer length serial path.

If the test patterns of each core require the same number of shift unload/load operations, the test time of cores 1 and 3 will be extended to equal the test time of core 2. If cores 1 and 3 have additional tests that must be performed, those additional tests are forced to be delayed until after the testing of core 2.

Figure 76:
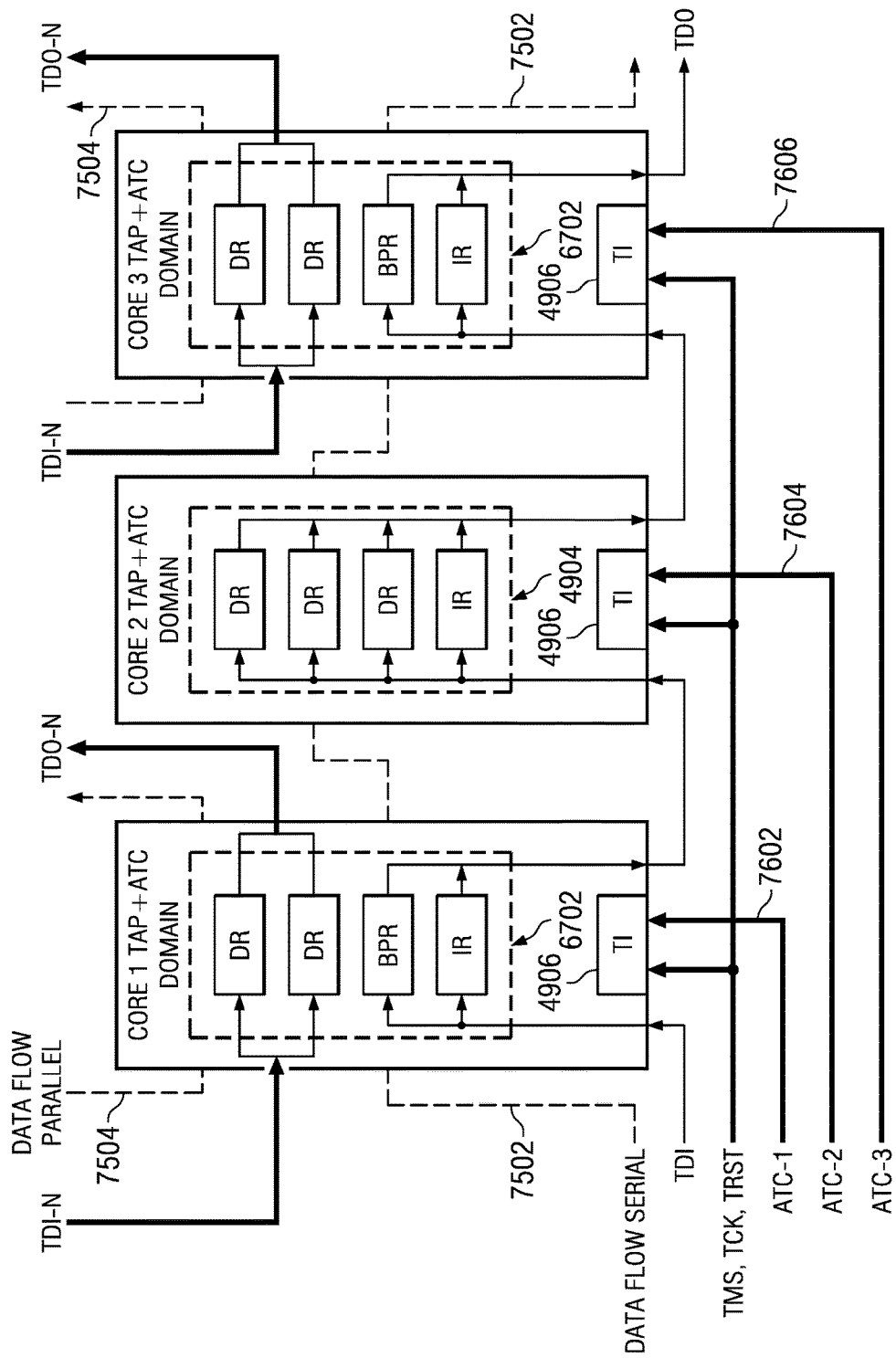
FIG. 76 illustrates a eighth test configuration according to the second embodiment.

FIG. 76 illustrates a way of using the second embodiment to avoid the testing delay described above. FIG. 76 is the same as FIG. 75 with the exception that each core is provided with a separate ATC bus. Core 1 is provided with ATC-1 bus 7602, core 2 is provide with ATC-2 bus 7604, and core 3 is provided with ATC-3 bus 7608. The cores are all loaded with test instructions to select their data registers and to initiate their testing. Following the instruction load, the TAPs of the cores are set to the ShiftDR state to enable control input from ATC-1, ATC-2, and ATC-3 to operate the capture and shift operations of cores 1, 2, and 3 respectively.

During testing of core 1, the capture input of the ATC-1 bus is activated to capture data into the 100 bit parallel TDI1-N to TDO1-N path of core 1, then is deactivated to allow the 100 bit parallel path to perform a 100 bit shift to unload and load data. The BPR of core 1 is designed to not be effected by the operation of the ATC-1 capture input and remains in the shift data mode since the TAP is in the ShiftDR. This ATC-1 bus controlled capture and shift process continues until all the test data patterns have been applied to core 1.

During testing of core 2, the capture input of the ATC-2 bus is activated to capture data into the data register of core 2 of the 1000 bit serial TDI to TDO path through cores 1-3, then is deactivated to allow the 1000 bit serial path to perform a 1000 bit shift to unload and load data. The BPRs in core 1 and 3 of the 1000 bit serial TDI to TDO path remain in shift data mode when the data register of core 2 performs a capture operation since the TAPs of core 1 and 3 are in the ShiftDR state. This ATC-2 bus controlled capture and shift process continues until all the test data patterns have been applied to core 2.

During testing of core 3, the capture input of the ATC-3 bus is activated to capture data into the 500 bit parallel TDI1-N to TDO1-N path of core 3 then is deactivated to allow the 500 bit parallel path to perform a 500 bit shift to unload and load data. The BPR of core 3 is designed to not be effected by the operation of the ATC-3 capture input and remains in the shift data mode since the TAP is in the ShiftDR state. This ATC-3 bus controlled capture and shift process continues until all the test data patterns have been applied to core 3.

From the above description it is seen that by using separate ATC-1, ATC-2, and ATC-3 buses the testing of cores 1 and 3 can proceed independent of each other and of core 2 and with capture and shift operation cycles optimized for their parallel path lengths of 100 and 500 bits, respectively. Assuming the number test patterns applied to each core is the same, the testing of core 1 occurs in one tenth the test time of core 2, and the testing of core 3 occurs in one half the test time of core 2. If cores 1 and 3 had additional tests to execute, those additional tests could be started and ran while the testing of core 2 continues. Thus the overall test time of the IC containing cores 1-3 could be reduced, along with the associated test costs.

If a second ATC-1 operated test is required for say core 1, the TAPs of cores 1-3 are transitioned out of the ShiftDR state following the completion of the first ATC-1 operated core 1 test to allow the TAPs to be accessed to load the second test instruction into core 1 and to reload the current test instructions back into cores 2 and 3. Since the TAPs transition out of the ShiftDR state during the instruction load operation, the testing of cores 2 and 3 will be suspended. However, after instruction load operation, the TAPs of cores 1-3 can be once again set to the ShiftDR state where the second test of core 1 starts and the existing tests of cores 2 and 3 resume, all under control of their respective ATC-1, ATC-2 and ATC-3 buses.

While the use of separate ATC buses in FIG. 76 has been described as they would be used in the core domain configuration of FIG. 75, separate ATC buses can be used with any core domain configuration, such as core domain configurations of FIGS. 69-74.

The example domain configurations of FIG. 69-75 show arrangements where all domains reside in series between TDI and TDO. The following Figures and description illustrate how TAP+ATC domains may be organized within an IC to allow the domains to be selected individually, in desired groups, or all together between TDI and TDO. The following description is based on a TAP Linking Architecture described in pending US patent publication US 2001/0037479 A1, which is incorporated herein by reference.

While detail information about this architecture is provided in the US patent publication, a sufficient description is provided below to illustrated how the architecture can be adapted to allow use of the TAP+ATC test interface 4906 of the second embodiment.

Figure 77:
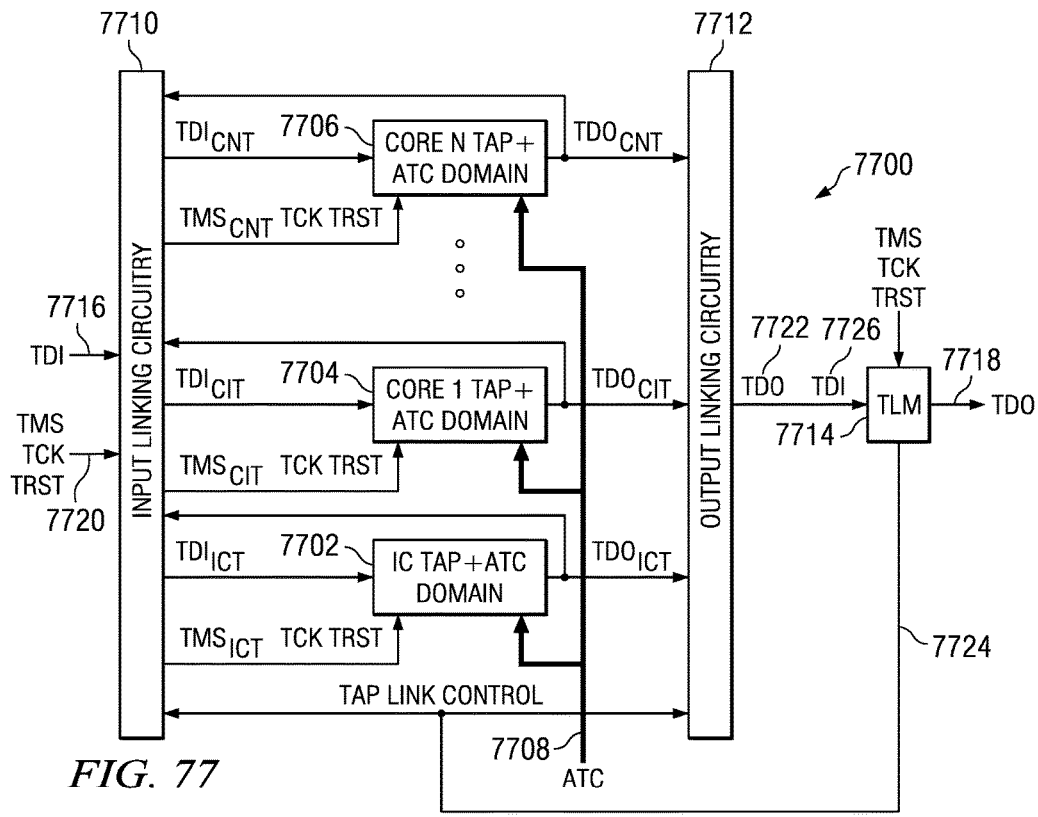
FIG. 77 illustrates a TAP+ATC domain linking architecture of the second embodiment.

FIG. 77 illustrates a TAP linking architecture 7700 of the above referenced patent publication. The architecture is modified from that described in the patent publication to the extent that core domains 7704-7706 and the IC domain 7702 have the TAP+ATC test interface 4906 of the second embodiment, instead of only the TAP test interface 318. Also an ATC bus 7708 is added to provide ATC bus signals to each domain's TAP+ATC test interface. As described in the reference patent publication, the architecture includes input linking circuitry 7710, output linking circuitry 7712, and a Tap Linking Module (TLM) circuit 7714.

These architectural circuit elements operate together to allow any one or more of the domains 7702-7706 to be linked between the ICs TDI input 7716 and TDO output 7718 terminals and be controlled via the IC's TMS, TCK, and TRST input terminals. Following power up of the IC containing the architecture 7700, the IC TAP+ATC domain 7702 will be the only domain between TDI 7716 and TDO 7718. This is required for compliance with IEEE standard 1149.1 and described in the patent publication reference.

Figure 78:
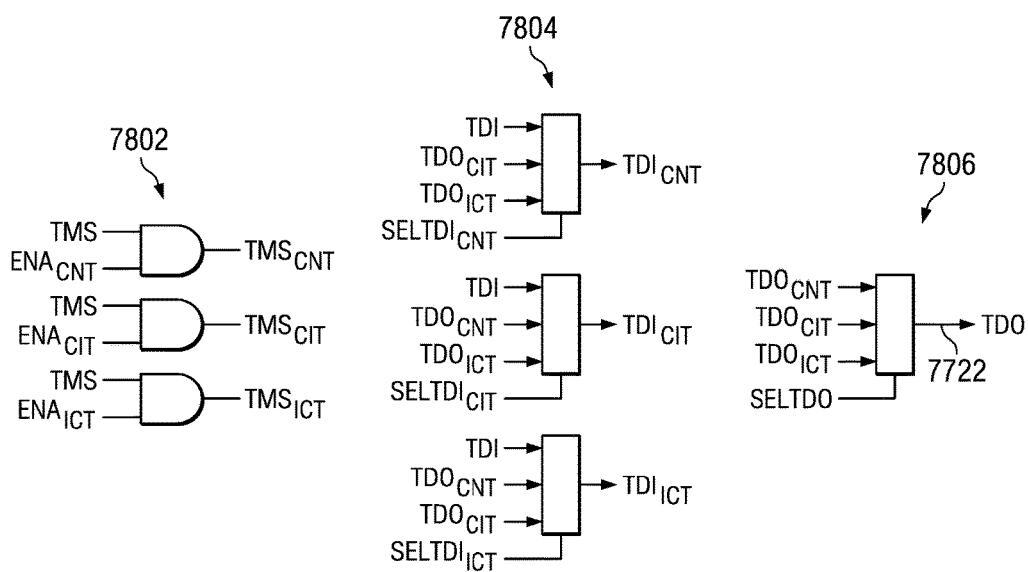
FIG. 78 illustrates input and output linking elements of the FIG. 77 architecture.

FIG. 78 illustrates in more detail the TMS enable circuitry 7802 and the TDI input multiplexing circuitry 7804 that resides within the input linking circuitry 7710. The TDO output multiplexing circuitry 7806 resides in the output linking circuitry 7700. The control for the TMS enable circuitry 7802, TDI input multiplexing circuitry 7804, and TDO output multiplexing circuitry 7806 comes from the TAP Linking Control output bus 7724 of TLM 7714.

Figure 79:
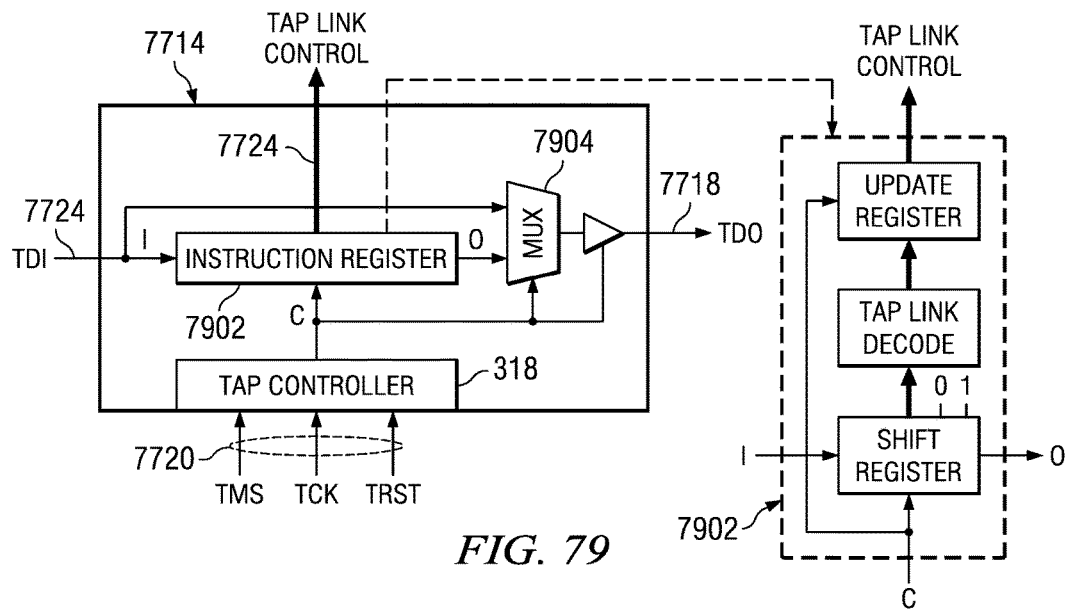
FIG. 79 illustrates the TAP Linking Module (TLM) of FIG. 77 architecture.

FIG. 79 illustrates in more detail the TLM circuit 7714. The TLM has a TAP controller 318, an instruction register 7902, and multiplexer 7904. During TAP instruction scan operations, multiplexer 7904 is set to allow the TLM to shift data through the instruction register 7902 from TDI 7724 to TDO 7718. Instruction scans are used to input instructions to establish link control signals on TAP Linking Control bus 7724. During TAP data scan operations, multiplexer 7902 is set to allow the TLM to pass data from the TDI 7724 input to the TDO 7718 output.

Figure 80:
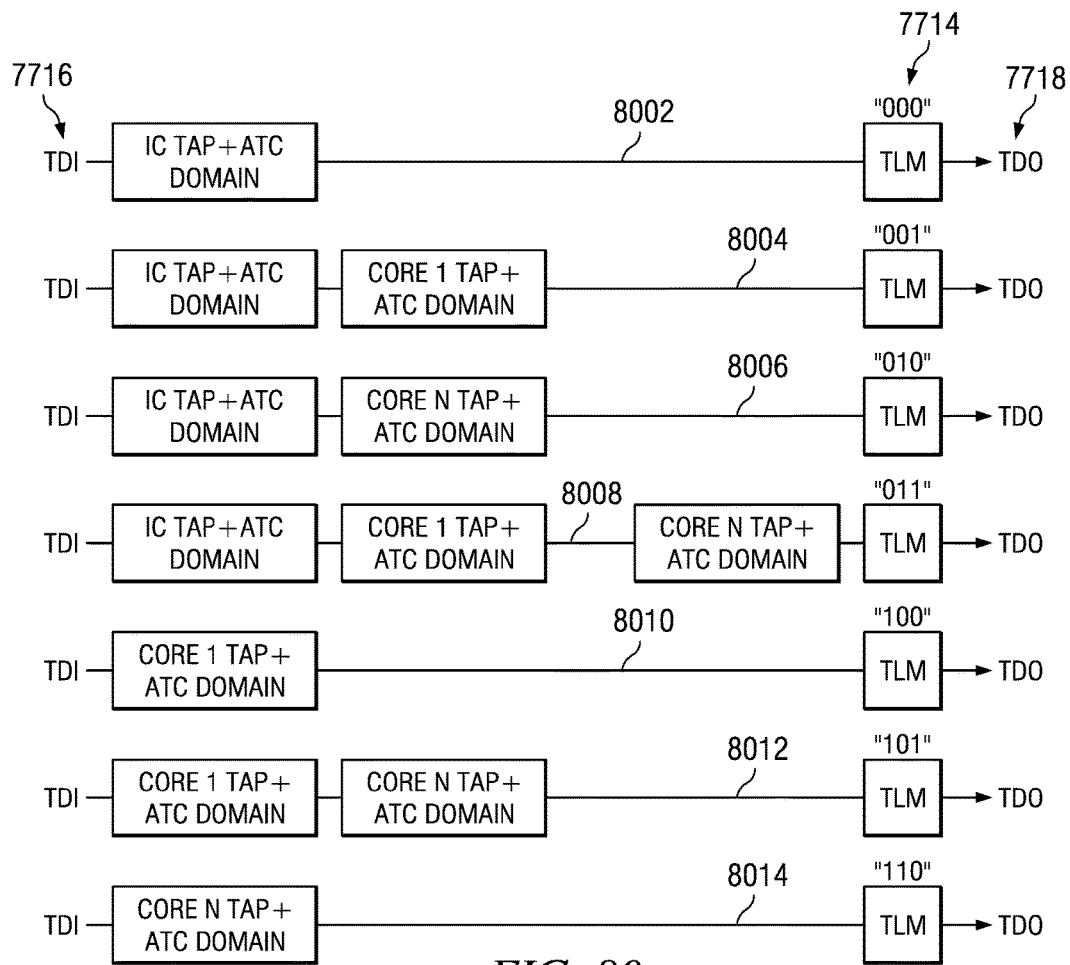
FIG. 80 illustrates different domain linkages during TAP instruction scans.

FIG. 80 illustrates possible TAP+ATC domain configurations 8002-8014 between TDI 7716 and TDO 7718 during instruction scan operations. Note that the instruction register 7902 of the TLM 7714 is in the serial path between TDI 7716 and TDO 7718 during instruction scan operations. Example TLM instruction codes 000-110 are a shown as codes selecting each of the TAP+ATC domain configurations 8002-8014.

Figure 81:
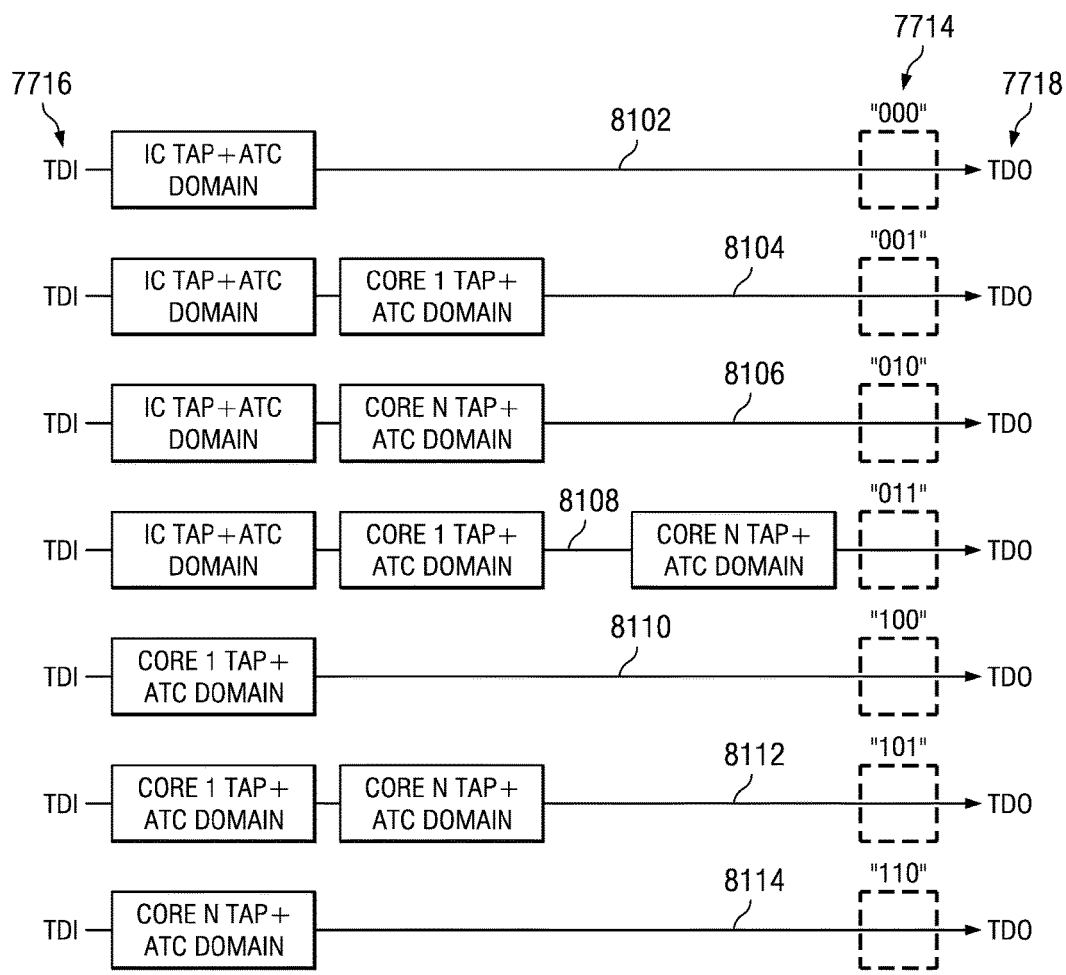
FIG. 81 illustrates different domain linkages during TAP data scans.

FIG. 81 illustrates possible TAP+ATC domain configurations 8102-8114 between TDI 7716 and TDO 7718 during data scan operations. Note that data simply passes through the TLM in the serial path between TDI 7716 and TDO 7718 during data scan operations. Since the TLM instruction register is not accessed during data scan operations, the instruction codes 000-110 for each TAP+ATC domain configuration 8002-8014 remain unchanged during data scan operation.

As can be seen from the above description, the TAP+ATC test interface of the second embodiment can easily be used in the TAP Linking Architecture of the referenced patent publication. Indeed, when any of the TAP+ATC domain configurations of FIGS. 80 and 81 are established, the TAPs of those domains may be placed in the ShiftDR state to allow the ATC bus signals to be manipulated to achieve any of the flexible and tightly timed capture, shift, update, and/or transfer operations previously described.

Figure 82:
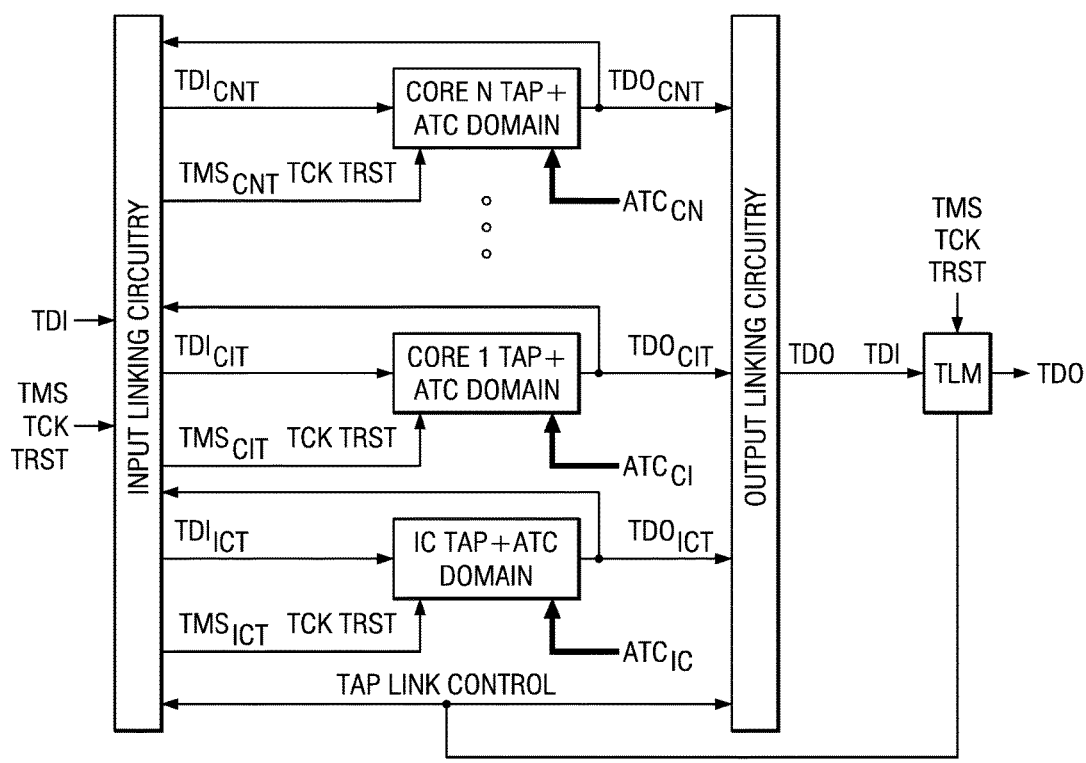
FIG. 82 illustrates each TAP+ATC domain having separate ATC buses.

FIG. 82 is provided to indicate that each TAP+ATC domain may have its own ATC bus ($ATC_{IC}$ for the IC domain, $ATC_{C1}$ for the core 1 domain, and $ATC_{CN}$ for the core N domain) to allow for the test time reduction advantages described previously in regard to FIG. 76.

Figure 83:
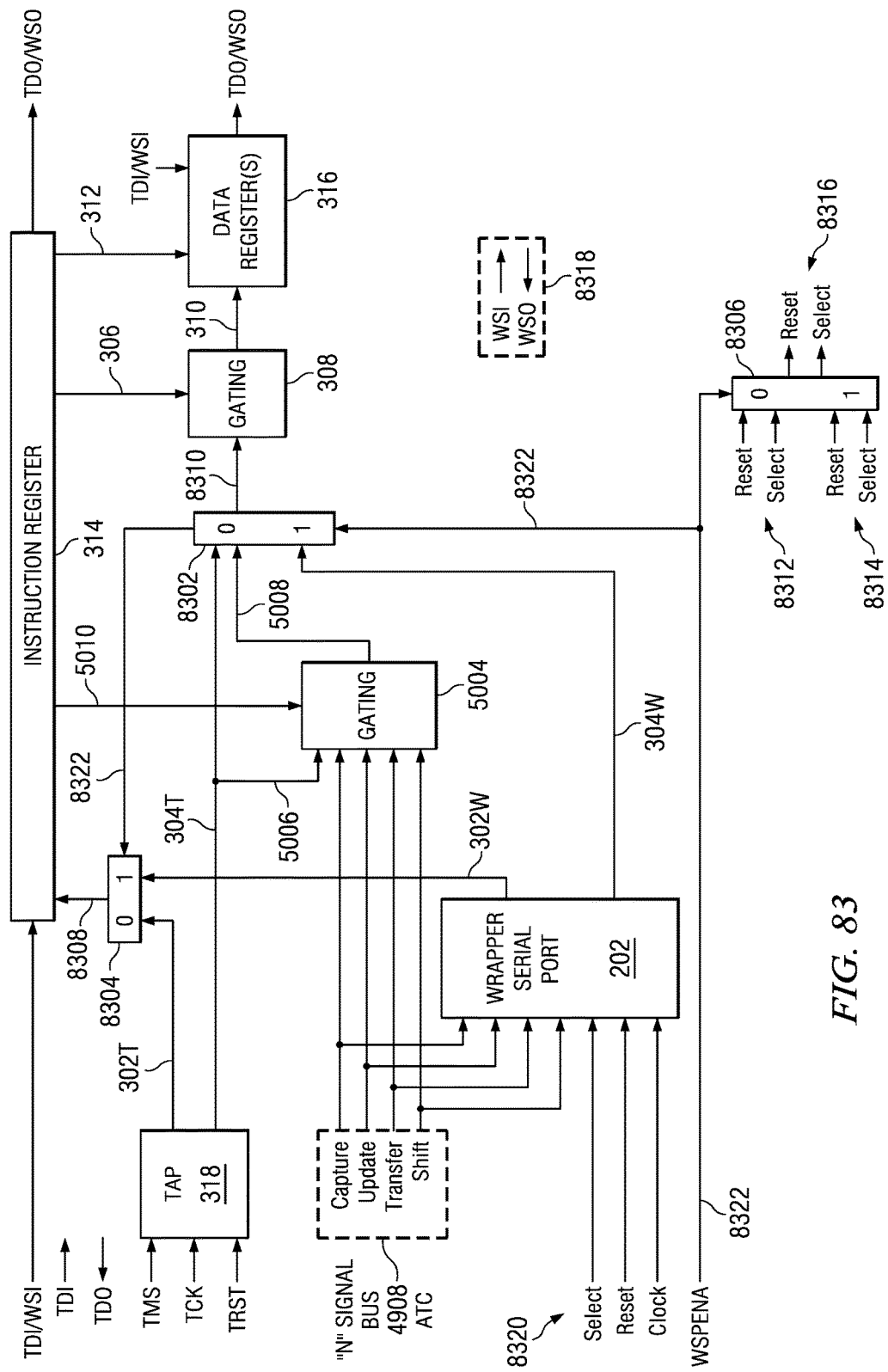
FIG. 83 illustrates the second embodiment with a WSP for IEEE P1500 compliance.

FIG. 83 illustrates the optional use of the IEEE P1500 WSP in the TAP+ATC block diagram architecture of the second embodiment. Including the WSP may be desired to be compliant with the IEEE P1500 standard test interface 1804. As seen, the TAP+ATC with WSP architecture is similar to that of FIG. 51 with the exceptions that it includes the WSP 202, multiplexers 8302-8306, WSI and WSO input and output 8318, and a WSPENA input 8322.

When the architecture of FIG. 83 is to operate using the TAP+ATC test interface as previously described, the WSPENA input will be set low. A low on WSPENA 8322 will cause; (1) multiplexer 8302 to couple input buses 304T (T indicates the TAP's 304 bus) and 5008 to gating circuit 308 via bus 8310, (2) multiplexer 8304 to couple input bus 302T to instruction register 314 via bus 8308, (3) multiplexer 8306 to couple the TAP's Select and Reset outputs 8312 (FIG. 50) to the Select and Reset outputs 8316, allowing the TAP to control reset operations and selection of data or instruction register scans. Thus, when WSPENA is low, the architecture of FIG. 83 is configured to operate as the TAP+ATC based architecture of FIG. 51 and in all the modes described.

When the architecture of FIG. 83 is to operate using the WSP test interface as previously described, the WSPENA input will be set high. A high on WSPENA 8322 will cause; (1) multiplexer 8302 to couple input bus 304W (W indicates the WSP's 304 bus) to gating circuit 308 via bus 8310, (2) multiplexer 8304 to couple input bus 302W to instruction register 314 via bus 8308, (3) multiplexer 8306 to couple the WSP's Select and Reset outputs 8312 (FIG. 10) to the Select and Reset outputs 8316, allowing the WSP to control reset operations and selection of data or instruction register scans.

Figure 20:
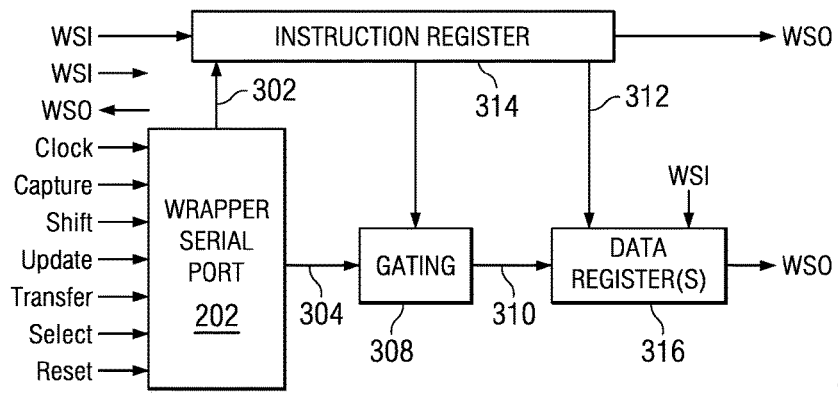
FIG. 20 illustrates circuit blocks of IEEE standard P1500.
Figure 21:
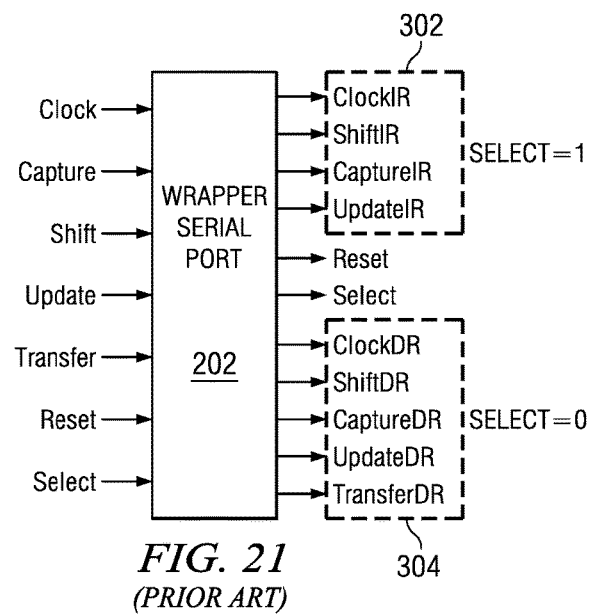
FIG. 21 illustrates an IEEE P1500 WSP in more detail.
Figure 23:
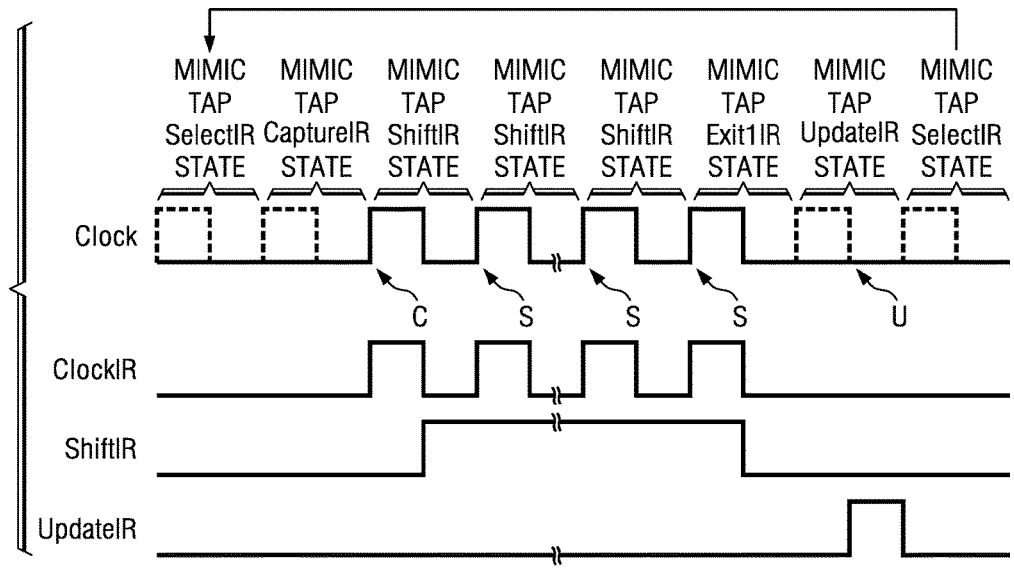
FIG. 23 illustrates a WSP gated instruction register timing diagram.
Figure 24:
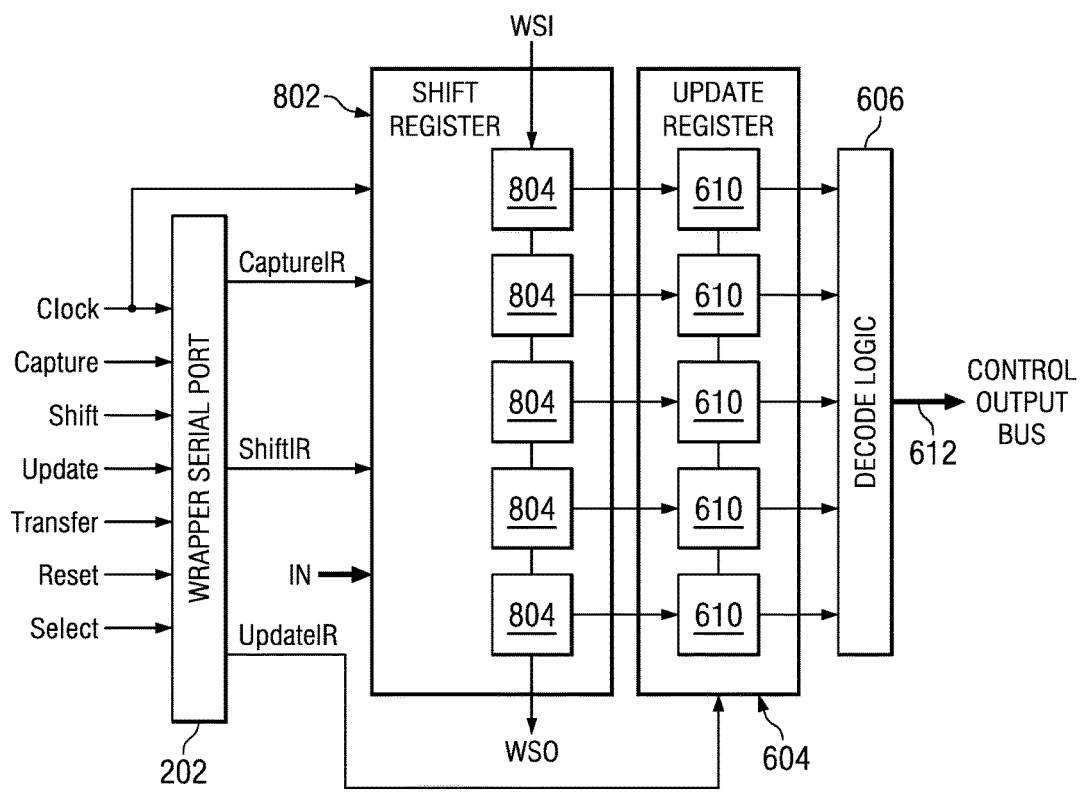
FIGS. 24, 24A, and 24B illustrate a WSP accessing the synchronous instruction register.
Figure 24A:
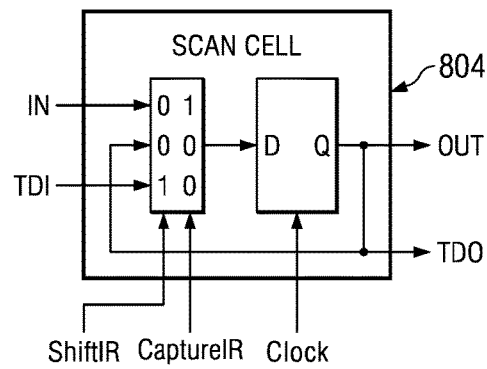
Figure 24B:
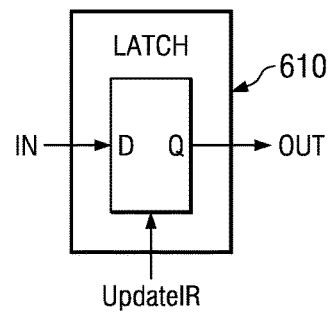
Figure 25:
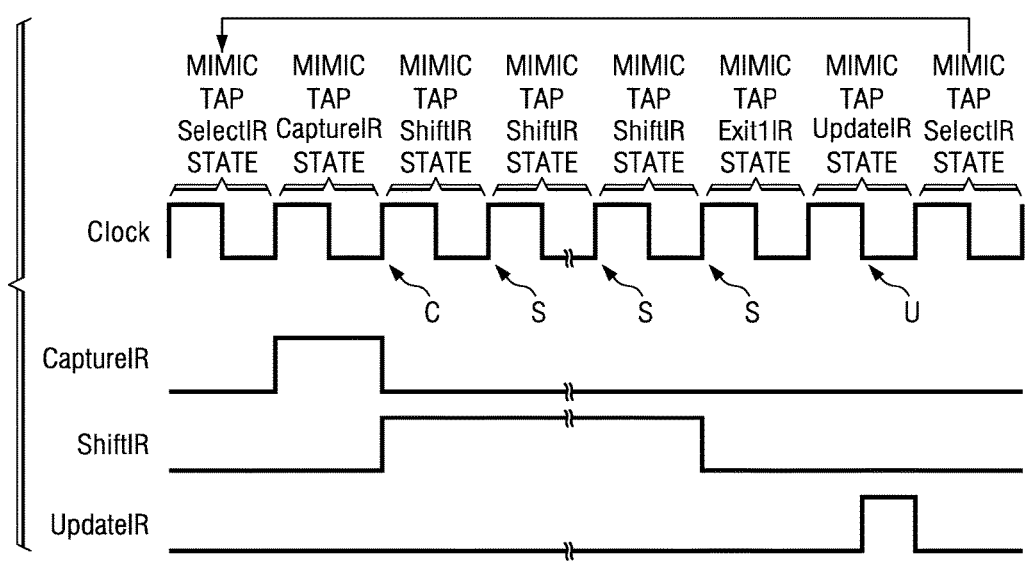
FIG. 25 illustrates a WSP synchronous instruction register timing diagram.
Figure 26:
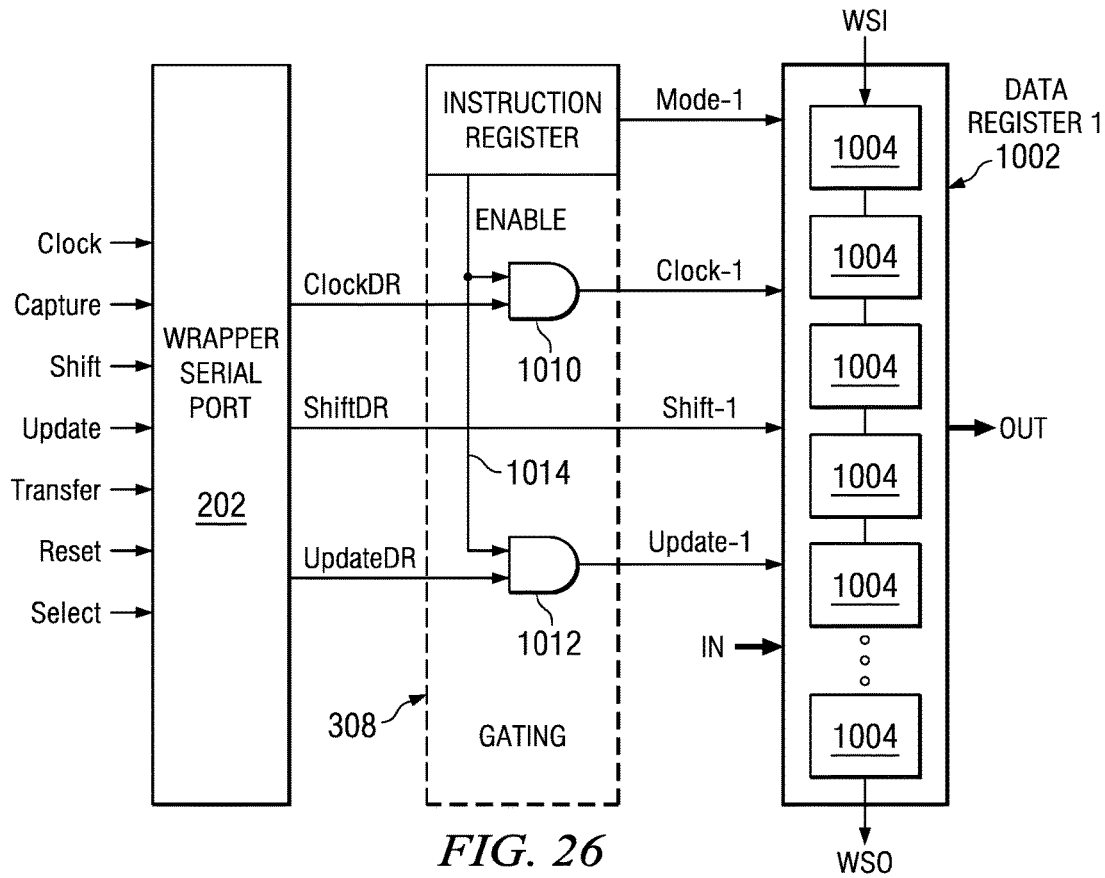
FIGS. 26 and 26A illustrate a WSP accessing data register 1.
Figure 26A:
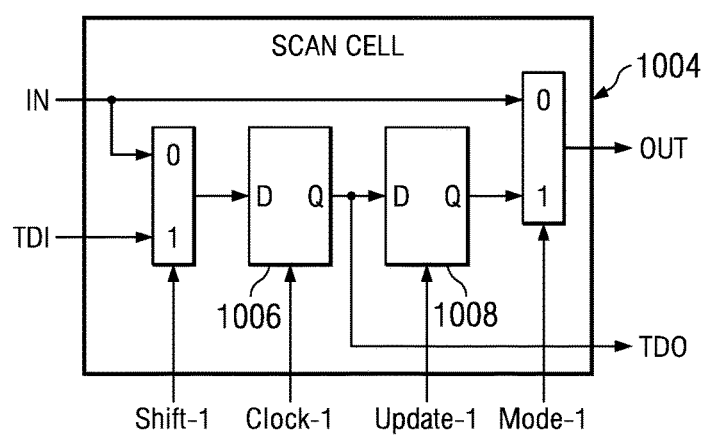
Figure 27:
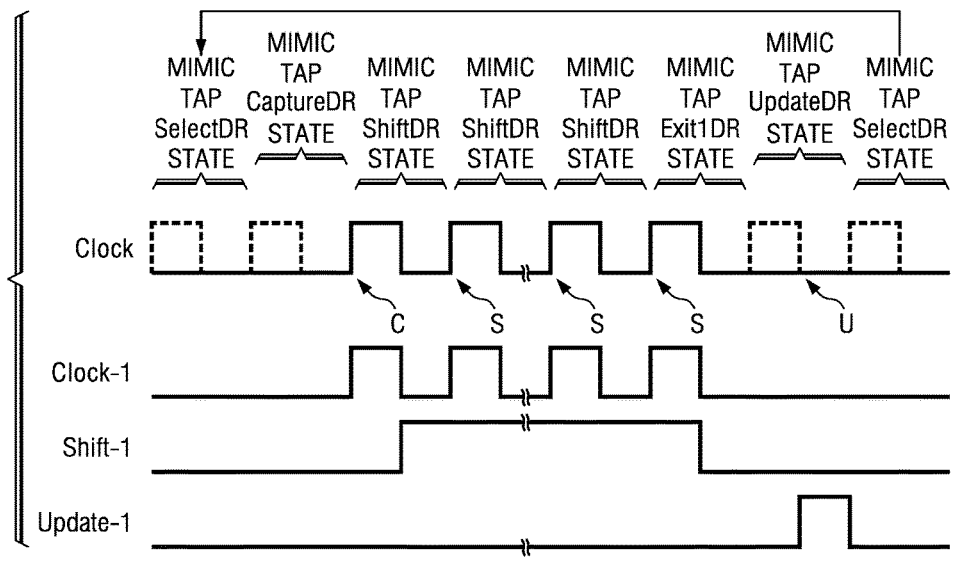
FIG. 27 illustrates a first WSP data register 1 timing diagram.

Also when WSPENA is high, the serial input (TDI/WSI) and output (TDO/WSO) of the instruction 314 and data registers 316 can be operated from the WSI and WSO 8318 of the WSP test interface 1804. The Capture, Update, and Transfer signals of the ATC bus 4908 are input to the WSP along with the additionally required and added WSP signals Shift, Select, Reset, and Clock 8320. Thus, when WSPENA is high, the architecture of FIG. 83 is configured to operate as the WSP based architecture of FIG. 20 and in all the modes described.

While the second embodiment has been shown allowing TAP 318 based IC and core designs to be augmented with ATC bus signals to enable the flexible and tightly timed test operations of the IEEE P1500 WSP test interface 202, the ATC bus signals are not limited to only signal types for duplicating IEEE P1500 operations. Indeed, the ATC bus may include other signal types to allow the second embodiment to be used to perform other operations related to improvements in testing, emulation, debug, and in system programming. In a broad sense, the second embodiment introduces the opportunity of performing any desired operation by manipulation of one of more signals on the ATC bus while the TAP is in its ShiftDR state.

Although the present invention has been described in detail, it should be understood that various changes, substitutions and alterations can be made herein without departing from the spirit and scope of the invention as defined by the appended claims.

What is claimed is:

1. An integrated circuit comprising:
   (a) a TDI lead, a TDO lead, a TMS lead, and a TCK lead;
   (b) a test access port controller having inputs connected to the TMS and TCK leads and having a CaptureDR output, a ShiftDR output, and an UpdateDR output;
   (c) instruction register circuitry having a Mode-2 output and an ATC enable output, the instruction register circuitry including a first gate with a gated CaptureDR input and a Capture-2 output, a second gate having a ShiftDR input coupled to the ShiftDR output and a Shift-2 output, and a third gate with a gated UpdateDR input and an Update-2 output;
   (d) data register circuitry having a TDI input connected to the TDI lead, a TDO output selectively coupled to the TDO lead, a Mode-2 input coupled to the Mode-2 output, a Clock-2 input coupled to the TCK lead, a Shift-2 input coupled to the Shift-2 output, and an Update-2 input coupled to the Update-2 output; and
   (e) ATC gating circuitry having an ATC enable input connected to the ATC enable output, a CaptureDR input coupled to the CaptureDR output, a Capture input, and a gated CaptureDR output coupled to the gated CaptureDR input.

2. The integrated circuit of claim 1 in which the Capture input is part of an auxiliary test control bus of leads that includes a Clock lead, a Shift lead, an Update lead, a Transfer lead, a Reset lead, a Select lead, a WSI lead, and a WSO lead.

3. The integrated circuit of claim 1 including multiplexing circuitry selectively coupling the TDO output of the data register to the TDO lead.

4. The integrated circuit of claim 1 in which the ATC gating circuitry includes:
   a first gate having an ATC enable input coupled to the ATC enable output, the Capture input, and a gated Capture output; and
   a second gate having a CaptureDR input connected to the CaptureDR output, a gated Capture input connected to the gated Capture output, and the gated CaptureDR output.

* * * * *